United States Patent
Servalli et al.

(10) Patent No.: US 12,211,538 B2
(45) Date of Patent: Jan. 28, 2025

(54) TECHNIQUES TO MANUFACTURE FERROELECTRIC MEMORY DEVICES

(71) Applicant: Micron Technology, Inc., Boise, ID (US)

(72) Inventors: Giorgio Servalli, Fara Gera d'Adda (IT); Marcello Mariani, Milan (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 18/203,877

(22) Filed: May 31, 2023

(65) Prior Publication Data

US 2023/0395113 A1    Dec. 7, 2023

Related U.S. Application Data

(60) Provisional application No. 63/365,686, filed on Jun. 1, 2022.

(51) Int. Cl.

| | |
|---|---|
| *G11C 11/22* | (2006.01) |
| *G11C 5/06* | (2006.01) |
| *H01L 29/51* | (2006.01) |
| *H10B 53/10* | (2023.01) |
| *H10B 53/20* | (2023.01) |

(52) U.S. Cl.
CPC ......... *G11C 11/2253* (2013.01); *G11C 5/063* (2013.01); *G11C 11/221* (2013.01); *H01L 29/516* (2013.01); *H10B 53/10* (2023.02); *H10B 53/20* (2023.02)

(58) Field of Classification Search
None
See application file for complete search history.

(56) References Cited

U.S. PATENT DOCUMENTS

| | | | |
|---|---|---|---|
| 11,765,887 B2* | 9/2023 | Lee ..................... | G11C 11/2275 361/277 |
| 2020/0411072 A1* | 12/2020 | Zhang .................... | H10B 51/10 |
| 2022/0036935 A1* | 2/2022 | Wang ..................... | H10B 51/30 |
| 2022/0199833 A1* | 6/2022 | Shivaraman ...... | H01L 29/66545 |
| 2023/0077581 A1* | 3/2023 | Thareja .................. | H01L 28/56 257/298 |
| 2023/0292525 A1* | 9/2023 | Huang ................... | H10B 53/30 |
| 2024/0127877 A1* | 4/2024 | Ramaswamy ......... | G11C 7/062 |

* cited by examiner

Primary Examiner — Tan T. Nguyen
(74) *Attorney, Agent, or Firm* — Holland & Hart LLP

(57) ABSTRACT

Methods, systems, and devices for techniques to manufacture ferroelectric memory devices are described. In some cases, a memory array may be manufactured using a self-aligned manufacturing technique. For example, a continuous layer of dielectric material may be formed over an assembly which includes an array of transistors coupling contacts on the surface of the assembly with a set of digit lines. In some cases, an array of cavities may be etched into the dielectric material, each cavity exposing a set of contacts. A set of bottom electrodes corresponding to the set of contacts may be formed on sidewalls in each cavity, for example by depositing a layer of electrode material and etching the electrode material using a variety of hard masks.

20 Claims, 39 Drawing Sheets

TOP VIEW

SECTION A-A

SECTION B-B 400-d

TOP VIEW

SECTION A-A

SECTION B-B

TOP VIEW

SECTION A-A

SECTION B-B

TOP VIEW

SECTION A-A

SECTION B-B

TOP VIEW

SECTION A-A  SECTION B-B 400-h

TOP VIEW

SECTION A-A

SECTION B-B

TOP VIEW

SECTION A-A

SECTION B-B

TOP VIEW

SECTION A-A

SECTION B-B

TOP VIEW

SECTION A-A          SECTION B-B 500-e

TOP VIEW

SECTION A-A

SECTION B-B

TOP VIEW

SECTION A-A

SECTION B-B

TOP VIEW

SECTION A-A

SECTION B-B

TOP VIEW

SECTION A-A

SECTION B-B 600-b

TOP VIEW

SECTION A-A

SECTION B-B 600-g

TOP VIEW

SECTION A-A SECTION B-B 600-h

TOP VIEW

SECTION A-A

SECTION B-B

TOP VIEW

SECTION A-A

SECTION B-B

TOP VIEW

SECTION A-A  SECTION B-B

TECHNIQUES TO MANUFACTURE FERROELECTRIC MEMORY DEVICES

CROSS REFERENCE

The present Application for Patent claims the benefit of U.S. Provisional Patent Application No. 63/365,686 by Servalli et al., entitled "TECHNIQUES TO MANUFACTURE FERROELECTRIC MEMORY DEVICES," filed Jun. 1, 2022, assigned to the assignee hereof, and expressly incorporated by reference herein.

FIELD OF TECHNOLOGY

The following relates to one or more systems for memory, including techniques to manufacture ferroelectric memory devices.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Some memory devices may include an array of capacitive memory cells arranged over an array of vertical transistors, such as thin film transistors (TFTs), configured to couple each memory cell with an access line, such as a digit line, as part of an access operation for the memory cell. In some cases, each memory cell may include a bottom electrode (e.g., a bottom plate of a capacitor for the memory cell) and a top electrode (e.g., a top plate for the capacitor), with a layer of ferroelectric material between the bottom electrode and top electrode. In some cases, a height of the bottom electrodes (e.g., a height of sidewalls of the bottom electrodes) may be greater (e.g., significantly greater) than a width of the bottom electrodes, such as a width of a lower surface or base of the bottom electrodes. As a result, mechanical stress applied to the bottom electrodes, for example during manufacturing, may misalign or deform the bottom electrodes. Accordingly, techniques to improve bottom electrode stability are desired.

As described herein, a memory array may be manufactured using a self-aligned manufacturing technique. For example, a continuous layer of dielectric material may be formed over an assembly which includes an array of transistors coupling contacts on the surface of the assembly with a set of digit lines. In some cases, an array of cavities may be etched into the dielectric material, each cavity exposing a set of contacts (e.g., four contacts). A set of bottom electrodes corresponding to the set of contacts may be formed on sidewalls in each cavity, for example by depositing a layer of electrode material and etching the electrode material using a variety of hard masks. Because the set of bottom electrodes may be formed on the sidewalls of the cavities, the lattice of dielectric material may provide improved mechanical support to the bottom electrodes during manufacturing processes, which may reduce mechanical stress on the bottom electrodes and thus improve bottom electrode stability.

Figure 1:
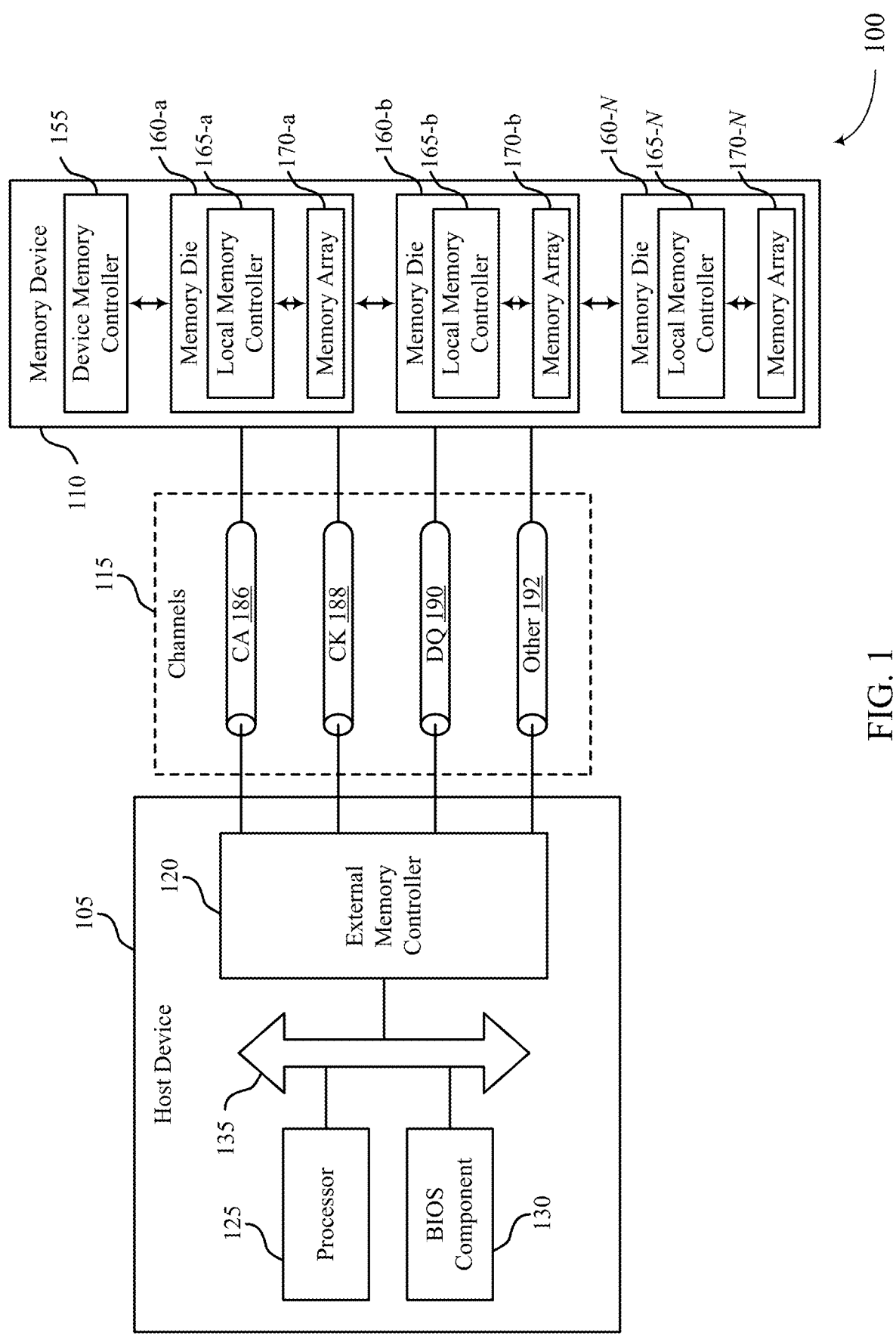
FIG. 1 illustrates an example of a system that supports techniques to manufacture ferroelectric memory devices in accordance with examples as disclosed herein.
Figure 2:
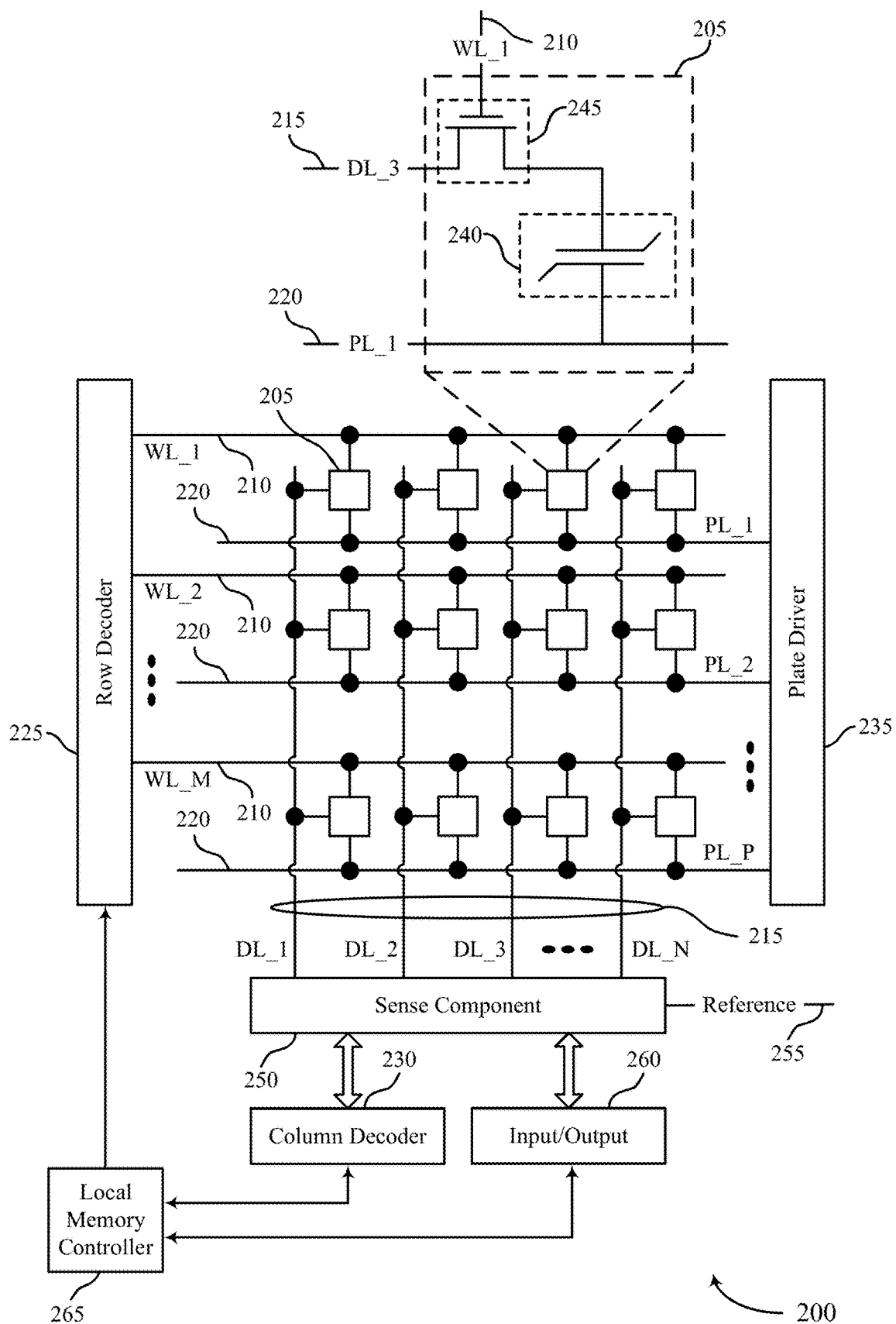
FIG. 2 illustrates an example of a memory die that supports techniques to manufacture ferroelectric memory devices in accordance with examples as disclosed herein.

Features of the disclosure are initially described in the context of systems and dies with reference to FIGS. 1 and 2. Features of the disclosure are described in the context of processing steps of a methods for forming memory arrays with reference to FIGS. 3A through 6L. These and other features of the disclosure are further illustrated by and described with reference to an apparatus diagram and flowcharts that relate to techniques to manufacture ferroelectric memory devices as described with reference to FIGS. 7 through 9.

FIG. 1 illustrates an example of a system 100 that supports techniques to manufacture ferroelectric memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-$a$, memory die 160-$b$, memory die 160-N) may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory array 170 may be manufactured using a self-aligned manufacturing technique. For example, a continuous layer of dielectric material may be formed over an assembly which includes an array of transistors coupling contacts on the surface of the assembly with a set of digit lines. In some cases, an array of cavities may be etched into the dielectric material, each cavity exposing a set of contacts (e.g., four contacts). A set of bottom electrodes corresponding to the set of contacts may be formed on sidewalls in each cavity, for example by depositing a layer of electrode material and etching the electrode material using a variety of hard masks. Because the set of bottom electrodes may be formed on the sidewalls of the cavities, the lattice of dielectric material may provide improved mechanical support to the bottom electrodes, which may reduce mechanical stress on the bottom electrodes and thus improve bottom electrode stability.

FIG. 2 illustrates an example of a memory die 200 that supports techniques to manufacture ferroelectric memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

In some cases, a memory die 200 may be manufactured using a self-aligned manufacturing technique. For example, a continuous layer of dielectric material may be formed over an assembly which includes an array of transistors (e.g., switching components 245) coupling contacts on the surface of the assembly with a set of digit lines 215. In some cases, an array of cavities may be etched into the dielectric material, each cavity exposing a set of contacts (e.g., four contacts). A set of bottom electrodes (e.g., bottom plates for a capacitor 240) corresponding to the set of contacts may be formed on sidewalls in each cavity, for example by depositing a layer of electrode material and etching the electrode material using a variety of hard masks. Because the set of bottom electrodes may be formed on the sidewalls of the cavities, the lattice of dielectric material may provide improved mechanical support to the bottom electrodes, which may reduce mechanical stress on the bottom electrodes and thus improve bottom electrode stability.

Figure 3:
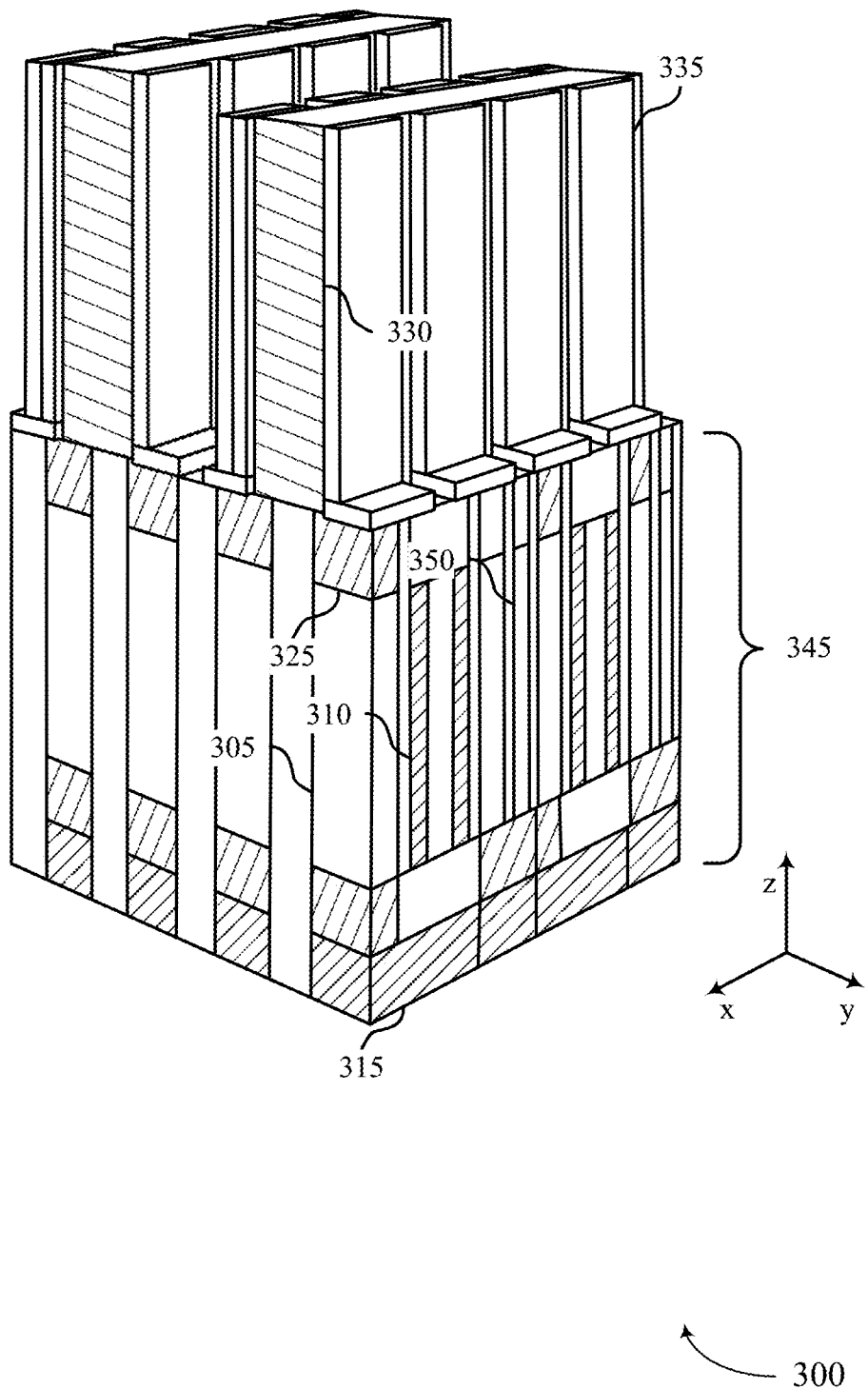
FIG. 3 illustrates an example of a memory array that supports techniques to manufacture ferroelectric memory devices in accordance with examples as disclosed herein.

FIG. 3 illustrates an example of a memory array 300 that supports techniques to manufacture ferroelectric memory devices in accordance with examples as disclosed herein. The memory array 300 may include a set of memory cells (e.g., capacitive memory cells 205 as described with reference to FIG. 2) formed along dielectric walls 330 extending in the x-direction. Each memory cell may include an electrode segment 335 (e.g., a bottom electrode). In some cases, an electrode segment 335 may include a sidewall formed on a sidewall of a dielectric wall 330 and a lower surface formed on an assembly 345. The memory array 300 may include a set of plate lines extending in the x-direction over rows of electrode segments 335. A plate line may be configured as an upper electrode for a row of electrode segments 335, which may form a set of capacitors corresponding to the memory cells. In some cases, the memory array 300 may include a continuous layer of ferroelectric material between the electrode segments 335 and the plate line. Each memory cell may be programmed to store one or more logic states by applying a voltage across a selected electrode segment 335 and a plate line, which may store charge (e.g., a polarization state, a dielectric charge) across the ferroelectric material.

The memory array 300 may further include the assembly 345 to support access operations for memory cells positioned on the assembly 345. The assembly 345 may include a set of digit lines 315 extending in the x-direction and a set of word lines 310 extending in the y-direction and configured to selectively couple a set of memory cells with a set of digit lines 315. The assembly 345 may further include a set of transistors 305 arranged in one or more rows extending in the x-direction and one or more columns extending in the y-direction. A transistor 305 may be operable to selectively couple an electrode segment 335 with a digit line 315. For example, a word line 310 may be configured to bias a gate of the transistor 305 to couple a source terminal and a drain terminal of the transistors 305. In some cases, each transistor 305 may include a contact 325 (e.g., a terminal, such as the source terminal or drain terminal) arranged on an upper surface of the assembly 345. In some cases, the assembly 345 may include a set of shield lines 350 (e.g., barrier lines) extending in the y-direction arranged between alternating columns of transistors 305. A shield line 350 may act as barrier between pairs of columns of transistors 305, which may mitigate undesirable effects on a first word line 310 if an adjacent second word line 310 is biased, such as a voltage of the second word line 310 activating a transistor 305 coupled with the first word line 310.

Although FIG. 3 depicts a height of the electrode segments 335 and dielectric wall 330 being similar to a height of the assembly 345, such a similarity may be included for illustrative clarity. In some cases, the height of the electrode segments 335 and dielectric wall 330 may be greater (e.g., substantially greater) than the height of the assembly 345, which may introduce mechanical stability concerns for the memory array 300 during the manufacturing process. For example, during portions of manufacturing processes, material may be removed, which may make the remaining structures more susceptible bending or other deformations. Additionally or alternatively, the height of the sidewall of an electrode segment 335 may be much greater than a length of a lower surface of the electrode segment 335. Accordingly, the memory array 300 may include various configurations of dielectric material to provide mechanical support to the electrode segments 335. For example, the memory array 300 may include a continuous layer of dielectric material in which a set of cavities are formed in a corresponding set of regions. In some cases, each region may include multiple contacts 325, and a set of electrode segments 335 may be formed in each region on sidewalls of a respective cavity. Accordingly, the electrode segments 335 may receive mechanical support from the layer of dielectric material, which may improve stability of the memory array 300 during manufacturing.

FIGS. 4A through 4J illustrates examples of processing steps of a method that supports techniques to manufacture ferroelectric memory devices in accordance with examples as disclosed herein. illustrate examples of operations that support techniques to manufacture ferroelectric memory devices in accordance with examples as disclosed herein. For example, FIGS. 4A through 4J may illustrate aspects of a sequence of operations for fabricating aspects of a memory array, which may be a portion of a memory device (e.g., a portion of a memory device 110, a portion of a memory die 200, a memory array 300). Each view of the figures may be described with reference to an x-direction, a y-direction, and a z-direction, as illustrated. The provided figures may include section views that illustrate example cross-sections of the memory array. For example, in FIGS. 4A through 4J, a view "SECTION A-A" may be associated with a cross-section in an xz-plane (e.g., in accordance with a cut plane A-A), and a view "SECTION B-B" may be associated with a cross-section in an yz-plane (e.g., in accordance with a cut plane B-B). Additionally, a top view may be associated with a cross-section in an xy-plane cutting the memory array at mid-height (e.g., a plane located at an approximate middle of the memory array in the z-direction). In some cases, materials (or portions of materials) may be omitted from the top view to provide clarity and show structures underneath. Although the memory array illustrates examples of certain relative dimensions and quantities of various features, aspects of the memory array may be implemented with other relative dimensions or quantities of such features in accordance with examples as disclosed herein.

Operations illustrated in and described with reference to FIGS. 4A through 4J may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 4A:
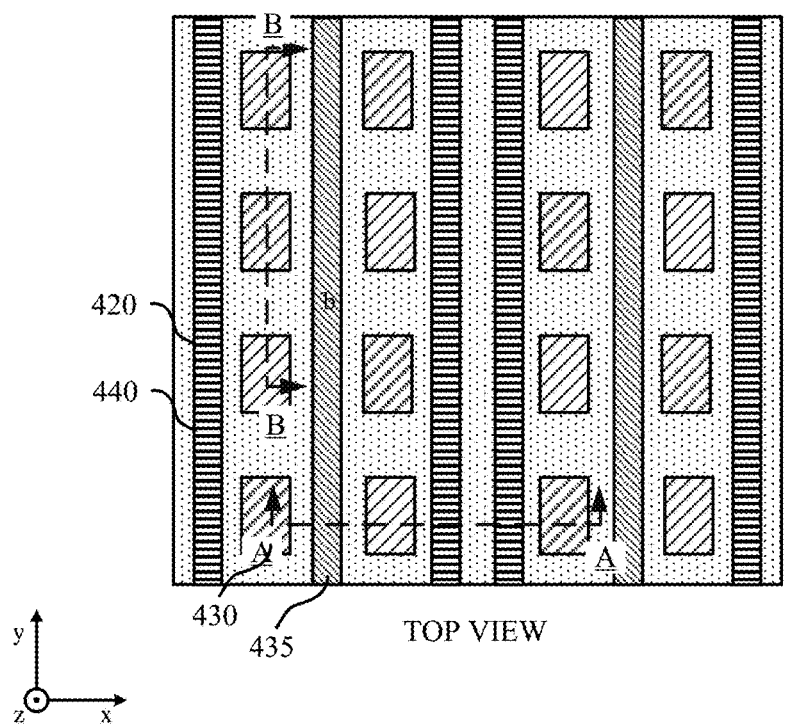
FIGS. 4A through 4J illustrate examples of processing steps of a method that supports techniques to manufacture ferroelectric memory devices in accordance with examples as disclosed herein.
Figure 4A:
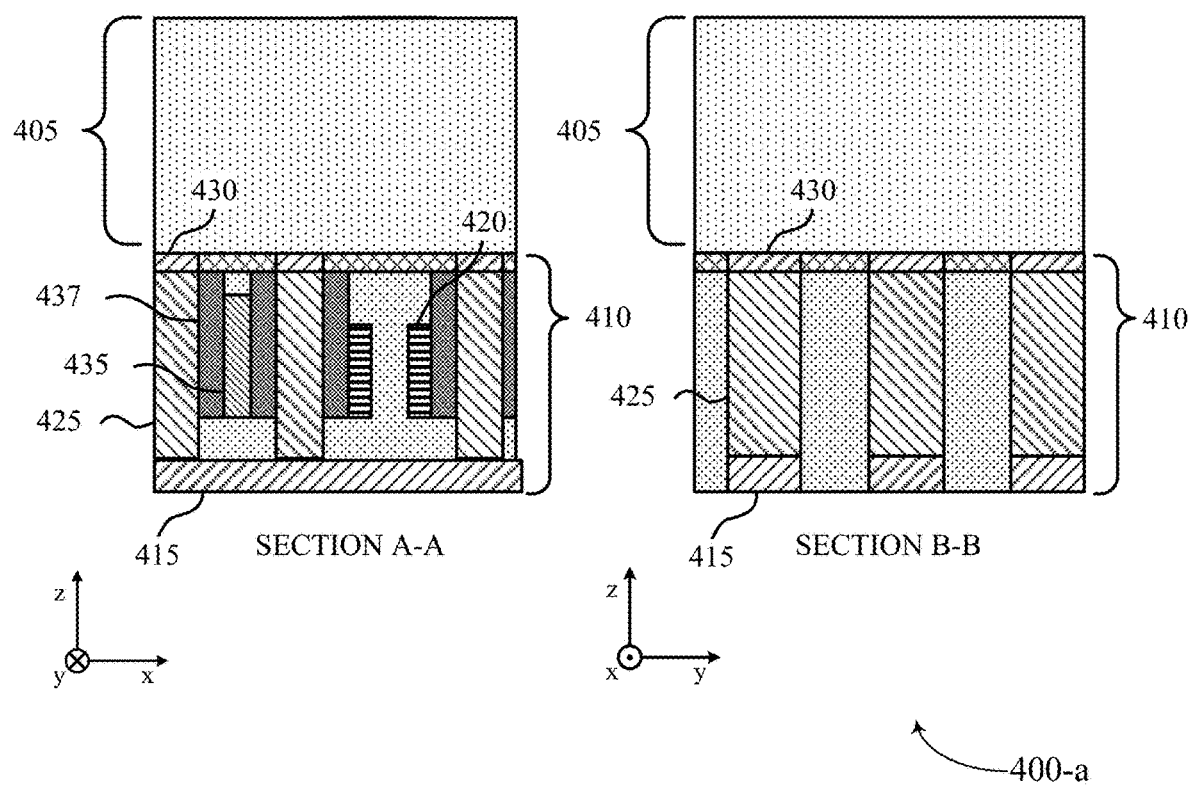

FIG. 4A depicts a memory array 400-a after a first set of manufacturing operations that support techniques to manufacture ferroelectric memory devices in accordance with examples as disclosed herein. The first set of manufacturing operations may include depositing a layer of dielectric material 405 above an assembly 410. The assembly 410 may include circuitry used as part of accessing memory cells of a memory array, such as the memory array 170, the memory die 200, or the memory array 300. For example, the assembly 410 may include one or more digit lines 415 extending in the x-direction and one or more word lines 420 extending in the y-direction, which may each be examples of the corresponding components as described with reference to FIG. 2.

The assembly 410 may include a set of transistors 425 arranged in one or more rows extending in the x-direction and one or more columns extending in the y-direction. A transistor 425 may be operable to selectively couple a memory cell with a digit line 415. For example, a word line 420 may be configured to bias a gate of the transistor 425 to couple a source terminal and a drain terminal of the transistors 425. In some cases, each transistor 425 may include a contact 430 (e.g., a terminal, such as the source terminal or drain terminal) arranged on an upper surface of the assembly 410. In some cases, the assembly 410 may include a set of shield lines 435 (e.g., barrier lines) extending in the y-direction arranged between alternating columns of transistors 425 (e.g., as illustrated in FIG. 4A). A shield line 435 may act as barrier between pairs of columns of transistors

425, which may mitigate undesirable effects (e.g., parasitic capacitance) on a first word line 420 if an adjacent second word line 420 is biased. In some cases, the assembly 410 may include an insulative or liner material 437, which may act as a barrier for a transistor 425.

Figure 4B:
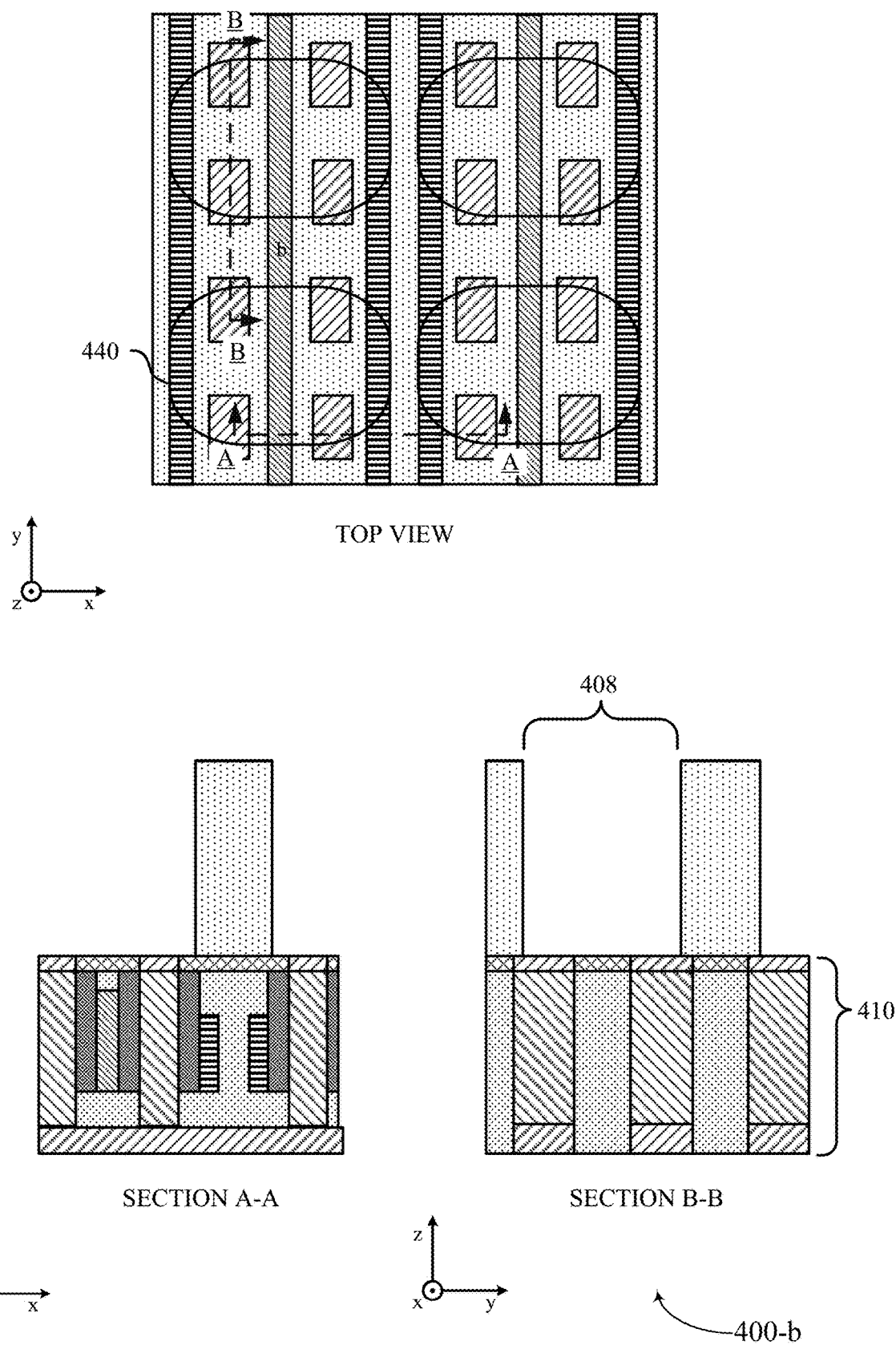

FIG. 4B depicts a memory array 400-*b* after a second set of manufacturing operations that support techniques to manufacture ferroelectric memory devices in accordance with examples as disclosed herein. The second set of manufacturing operations may also include operations that support removing one or more portions of the layer of dielectric material 405 from a region 440 to form a set of cavities 408. For example, the second set of manufacturing operations may include etching (e.g., using a dry etch process) the layer of dielectric material 405 to remove material from the set of regions 440 form the set of cavities 408. In some cases, the set of regions 440 may be arranged in a grid structure, which may include one or more rows extending in the x-direction and one or more columns extending the y-direction. A cavity 408 may be associated with and expose a set of contacts 430. For example, forming a cavity 408 may expose four contacts 430. In some cases, each region 440 may have length in the y-direction which is less than a length of the region 440 in the x-direction.

Figure 4C:
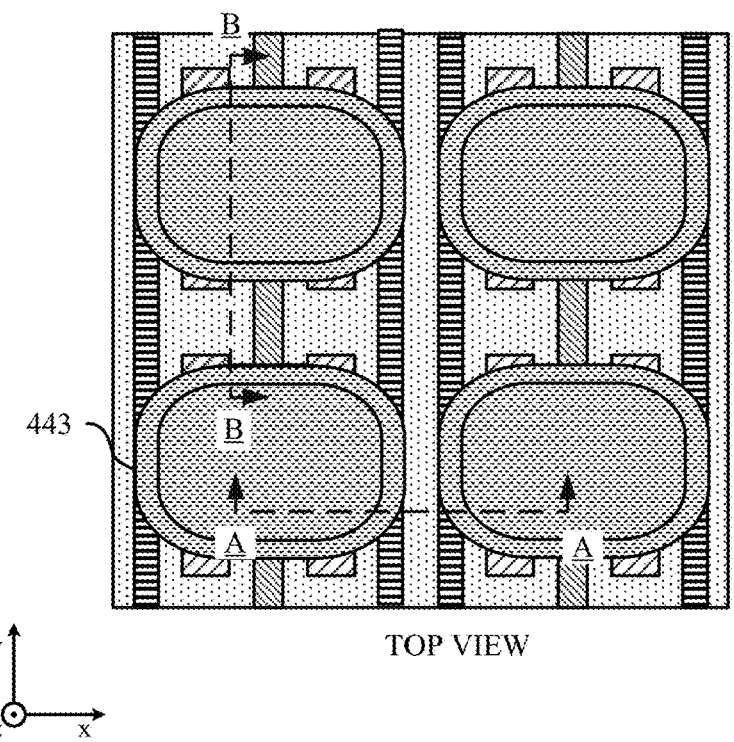
Figure 4C:
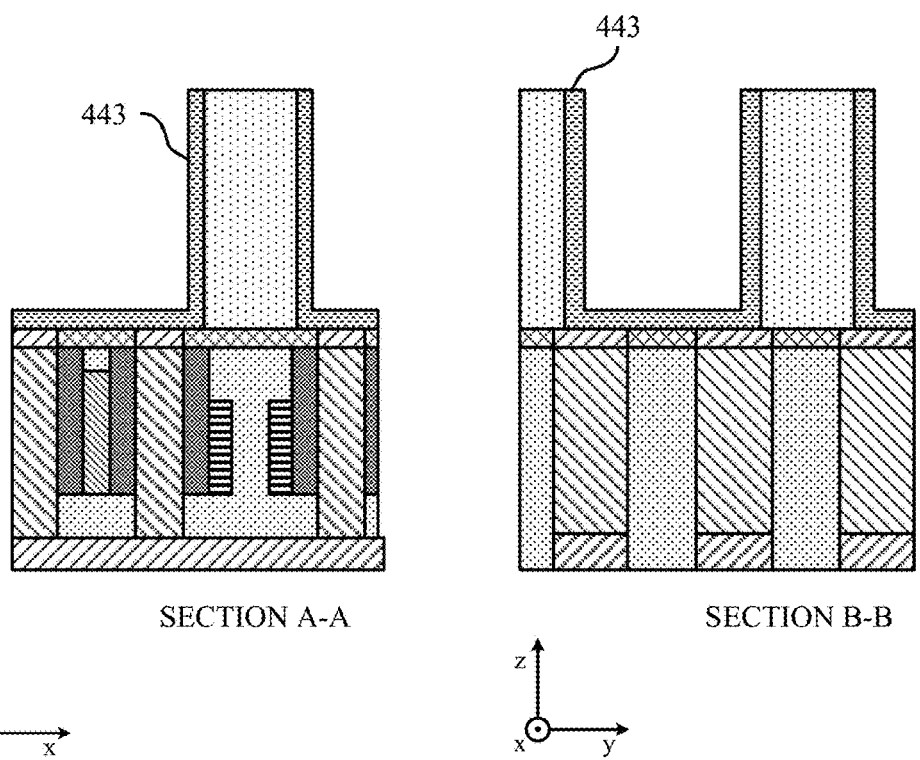

FIG. 4C depicts a memory array 400-*c* after a third set of manufacturing operations that support techniques to manufacture ferroelectric memory devices in accordance with examples as disclosed herein. The third set of manufacturing operations may include depositing a layer of electrode material 443 onto the layer of dielectric material 405. In some cases, the electrode material may be an example of a conductive material.

For example, the third set of manufacturing operations may include depositing the layer of electrode material 443 into each region 440. Accordingly, the layer of electrode material 443 may cover sidewalls of each cavity 408, and may cover the exposed surface of the assembly 410. That is, the layer of electrode material 443 may be deposited to be coupled with the exposed contacts 430 of each region 440. In some cases, the portion of the layer of electrode material 443 in contact with the assembly 410 may be referred to as a lower surface of the layer of electrode material 443.

In some cases, depositing the layer of electrode material 443 may cover exposed portions of the top of the layer of dielectric material 405. For example, the layer of electrode material 443 may be deposited to cover portions of the layer of dielectric material 405 between regions 440. Accordingly, the third set of manufacturing operations may include removing the portion of the layer of electrode material 443 covering the portions of the layer of dielectric material 405 between regions 440. Thus, a layer of electrode material 437 corresponding to a first region 440 may be isolated (e.g., electrically) from a layer of electrode material 443 corresponding to a region 440.

Figure 4D:
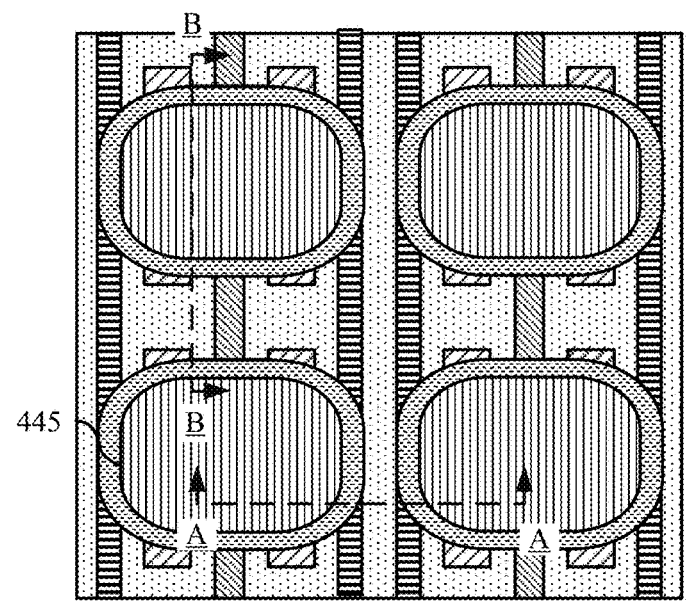
Figure 4D:
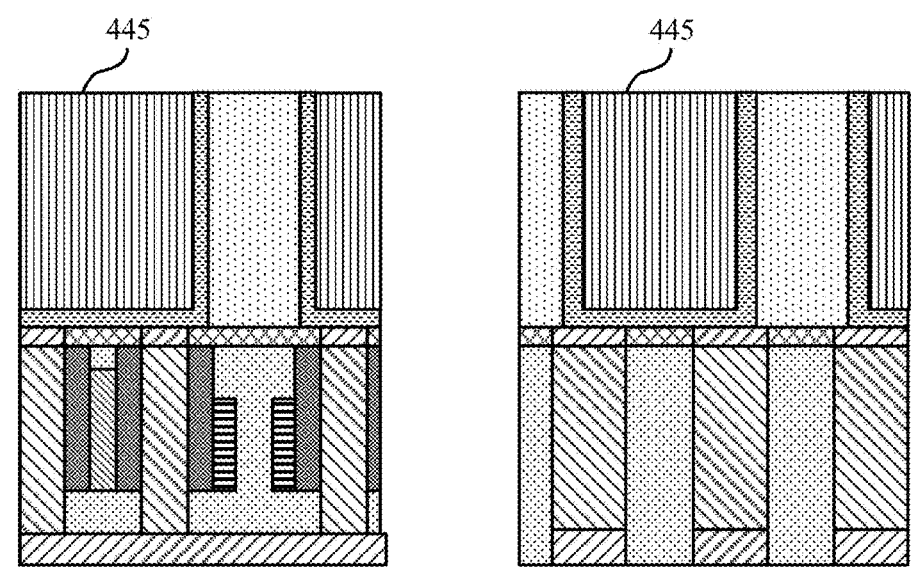
Figure 4D:
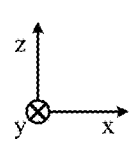
Figure 4D:
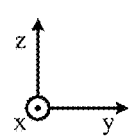

FIG. 4D depicts a memory array 400-*d* after a fourth set of manufacturing operations that support techniques to manufacture ferroelectric memory devices in accordance with examples as disclosed herein. In some cases, the fourth set of manufacturing operations may include depositing a placeholder material 445 (e.g., a sacrificial material) into each region 440. For example, the placeholder material 445 may be deposited to fill each cavity 408. In some cases, after depositing the placeholder material 445, the fourth set of manufacturing operations may include performing a planarization or etch-back procedure to remove a portion of the placeholder material 445. In some cases, the placeholder material 445 may include carbon.

Figure 4E:
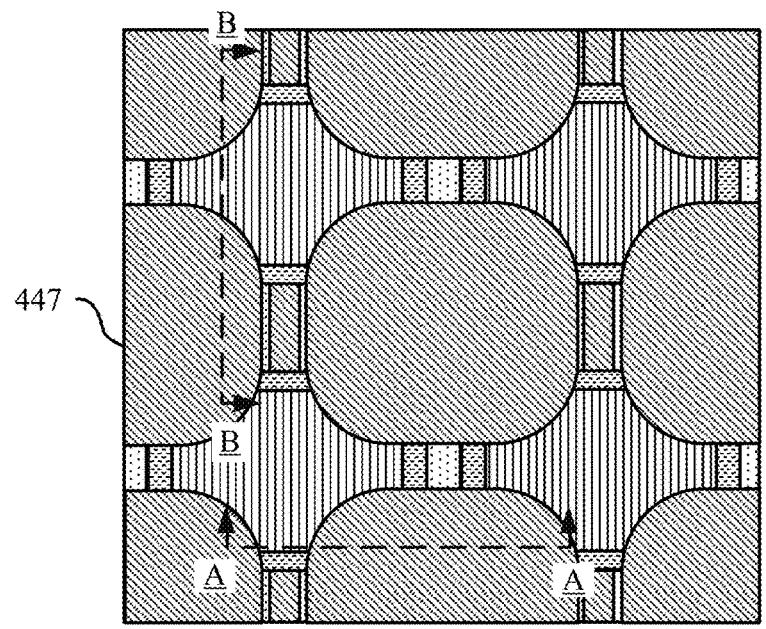
Figure 4E:
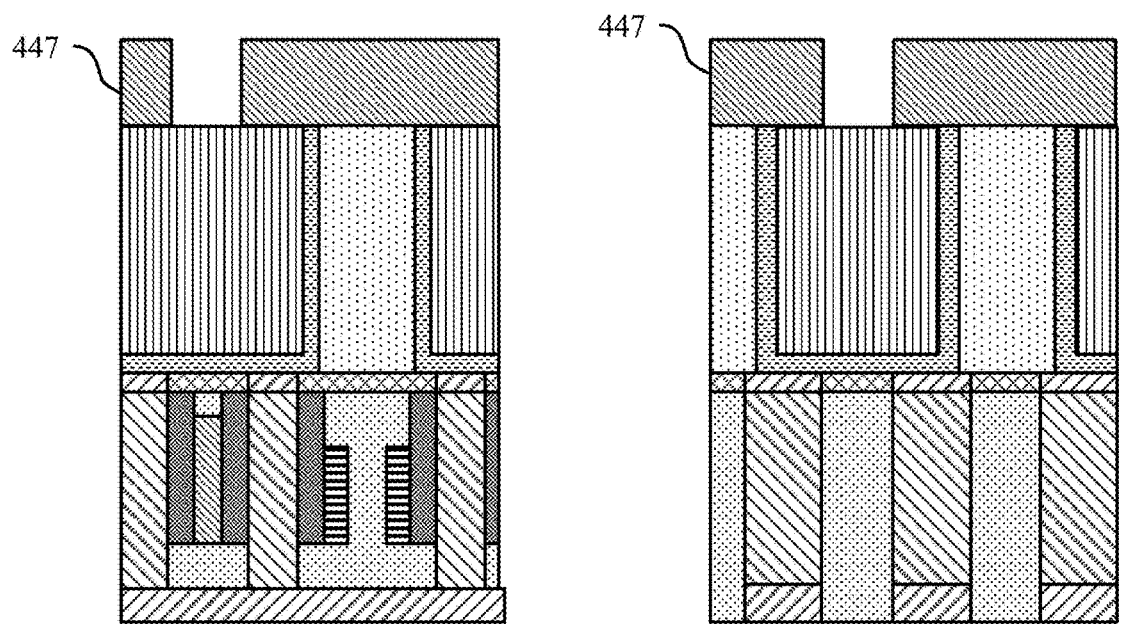

FIG. 4E depicts a memory array 400-*e* after a fifth set of manufacturing operations that support techniques to manufacture ferroelectric memory devices in accordance with examples as disclosed herein. The fifth set of manufacturing operations may include depositing a mask layer 447 (e.g., a hard mask) onto the layer of dielectric material 405. In some cases, the mask layer 447 may be an example of a polysilicon hard mask.

For example, the fifth set of manufacturing operations may include depositing a set of portions of the mask layer 447 on to the layer of dielectric material 405. In some cases, the mask layer 447 may include a set of isolated portions arranged in one or more rows extending in the x-direction and one or more columns extending in the y-direction. Each portion of the mask layer 447 may be offset in the x-direction and y-direction from a respective region 440 (e.g., as depicted in FIG. 4E). Accordingly, each portion may cover a portion of a subset of the regions 440. For example, each mask may cover a corner of four separate regions 440. In some cases, a distance between adjacent masks in the x-direction may be substantially equal to a distance between adjacent masks in the y-direction. In some cases, the mask layer 447 may be formed using a depositing process or formed using a depositing process and an etching process.

Figure 4F:
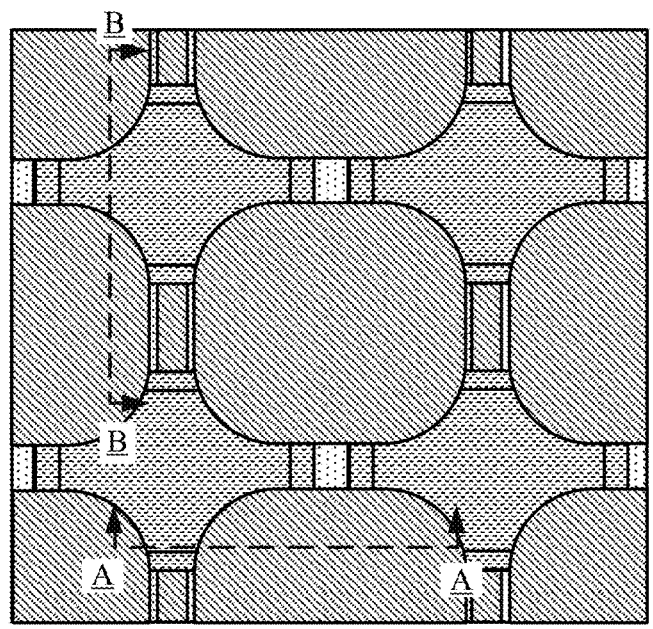
Figure 4F:
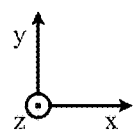
Figure 4F:
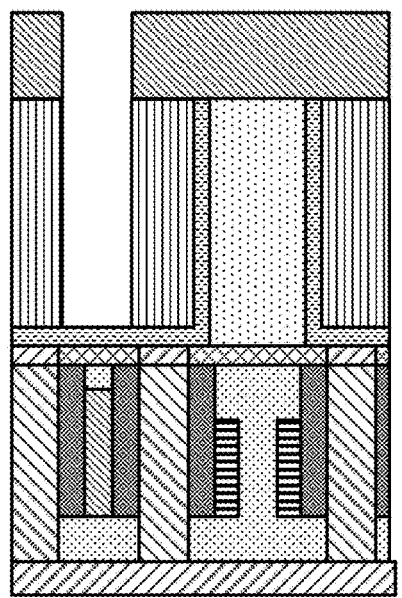
Figure 4F:
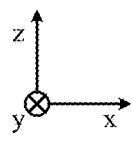
Figure 4F:
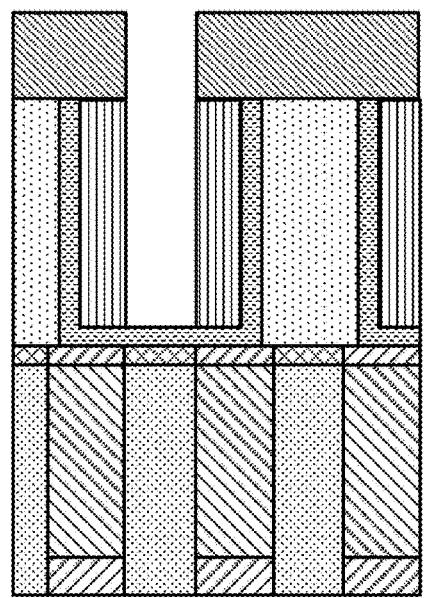
Figure 4F:
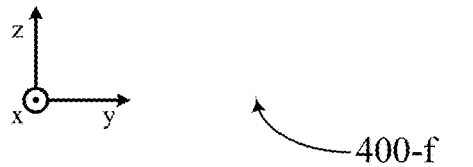

FIG. 4F depicts a memory array 400-*f* after a sixth set of manufacturing operations that support techniques to manufacture ferroelectric memory devices in accordance with examples as disclosed herein. The sixth set of manufacturing operations may further include removing a portion of the placeholder material 445. For example, the portion of the placeholder material 445 may be removed using a selective etching procedure, such as a carbon stripping operation. In some cases, removing the portion of the placeholder material 445 may expose a portion of the lower surface of the layer of electrode material 443. The mask layer 447 may prevent material underneath from being removed.

Figure 4G:
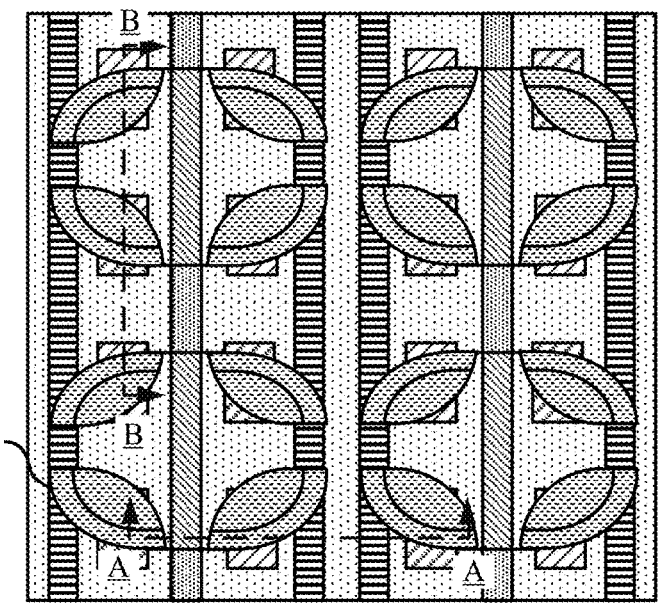
Figure 4G:
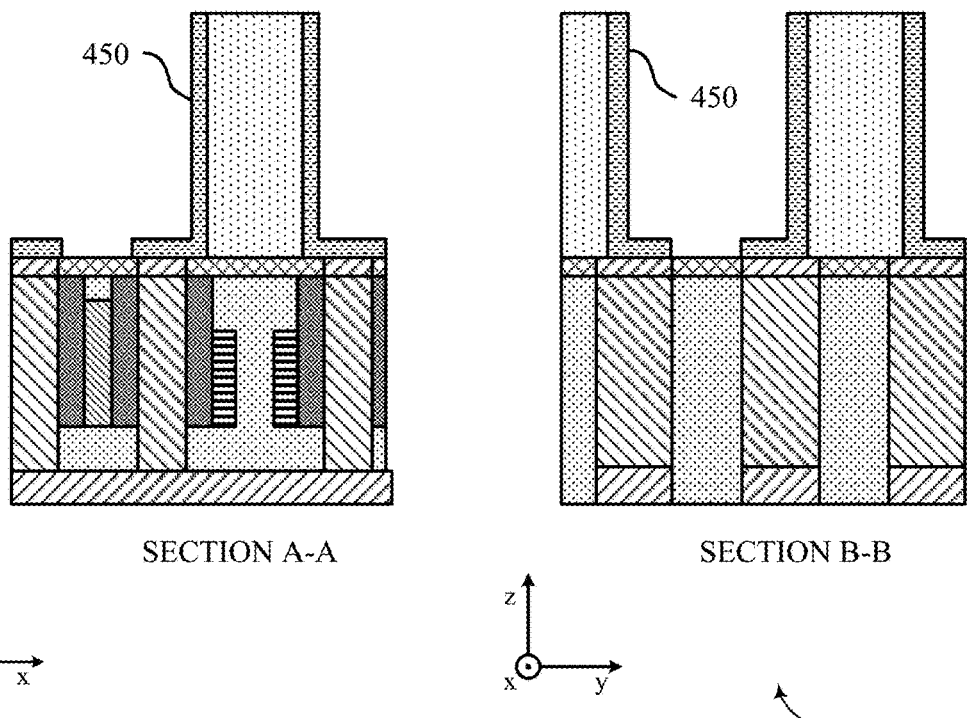

FIG. 4G depicts a memory array 400-*g* after a seventh set of manufacturing operations that support techniques to manufacture ferroelectric memory devices in accordance with examples as disclosed herein. The seventh set of manufacturing operations may include removing at least a portion of the layer of electrode material 443 in each region 440 to form a set of electrode structures 450.

For example, the seventh set of manufacturing operations may include operations that support etching portions of the layer of electrode material 443 exposed by the mask layer 447. In some cases, etching the portions of the layer of electrode material 443 exposed by the mask layer 447 in each region 440 may separate the corresponding layer of electrode material 443 into a set of electrode structures 450. Each electrode structure 450 may correspond to a contact 430. Accordingly, a bottom surface of each electrode structure 450 may be coupled with a respective contact 430. In some examples, to remove the portions of the layer of electrode material 443, the seventh set of manufacturing operations may include a wet etching or atomic layer etching (ALE) procedure.

Figure 4H:
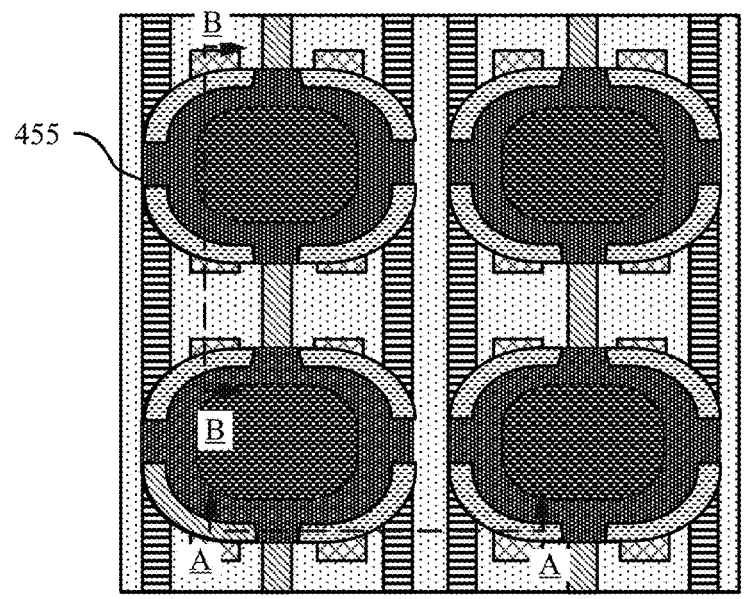
Figure 4H:
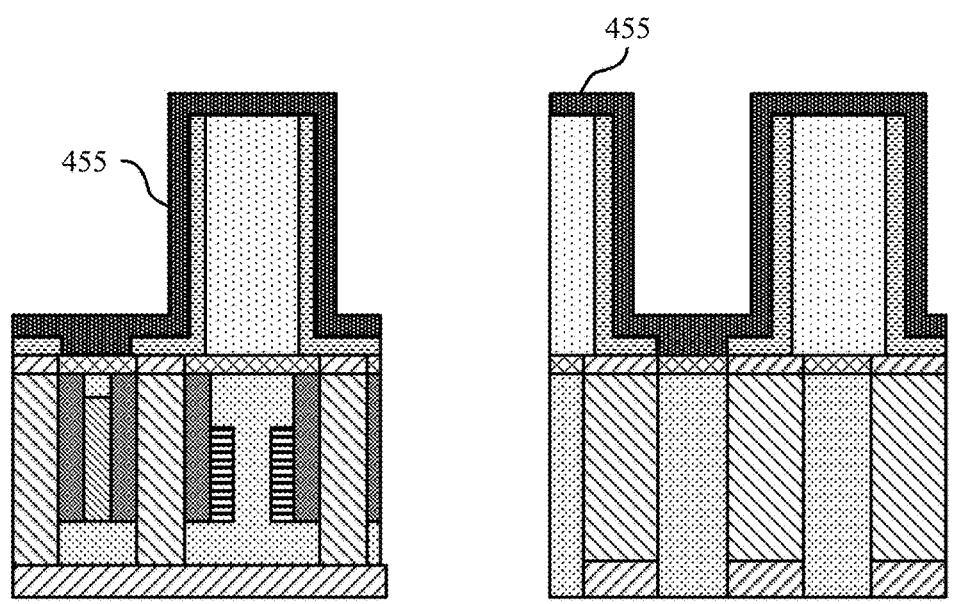

FIG. 4H depicts a memory array 400-*h* after a eighth set of manufacturing operations that support techniques to manufacture ferroelectric memory devices in accordance with examples as disclosed herein. The eighth set of manufacturing operations may include depositing a layer of ferroelectric material 455 onto the memory array 400-*h*.

For example, the eighth set of manufacturing operations may include depositing the layer of ferroelectric material 455 into each region 440 to cover the electrode structures 450, and in some cases exposed portions of the assembly 410. In some cases, to deposit the layer of ferroelectric material 455, the eighth set of manufacturing operations may support a film deposition operation.

Figure 4I:
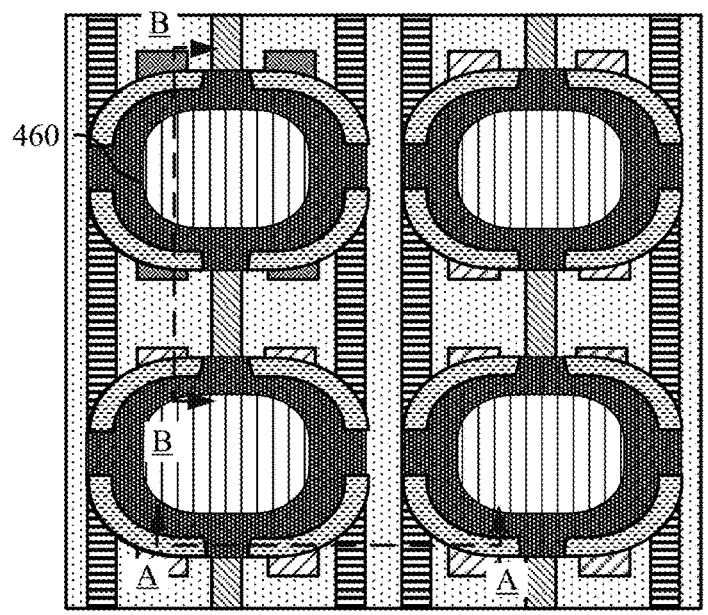
Figure 4I:
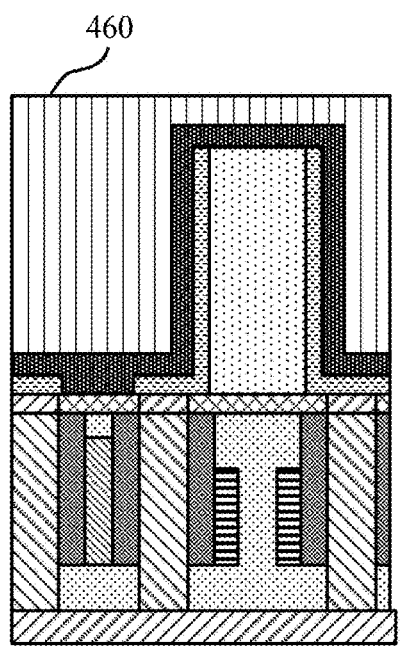
Figure 4I:
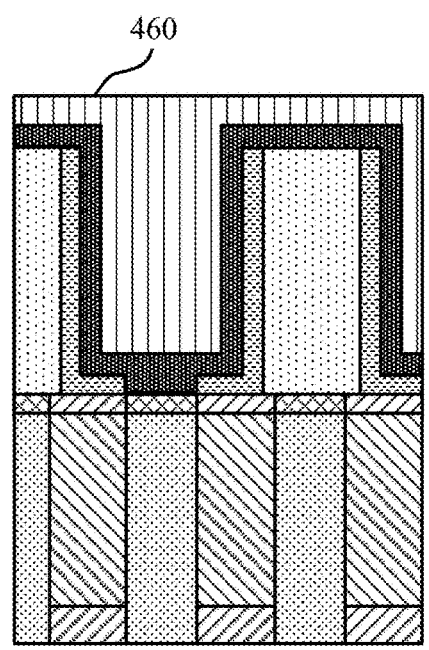

FIG. 4I depicts a memory array 400-*i* after a ninth set of manufacturing operations that support techniques to manufacture ferroelectric memory devices in accordance with examples as disclosed herein. The ninth set of manufacturing operations may include depositing a layer of conductive material 460. For example, after depositing the layer of ferroelectric material 455, the ninth set of manufacturing operations may include depositing the layer of conductive material 460 into each region 440 to cover the layer of ferroelectric material 455 and substantially fill the cavity 408. In some examples, the portion of the conductive material filling a cavity 408 may be referred to as a conductive post. In some cases, to deposit the conductive material, the ninth set of manufacturing operations may support a film deposition operation.

Figure 4J:
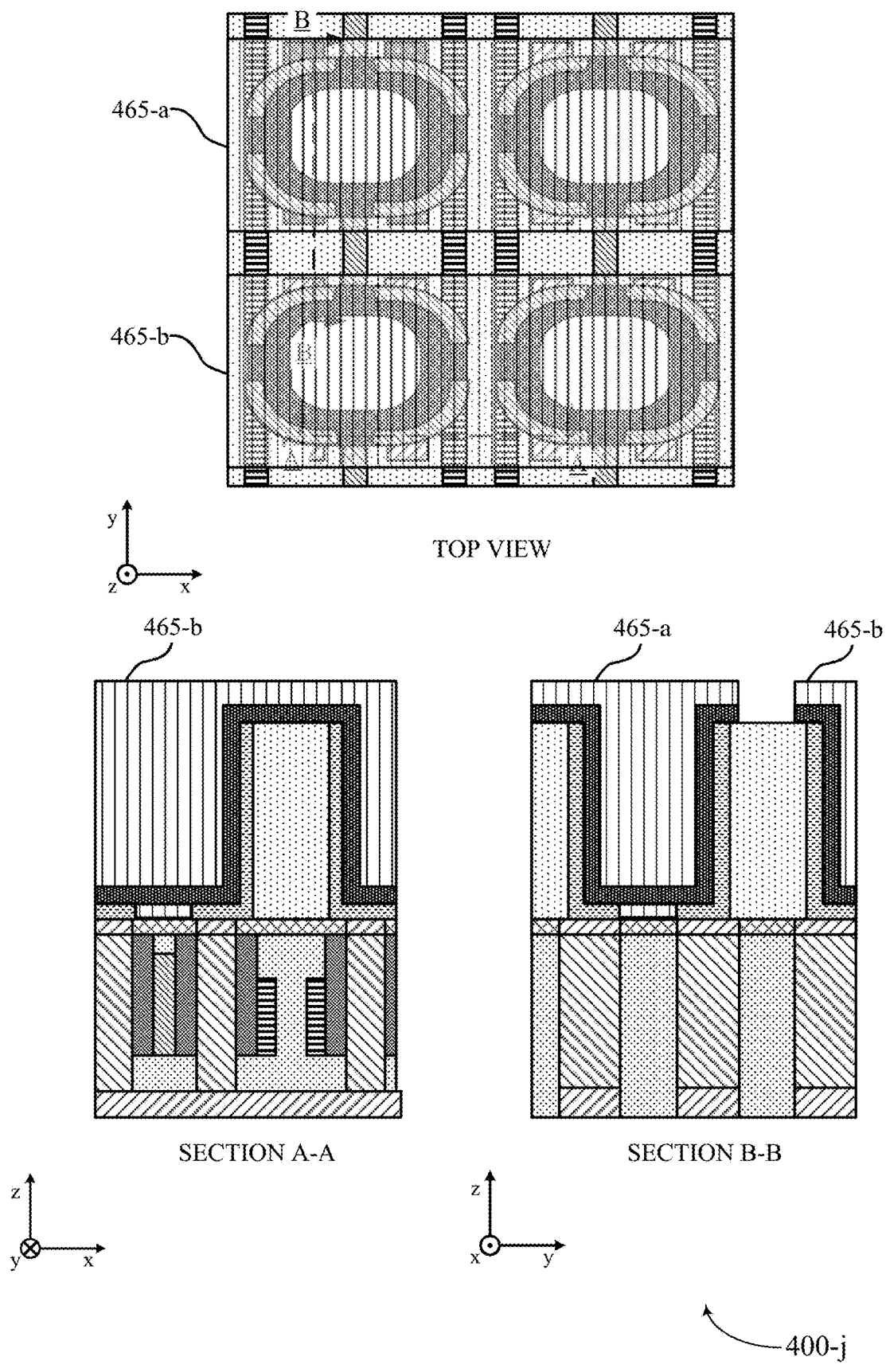

FIG. 4J depicts a memory array 400-*j* after a tenth set of manufacturing operations that support techniques to manufacture ferroelectric memory devices in accordance with examples as disclosed herein. The tenth set of manufacturing operations may include removing a portion of the layer of conductive material 460, such as portion extending in x-direction (e.g., orthogonal to the word lines 420) between adjacent rows of regions 440, to form a set of plate lines 465. The set of plate lines 465 may include a first plate line 465-*a* corresponding to a first row of regions 440 and a second plate line 465-*b* corresponding to a second row of regions 440. Accordingly, forming the set of plate lines 465 may form a set of memory cells of the memory array 400-*j*, each memory cell associated with a ferroelectric capacitor that includes an electrode structure 450 (e.g., a first plate of the capacitor) and a portion of a plate line 465 (e.g., a second plate of the capacitor).

In some examples, a memory array manufactured using the set of manufacturing operations as described with reference to FIGS. 4A through 4J may include a conductive plate coupling an electrode segment 450 with a plate line 465. For example, the set of manufacturing operations may be modified to include forming a conductive plate in an upper portion of a region 440, as described in greater detail with reference to FIG. 6D. In some cases, the conductive plate may act as a leaker to mitigate unwanted charge on a memory cell. For example, a memory cell may develop charge from coupling effects from surrounding memory cells (e.g., due to parasitic capacitance, field effects from applied voltages), which may disturb or destroy a stored logic state. In some cases, the developed charge may dissipate through the conductive plate, which may reduce coupling effects from surrounding memory cells.

In some cases, a memory array manufactured using the set of manufacturing operations as described with reference to FIGS. 4A through 4J may include a set of barrier structures positioned between adjacent electrode segments 450. For example, the set of manufacturing operations may be modified to include forming a set of voids extending past the regions 440 which, when filled with the layer of ferroelectric material 455 and the conductive material 460, may form the set of barrier structures, as described in greater detail with reference to FIG. 6K.

FIGS. 5A through 5K illustrates examples of processing steps of a method that supports techniques to manufacture ferroelectric memory devices in accordance with examples as disclosed herein. illustrate examples of operations that support techniques to manufacture ferroelectric memory devices in accordance with examples as disclosed herein. For example, FIGS. 5A through 5K may illustrate aspects of a sequence of operations for fabricating aspects of a memory array, which may be a portion of a memory device (e.g., a portion of a memory device 110, a portion of a memory die 200, a memory array 300). Each view of the figures may be described with reference to an x-direction, a y-direction, and a z-direction, as illustrated. The provided figures may include section views that illustrate example cross-sections of the memory array. For example, in FIGS. 5A through 5K, a view "SECTION A-A" may be associated with a cross-section in an xz-plane (e.g., in accordance with a cut plane A-A), and a view "SECTION B-B" may be associated with a cross-section in an yz-plane (e.g., in accordance with a cut plane B-B). Additionally, a top view may be associated with a cross-section in an xy-plane cutting the memory array at mid-height (e.g., a plane located at an approximate middle of the memory array in the z-direction). In some cases, materials (or portions of materials) may be omitted from the top view to provide clarity and show structures underneath. Although the memory array illustrates examples of certain relative dimensions and quantities of various features, aspects of the memory array may be implemented with other relative dimensions or quantities of such features in accordance with examples as disclosed herein.

Operations illustrated in and described with reference to FIGS. 5A through 5K may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 5A:
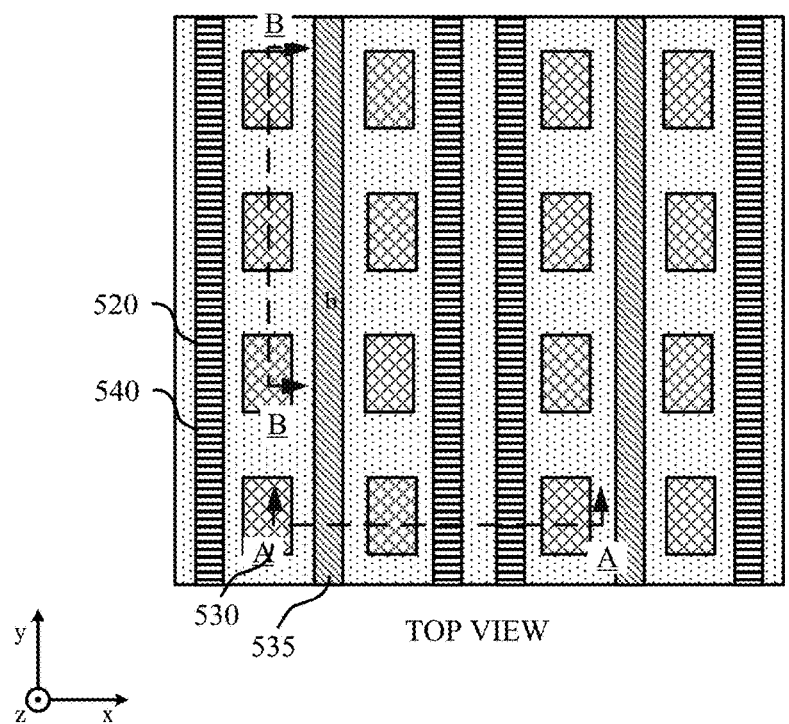
FIGS. 5A through 5K illustrate examples of processing steps of a method that supports techniques to manufacture ferroelectric memory devices in accordance with examples as disclosed herein.
Figure 5A:
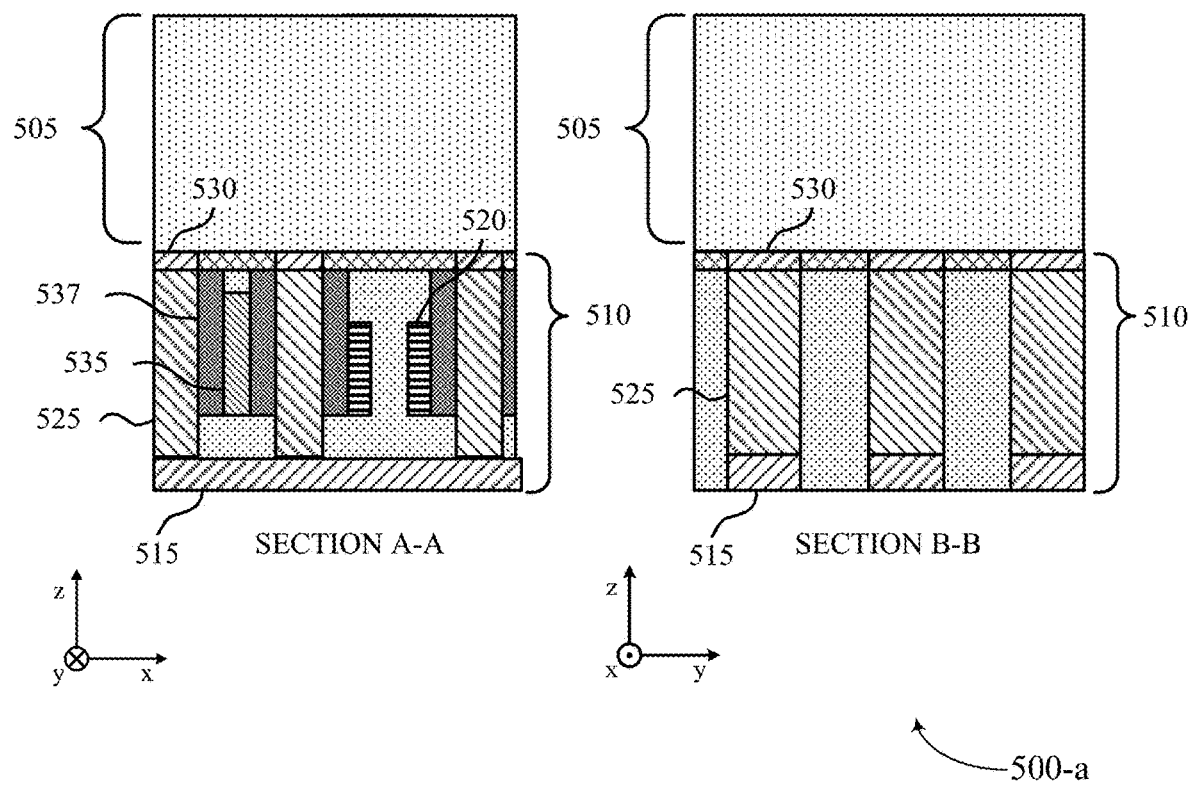

FIG. 5A depicts a memory array 500-*a* after a first set of manufacturing operations that support techniques to manufacture ferroelectric memory devices in accordance with examples as disclosed herein. The first set of manufacturing operations may include depositing a layer of dielectric material 505 above an assembly 510. The assembly 510 may include circuitry used as part of accessing memory cells of a memory array, such as the memory array 170, the memory die 200, or the memory array 300. For example, the assembly 510 may include one or more digit lines 515 extending in the x-direction and one or more word lines 520 extending in the y-direction, which may each be examples of the corresponding components as described with reference to FIG. 2.

The assembly 510 may include a set of transistors 525 arranged in one or more rows extending in the x-direction and one or more columns extending in the y-direction. A transistor 525 may be operable to selectively couple a memory cell with a digit line 515. For example, a word line 520 may be configured to bias a gate of the transistor 525 to couple a source terminal and a drain terminal of the transistors 525. In some cases, each transistor 525 may include a contact 530 (e.g., a terminal, such as the source terminal or drain terminal) arranged on an upper surface of the assembly 510. In some cases, the assembly 510 may include a set of shield lines 535 (e.g., barrier lines) extending in the y-direction arranged between alternating columns of transistors 525 (e.g., as illustrated in FIG. 5A). A shield line 535 may act as barrier between pairs of columns of transistors 525, which may mitigate undesirable effects (e.g., parasitic capacitance) on a first word line 520 if an adjacent second word line 520 is biased. In some cases, the assembly 510 may include an insulative or liner material 537, which may act as a barrier for a transistor 525.

Figure 5B:
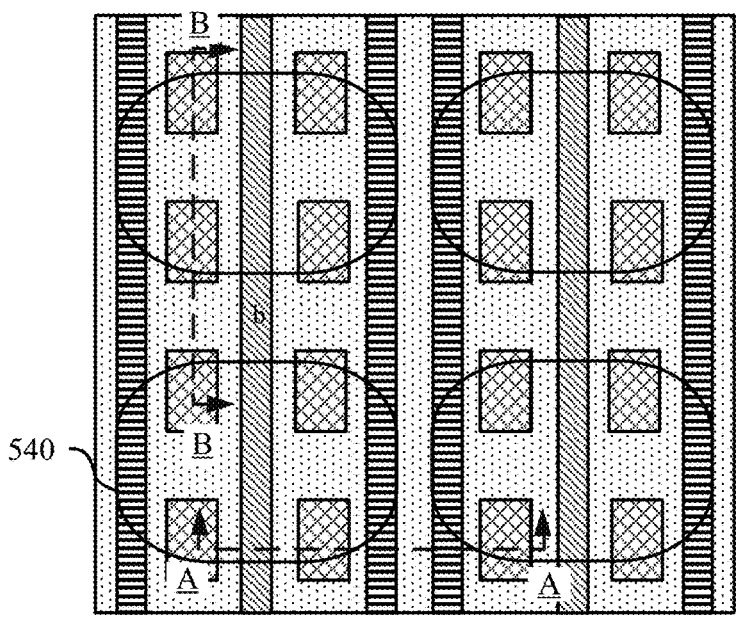
Figure 5B:
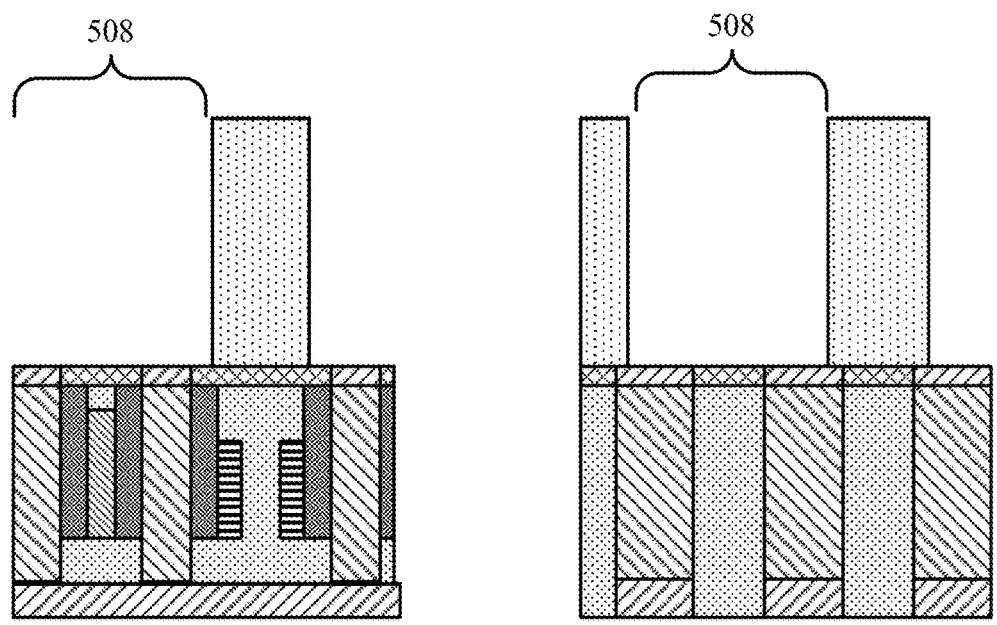

FIG. 5B depicts a memory array 500-b after a second set of manufacturing operations that support techniques to manufacture ferroelectric memory devices in accordance with examples as disclosed herein. The second set of manufacturing operations may also include operations that support removing one or more portions of the layer of dielectric material 505 from a region 540 to form a set of cavities 508. For example, the second set of manufacturing operations may include etching (e.g., dry etching) the layer of dielectric material 505 to remove material from the set of regions 540 form the set of cavities 508. In some cases, the set of regions 540 may be arranged in a grid structure, which may include one or more rows extending in the x-direction and one or more columns extending the y-direction. A cavity 508 may be associated with and expose a set of contacts 530. For example, forming a cavity 508 may expose four contacts 530.

Figure 5C:
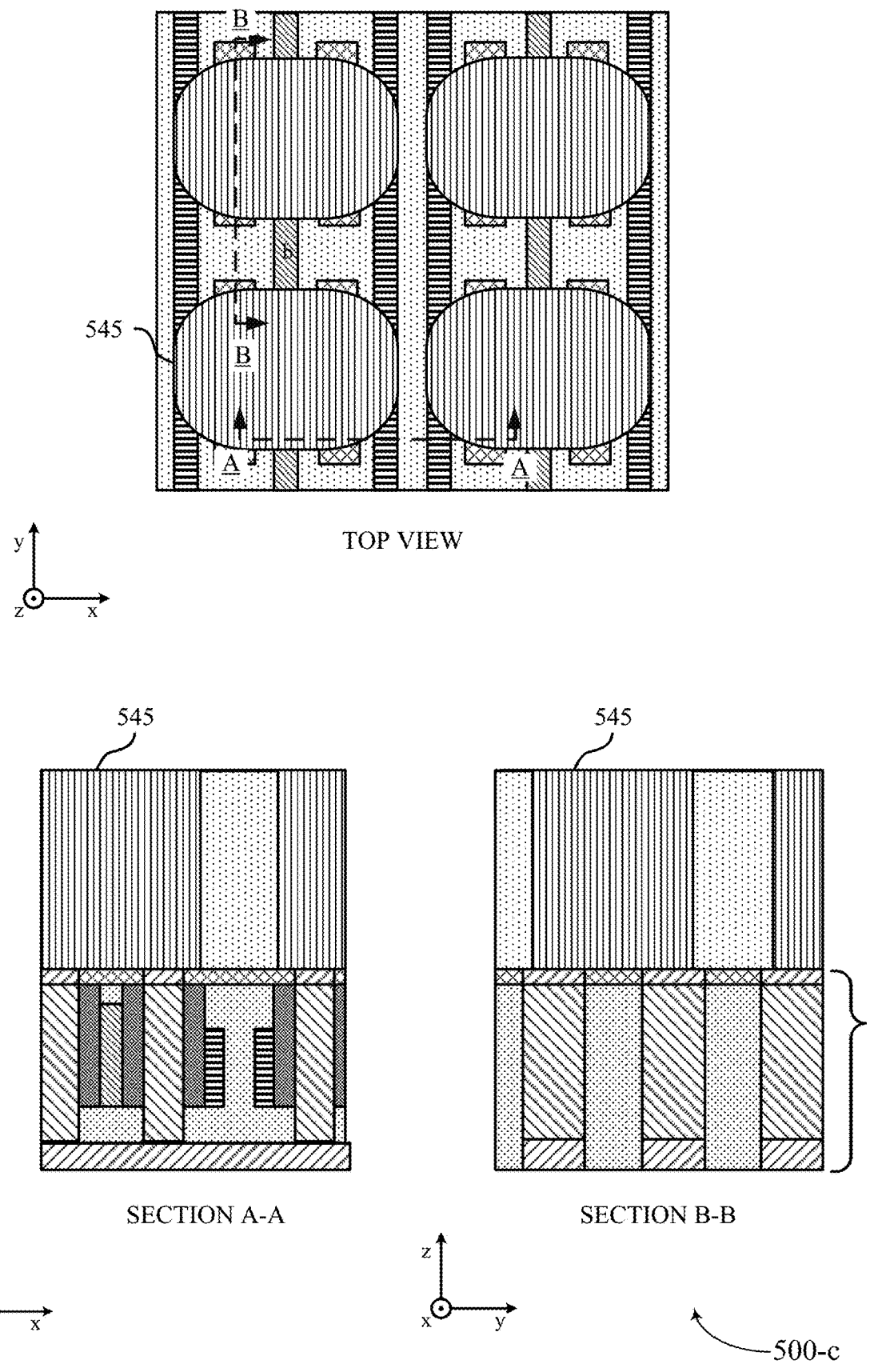

FIG. 5C depicts a memory array 500-c after a third set of manufacturing operations that support techniques to manufacture ferroelectric memory devices in accordance with examples as disclosed herein. In some cases, the third set of manufacturing operations may include depositing a placeholder material 545 into each region 540. For example, the placeholder material 545 may be deposited to fill each cavity 508. In some cases, after depositing the placeholder material 545, the fourth set of manufacturing operations may include performing a planarization or etch-back procedure to remove a portion of the placeholder material 545. In some cases, the placeholder material 545 may include carbon.

Figure 5D:
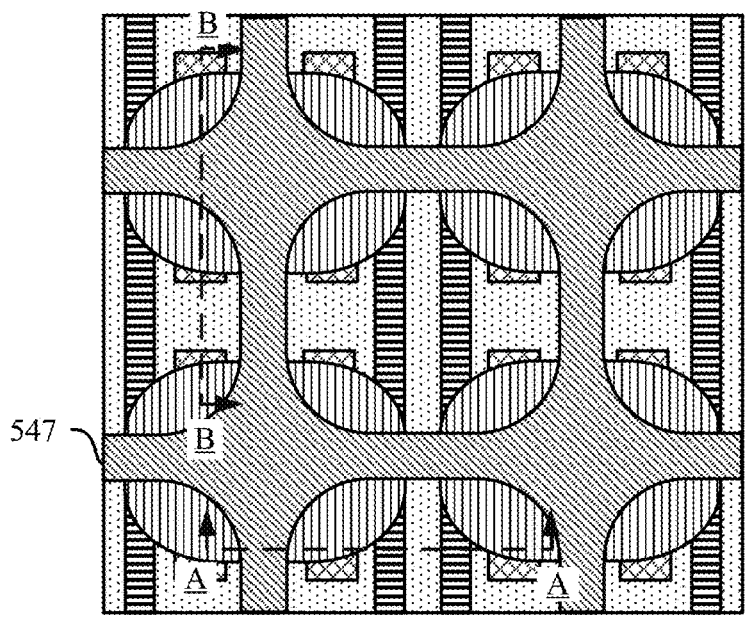
Figure 5D:
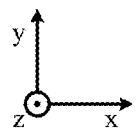
Figure 5D:
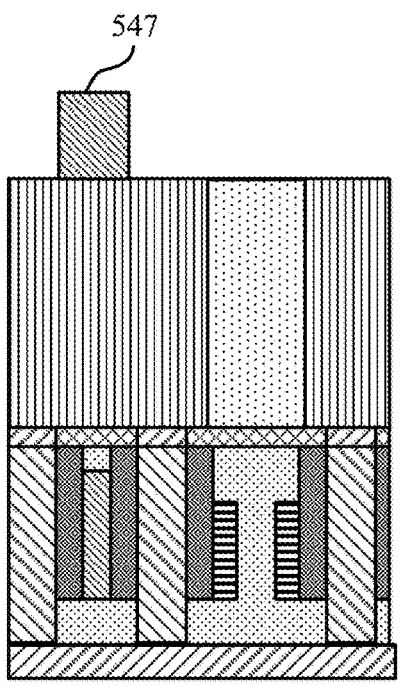
Figure 5D:
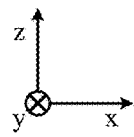
Figure 5D:
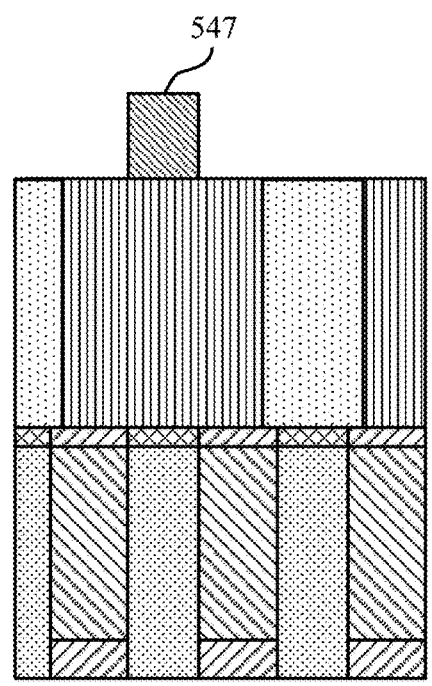
Figure 5D:
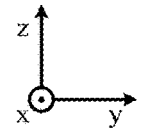

FIG. 5D depicts a memory array 500-d after a fourth set of manufacturing operations that support techniques to manufacture ferroelectric memory devices in accordance with examples as disclosed herein. The fourth set of manufacturing operations may include depositing a mask layer 547 (e.g., a hard mask) onto the layer of dielectric material 505. In some cases, the mask layer 547 may be an example of a polysilicon hard mask.

For example, the fourth set of manufacturing operations may include depositing a continuous layer of hard mask material which may include a set regions offset from the regions 540 in the x-direction and the y-direction. In such cases, each region of the mask layer 547 may expose a portion of a subset of the regions 540. For example, each cavity of the mask layer 547 may expose a corner of four separate regions 540. In some cases, the mask layer 547 may be formed using a depositing process or formed using a depositing process and an etching process.

Figure 5E:
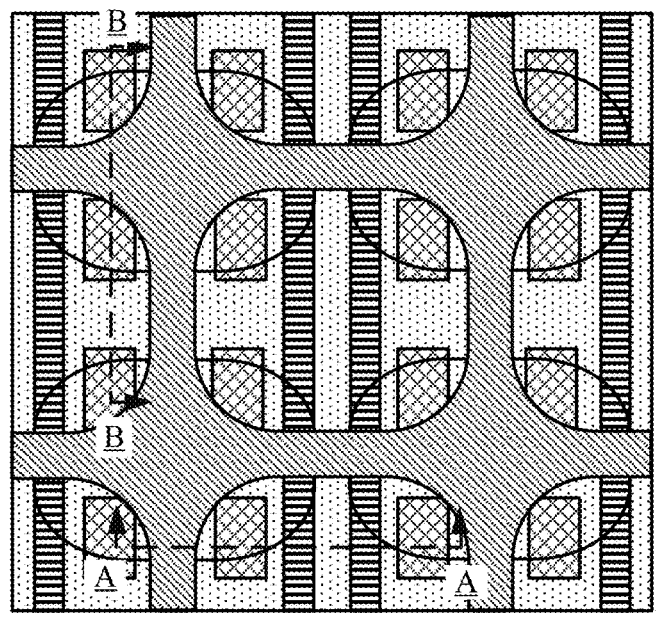
Figure 5E:
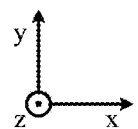
Figure 5E:
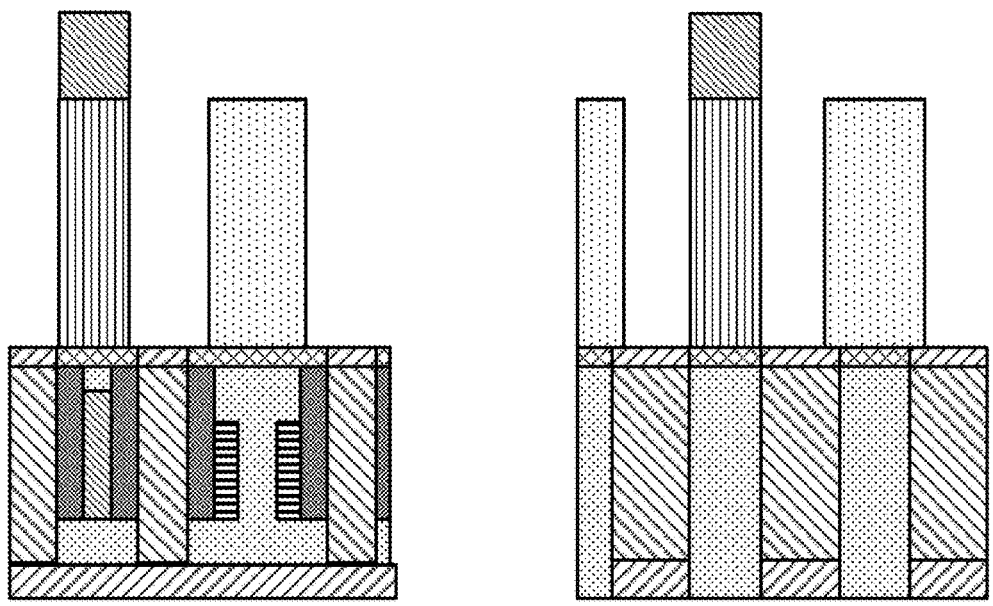
Figure 5E:
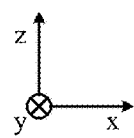
Figure 5E:
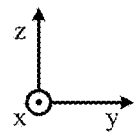

FIG. 5E depicts a memory array 500-e after a fifth set of manufacturing operations that support techniques to manufacture ferroelectric memory devices in accordance with examples as disclosed herein. The fifth set of manufacturing operations may include removing a portion of the placeholder material 545. For example, the portion of the placeholder material 545 exposed by the mask layer 547 may be removed using a selective etching procedure, such as a carbon stripping operation. In some cases, removing the portion of the placeholder material 545 may expose a set of portions of the lower of the assembly 510 in each region 540 (e.g., as shown in FIG. 5E). The mask layer 547 may prevent material underneath from being removed.

Figure 5F:
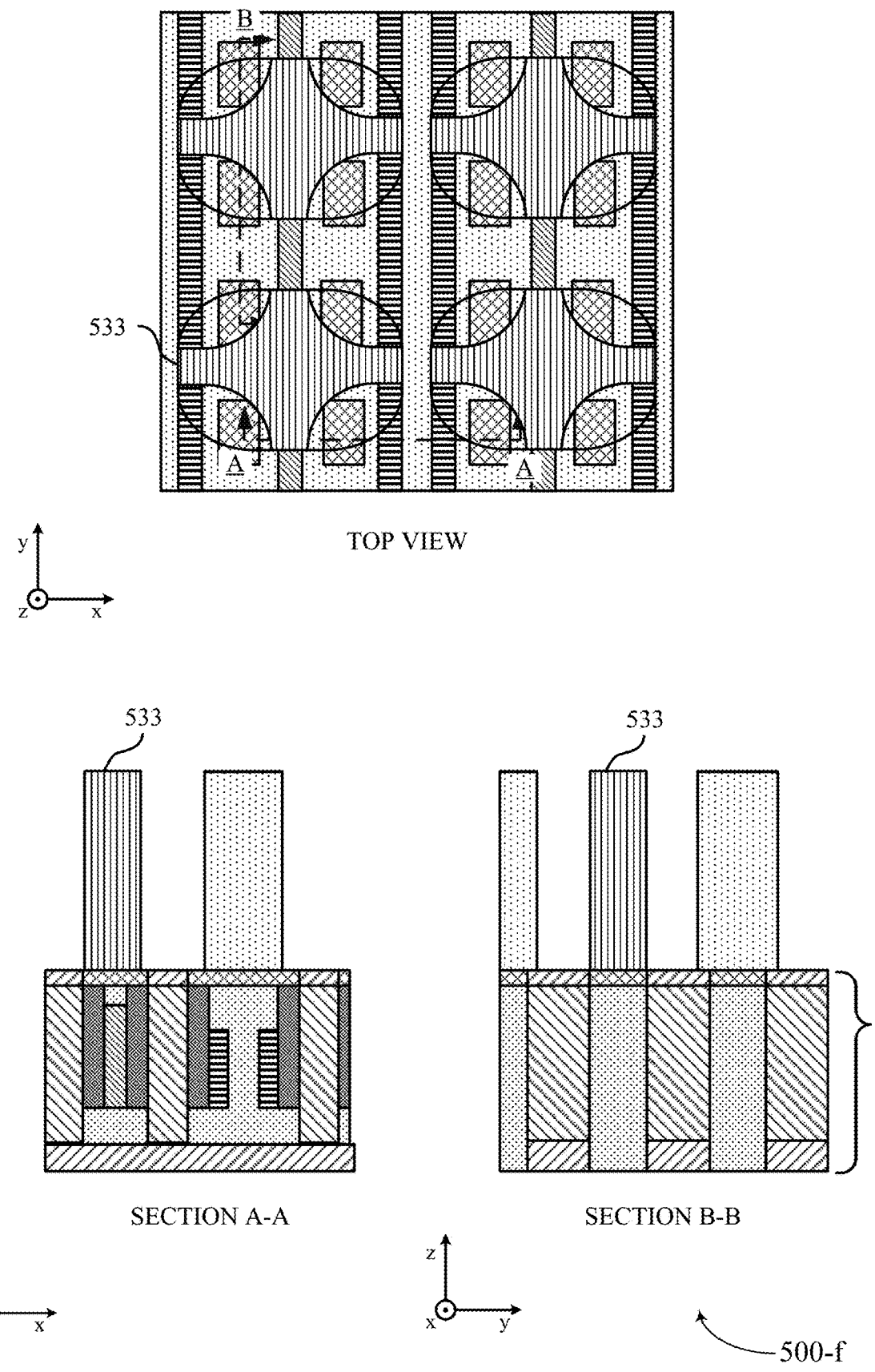

FIG. 5F depicts a memory array 500-f after a sixth set of manufacturing operations that support techniques to manufacture ferroelectric memory devices in accordance with examples as disclosed herein. The sixth set of manufacturing operations may include removing the mask layer 547. In some cases, removing the mask layer 547 may leave a set of cross structures 533 of the placeholder material 545.

Figure 5G:
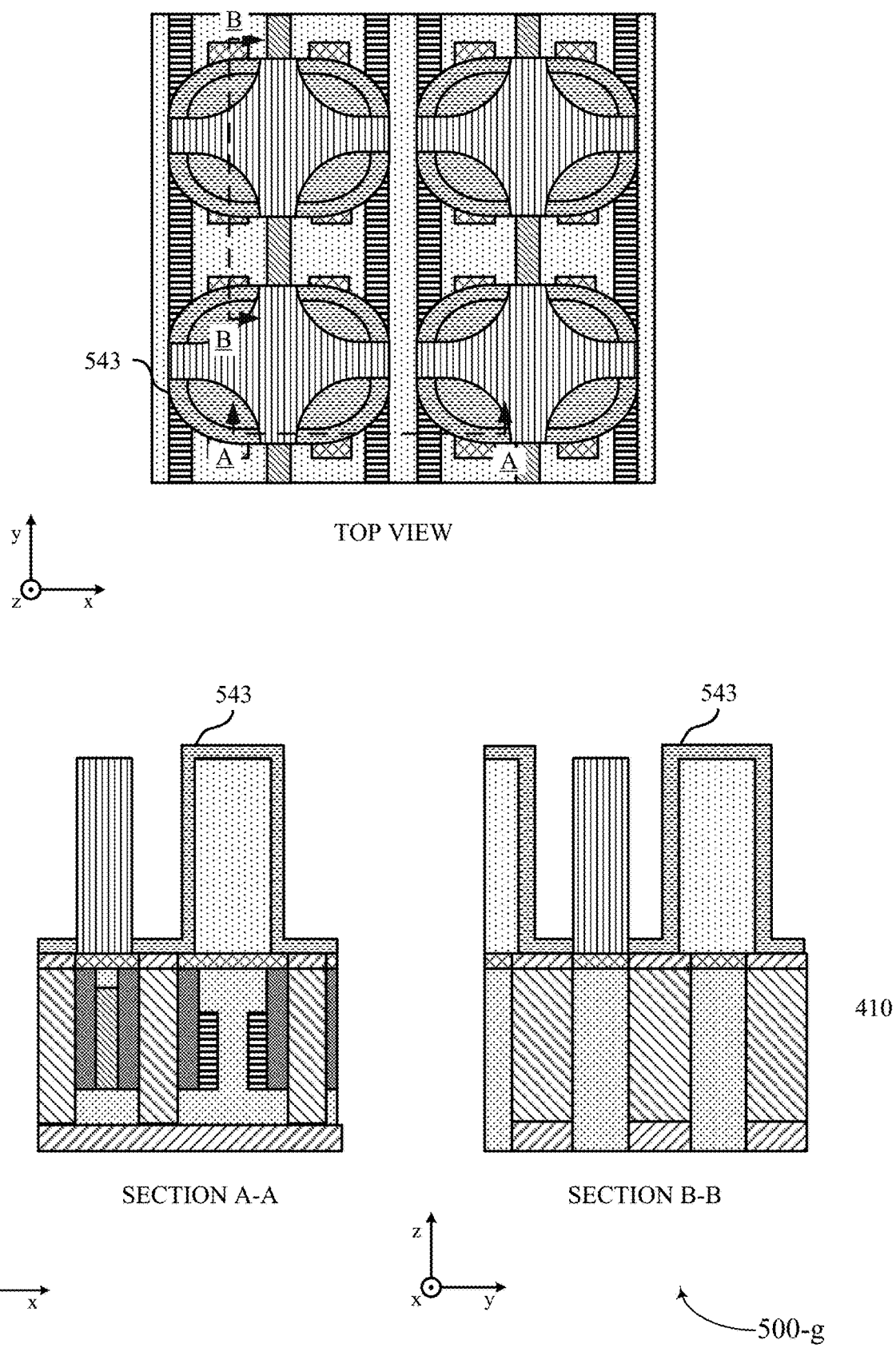

FIG. 5G depicts a memory array 500-g after a seventh set of manufacturing operations that support techniques to manufacture ferroelectric memory devices in accordance with examples as disclosed herein. The seventh set of manufacturing operations may include depositing a layer of electrode material 543 onto the layer of dielectric material 505. In some cases, the electrode material may be an example of a conductive material.

For example, the seventh set of manufacturing operations may include depositing the layer of electrode material 543 into each region 540. Accordingly, the layer of electrode material 543 may cover portions of sidewalls of each region 540, and may cover portions of the exposed surface of the assembly 510. That is, the layer of electrode material 543 may be deposited to be coupled with the exposed contacts 530 of each region 540. In some cases, the portion of the layer of electrode material 543 in contact with the assembly 510 may be referred to as a lower surface of the layer of electrode material 543.

In some examples, an operation to deposit the layer of electrode material 543 may be selective to the material of the layer of dielectric material 405. That is, the layer of electrode material 543 may not be deposited on sidewalls of the cross structures 533, as depicted in FIG. 5G.

Figure 5H:
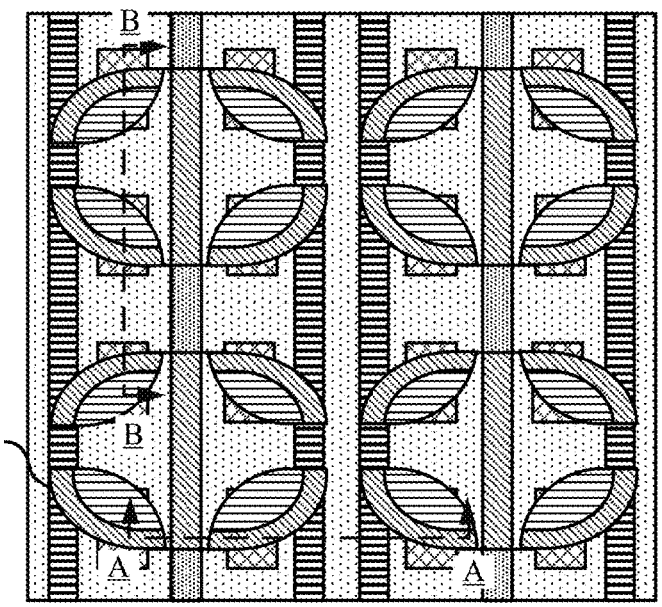
Figure 5H:
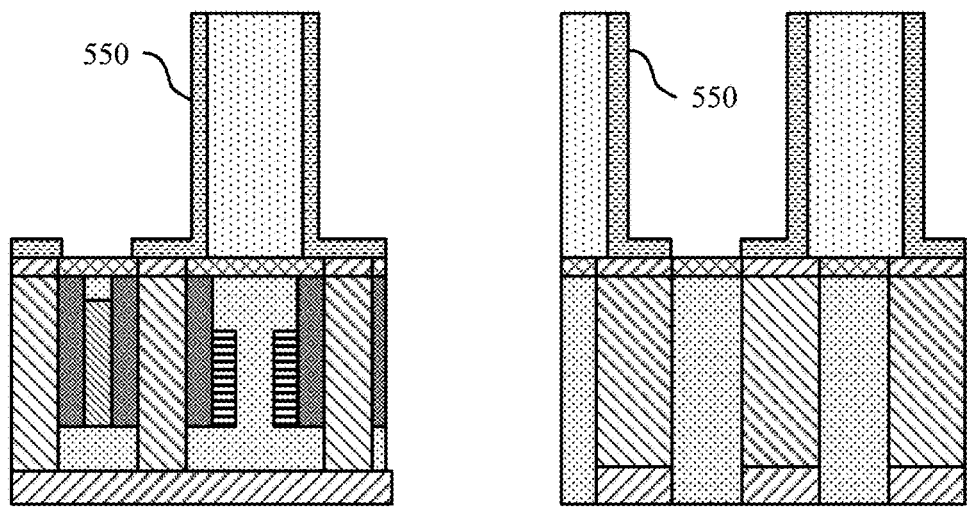

FIG. 5H depicts a memory array 500-h after a eighth set of manufacturing operations that support techniques to manufacture ferroelectric memory devices in accordance with examples as disclosed herein. In some cases, depositing the layer of electrode material 543 may cover exposed portions of the top of the layer of dielectric material 505. For example, the layer of electrode material 543 may be deposited to cover portions of the layer of dielectric material 505 between regions 540. Accordingly, the eighth set of manufacturing operations may include removing the portion of the layer of electrode material 543 covering the portions of the layer of dielectric material 505 between regions 540. Thus, a layer of electrode material 543 corresponding to a first region 540 may be isolated (e.g., electrically) from a layer of electrode material 543 corresponding to a region 540.

Additionally, the eighth set of manufacturing operations may include removing the set of cross structures 533, for example using a carbon stripping operation. In some cases. removing the set of cross structures 533 may define a set of electrode structures 550 from the layer of electrode material 543. Each electrode structure 550 may correspond to a contact 530 and may include a sidewall formed on a side wall of a cavity 508 and a bottom surface formed on the surface of the assembly 510. Accordingly, a bottom surface of each electrode structure 550 may be coupled with a respective contact 430.

Figure 5I:
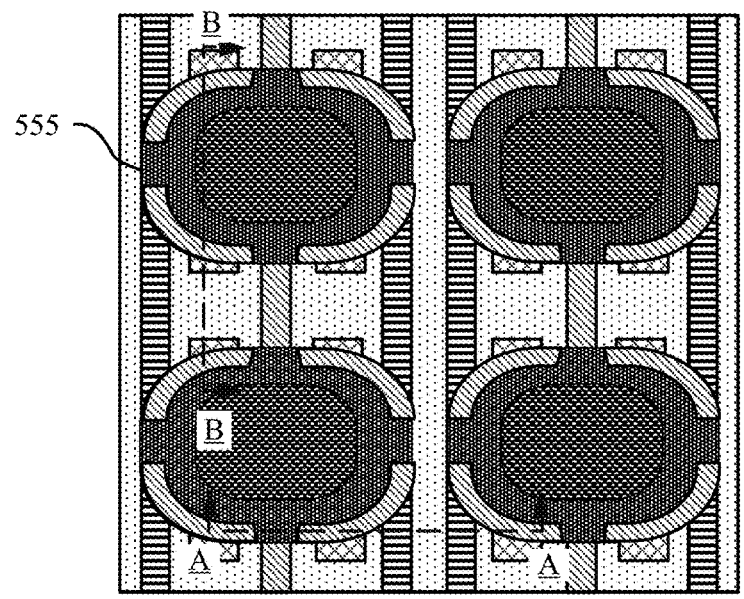
Figure 5I:
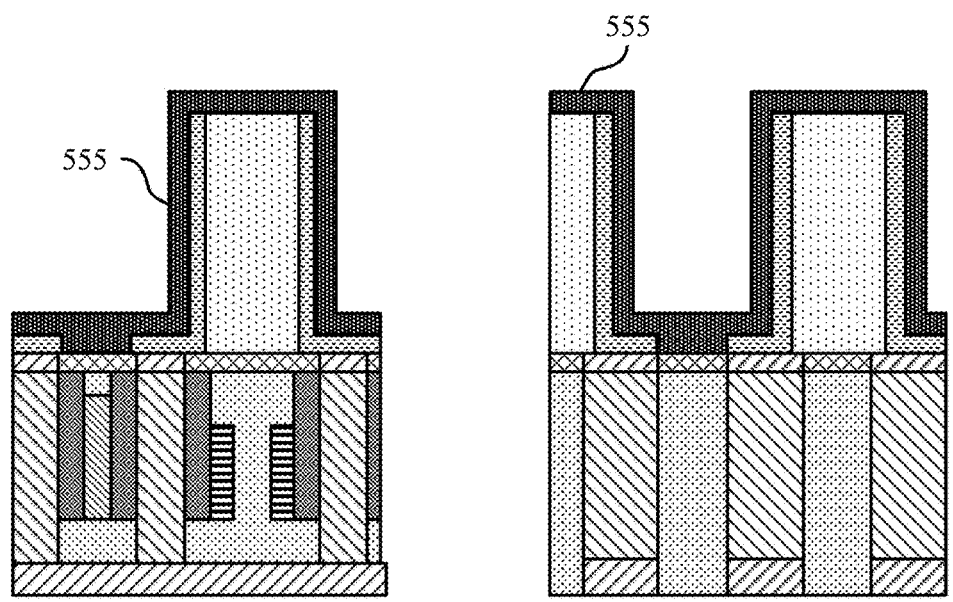

FIG. 5I depicts a memory array 500-i after a ninth set of manufacturing operations that support techniques to manufacture ferroelectric memory devices in accordance with examples as disclosed herein. The ninth set of manufacturing operations may include depositing a layer of ferroelectric material 555 onto the memory array 500-i.

For example, the ninth set of manufacturing operations may include depositing the layer of ferroelectric material 555 into each region 540 to cover the electrode structures 550, and in some cases exposed portions of the assembly 510. In some cases, to deposit the layer of ferroelectric material 555, the eighth set of manufacturing operations may support a film deposition operation.

Figure 5J:
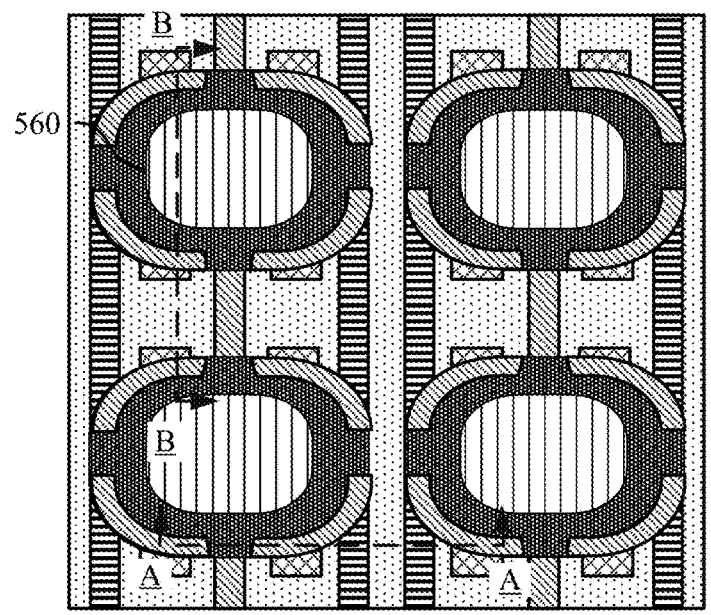
Figure 5J:
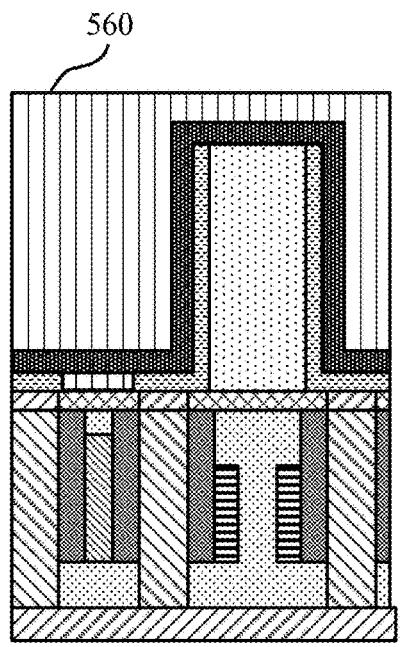
Figure 5J:
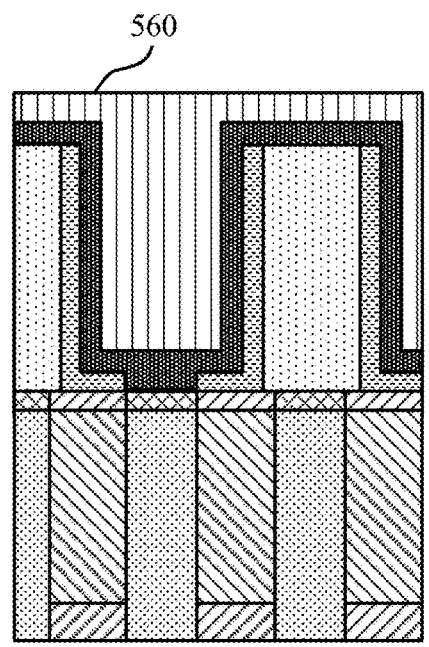

FIG. 5J depicts a memory array 500-j after a tenth set of manufacturing operations that support techniques to manufacture ferroelectric memory devices in accordance with examples as disclosed herein. The tenth set of manufacturing operations may include depositing a layer of conductive material 560. For example, after depositing the layer of ferroelectric material 555, the tenth set of manufacturing operations may include depositing the layer of conductive material 560 into each region 540 to cover the layer of ferroelectric material 555 and substantially fill the cavity 508. In some examples, the portion of the conductive material filling a cavity 508 may be referred to as a conductive post. In some cases, to deposit the conductive material, the tenth set of manufacturing operations may support a film deposition operation.

Figure 5K:
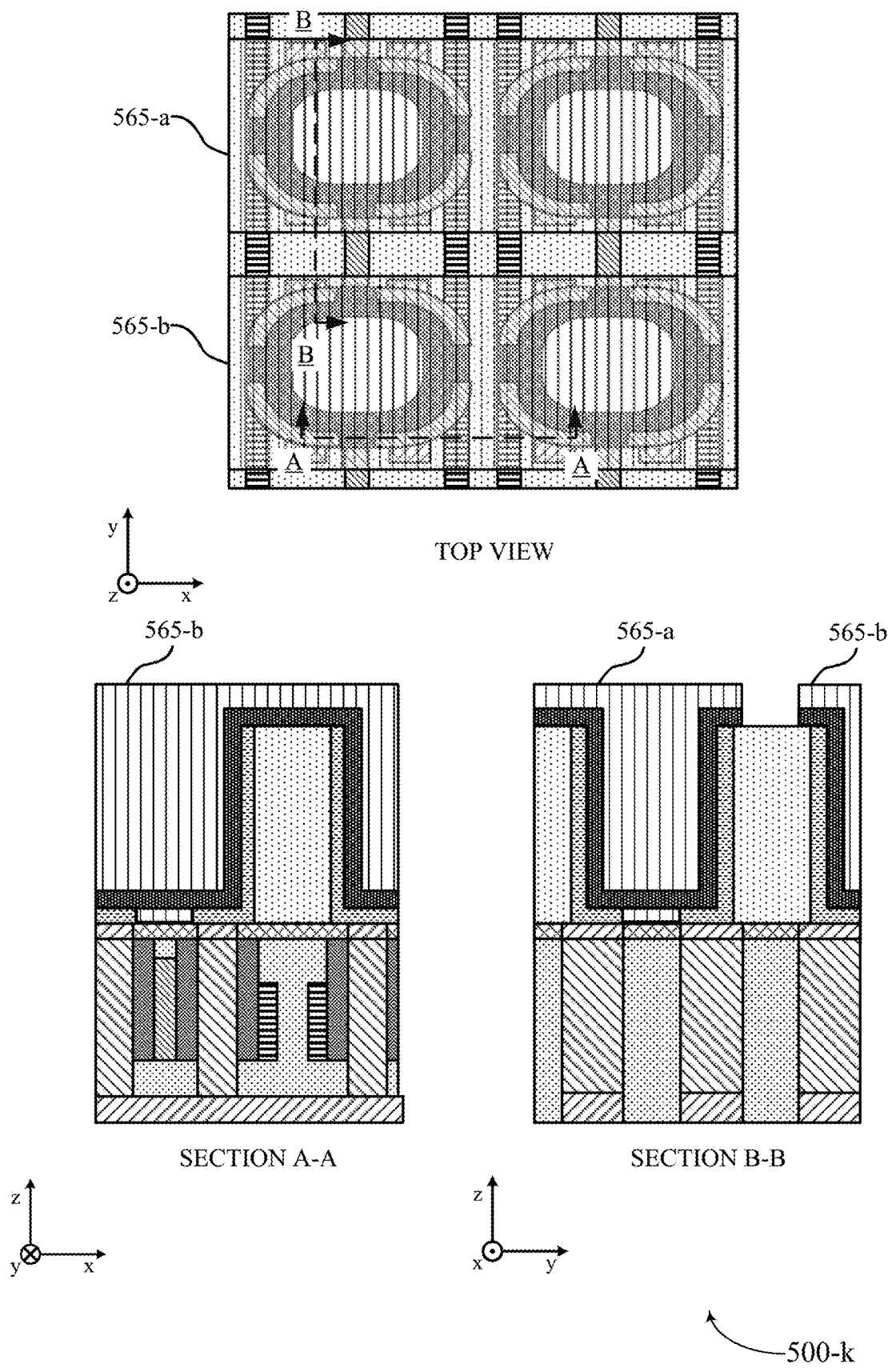

FIG. 5K depicts a memory array 500-k after a tenth set of manufacturing operations that support techniques to manufacture ferroelectric memory devices in accordance with examples as disclosed herein. The eleventh set of manufacturing operations may include removing a portion of the layer of conductive material 560, such as portion extending in x-direction (e.g., orthogonal to the word lines 520) between adjacent rows of regions 540, to form a set of plate lines 565. The set of plate lines 565 may include a first plate line 565-a corresponding to a first row of regions 540 and a second plate line 565-b corresponding to a second row of regions 540. Accordingly, forming the set of plate lines 565 may form a set of memory cells of the memory array 500-k, each memory cell associated with a ferroelectric capacitor that includes an electrode structure 550 (e.g., a first plate of the capacitor) and a portion of a plate line 565 (e.g., a second plate of the capacitor).

In some examples, a memory array manufactured using the set of manufacturing operations as described with reference to FIGS. 5A through 5K may include a conductive plate coupling an electrode segment 550 with a plate line 565. For example, the set of manufacturing operations may be modified to include forming a conductive plate in an upper portion of a region 540, as described in greater detail with reference to FIG. 6D. In some cases, the conductive plate may act as a leaker to mitigate unwanted charge on a memory cell. For example, a memory cell may develop charge from coupling effects from surrounding memory cells (e.g., due to parasitic capacitance, field effects from applied voltages), which may disturb or destroy a stored logic state. In some cases, the developed charge may dissipate through the conductive plate, which may reduce coupling effects from surrounding memory cells.

In some cases, a memory array manufactured using the set of manufacturing operations as described with reference to FIGS. 5A through 5K may include a set of barrier structures positioned between adjacent electrode segments 550. For example, the set of manufacturing operations may be modified to include forming a set of voids extending past the regions 540 which, when filled with the layer of ferroelectric material 555 and the conductive material 560, may form the set of barrier structures, as described in greater detail with reference to FIG. 6K.

FIGS. 6A through 6L illustrates examples of processing steps of a method that supports techniques to manufacture ferroelectric memory devices in accordance with examples as disclosed herein. illustrate examples of operations that support techniques to manufacture ferroelectric memory devices in accordance with examples as disclosed herein. For example, FIGS. 6A through 6L may illustrate aspects of a sequence of operations for fabricating aspects of a memory array, which may be a portion of a memory device (e.g., a portion of a memory device 110, a portion of a memory die 200, a memory array 300). Each view of the figures may be described with reference to an x-direction, a y-direction, and a z-direction, as illustrated. The provided figures may include section views that illustrate example cross-sections of the memory array. For example, in FIGS. 6A through 6L, a view "SECTION A-A" may be associated with a cross-section in an xz-plane (e.g., in accordance with a cut plane A-A), and a view "SECTION B-B" may be associated with a cross-section in an yz-plane (e.g., in accordance with a cut plane B-B). Additionally, a top view may be associated with a cross-section in an xy-plane cutting the memory array at mid-height (e.g., a plane located at an approximate middle of the memory array in the z-direction). In some cases, materials (or portions of materials) may be omitted from the top view to provide clarity and show structures underneath. Although the memory array illustrates examples of certain relative dimensions and quantities of various features, aspects of the memory array may be implemented with other relative dimensions or quantities of such features in accordance with examples as disclosed herein.

Operations illustrated in and described with reference to FIGS. 6A through 6L may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 6A:
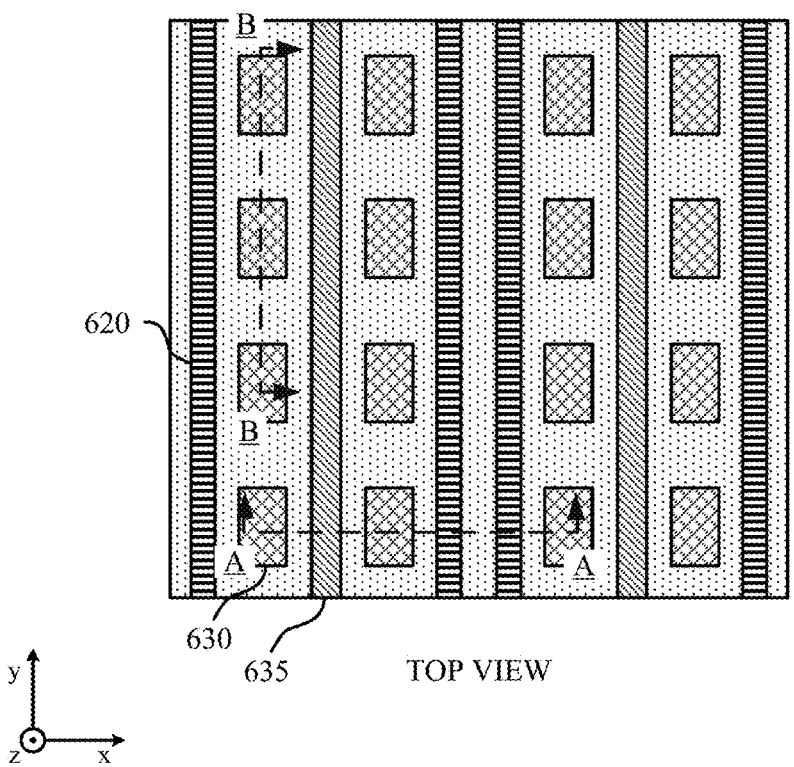
FIGS. 6A through 6L illustrate examples of processing steps of a method that supports techniques to manufacture ferroelectric memory devices in accordance with examples as disclosed herein.
Figure 6A:
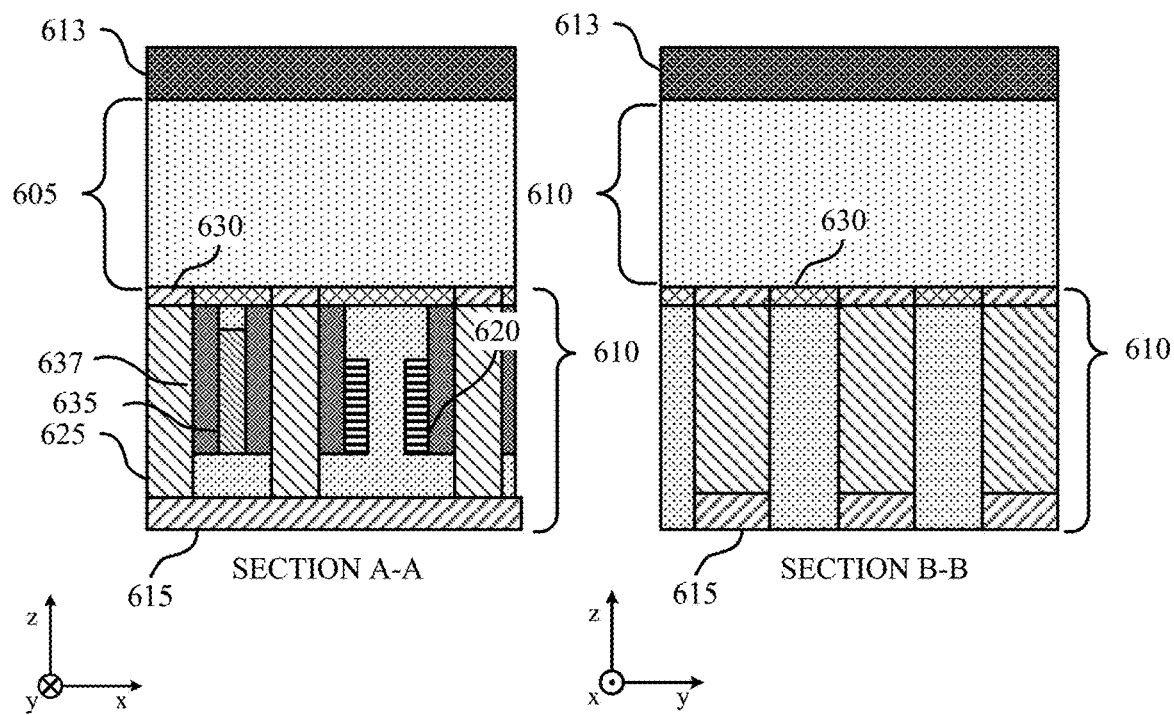

FIG. 6A depicts a memory array 600-a after a first set of manufacturing operations that support techniques to manufacture ferroelectric memory devices in accordance with examples as disclosed herein. The first set of manufacturing operations may include depositing a layer of dielectric material 605 above an assembly 610. The assembly 610 may include circuitry used as part of accessing memory cells of a memory array, such as the memory array 170, the memory die 200, or the memory array 300. For example, the assembly 610 may include one or more digit lines 615 extending in the x-direction and one or more word lines 620 extending in the y-direction, which may each be examples of the corresponding components as described with reference to FIG. 2.

The assembly 610 may include a set of transistors 625 arranged in one or more rows extending in the x-direction and one or more columns extending in the y-direction. A transistor 625 may be operable to selectively couple a memory cell with a digit line 615. For example, a word line 620 may be configured to bias a gate of the transistor 625 to couple a source terminal and a drain terminal of the transistors 625. In some cases, each transistor 625 may include a contact 630 (e.g., a terminal, such as the source terminal or drain terminal) arranged on an upper surface of the assembly 610. In some cases, the assembly 610 may include a set of shield lines 635 (e.g., barrier lines) extending in the y-direction arranged between alternating columns of transistors 625 (e.g., as illustrated in FIG. 6A). A shield line 635 may act as barrier between pairs of columns of transistors 625, which may mitigate undesirable effects (e.g., parasitic capacitance) on a first word line 620 if an adjacent second word line 620 is biased. In some cases, the assembly 610 may include an insulative or liner material 637, which may act as a barrier for a transistor 625.

In some cases, the first set of manufacturing operations may include depositing a layer of nitride material 613 on the layer of dielectric material 605. The layer of nitride material 613 may be an example of a silicon nitride.

Figure 6B:
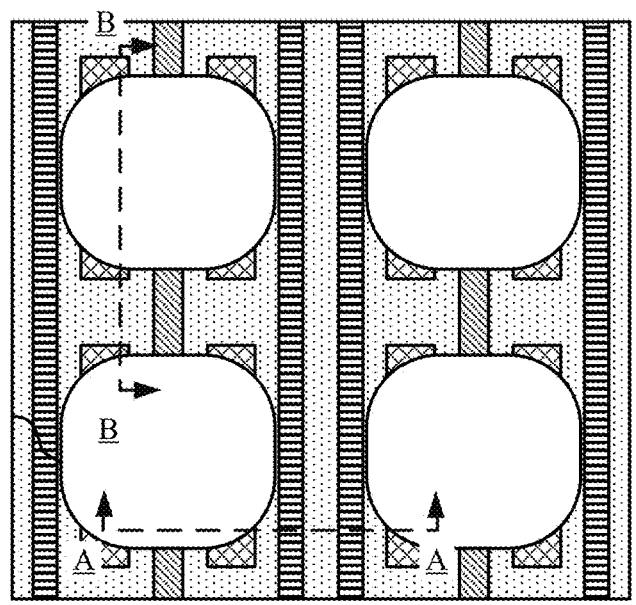
Figure 6B:
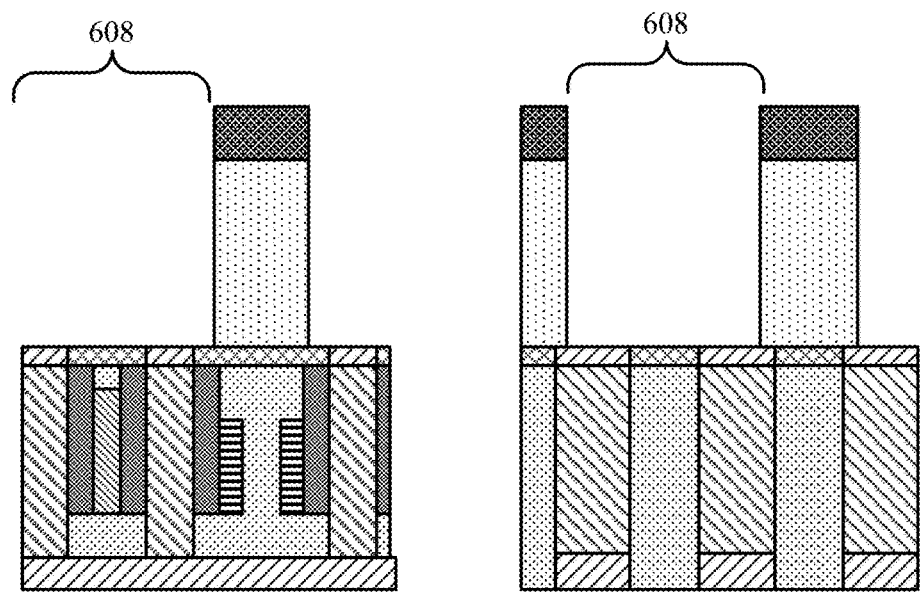

FIG. 6B depicts a memory array 600-b after a second set of manufacturing operations that support techniques to manufacture ferroelectric memory devices in accordance with examples as disclosed herein. The second set of manufacturing operations may also include operations that support removing one or more portions of the layer of dielectric material 605 and the layer of nitride material 613 from a region 640 to form a set of cavities 408. For example, the second set of manufacturing operations may include etching (e.g., dry etching) the layer of dielectric material 605 to remove material from the set of regions 640 form the set of cavities 608. In some cases, the set of regions 640 may be arranged in a grid structure, which may include one or more rows extending in the x-direction and one or more columns extending the y-direction. A cavity 608 may be associated with and expose a set of contacts 630. For example, forming a cavity 608 may expose four contacts 630.

Figure 6C:
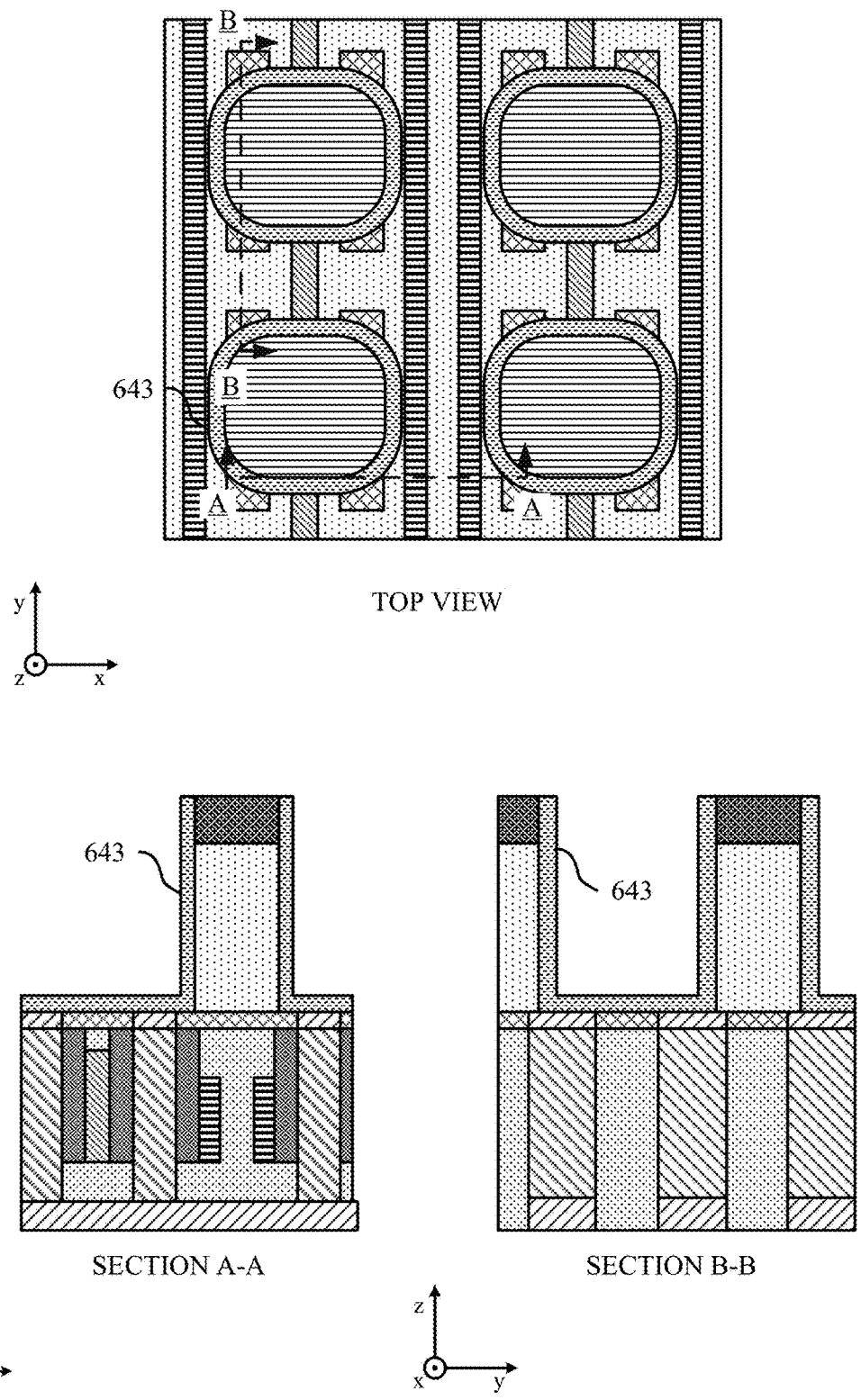

FIG. 6C depicts a memory array 600-c after a third set of manufacturing operations that support techniques to manufacture ferroelectric memory devices in accordance with examples as disclosed herein. The third set of manufacturing operations may include depositing a layer of electrode material 643 onto the layer of dielectric material 605 and the layer of nitride material 613. In some cases, the electrode material may be an example of a conductive material.

For example, the third set of manufacturing operations may include depositing the layer of electrode material 643 into each region 640. Accordingly, the layer of electrode material 643 may cover sidewalls of each cavity 608, and may cover the exposed surface of the assembly 610. That is, the layer of electrode material 643 may be deposited to be coupled with the exposed contacts 630 of each region 640. In some cases, the portion of the layer of electrode material 643 in contact with the assembly 610 may be referred to as a lower surface of the layer of electrode material 643.

In some cases, depositing the layer of electrode material 643 may cover exposed portions of the top of the layer of nitride material 613. For example, the layer of electrode material 643 may be deposited to cover portions of the layer of nitride material 613 between regions 640. Accordingly, the third set of manufacturing operations may include removing the portion of the layer of electrode material 643 covering the portions of the layer of nitride material 613 between regions 640. Thus, a layer of electrode material 637 corresponding to a first region 640 may be isolated (e.g., electrically) from a layer of electrode material 643 corresponding to a region 640.

Figure 6D:
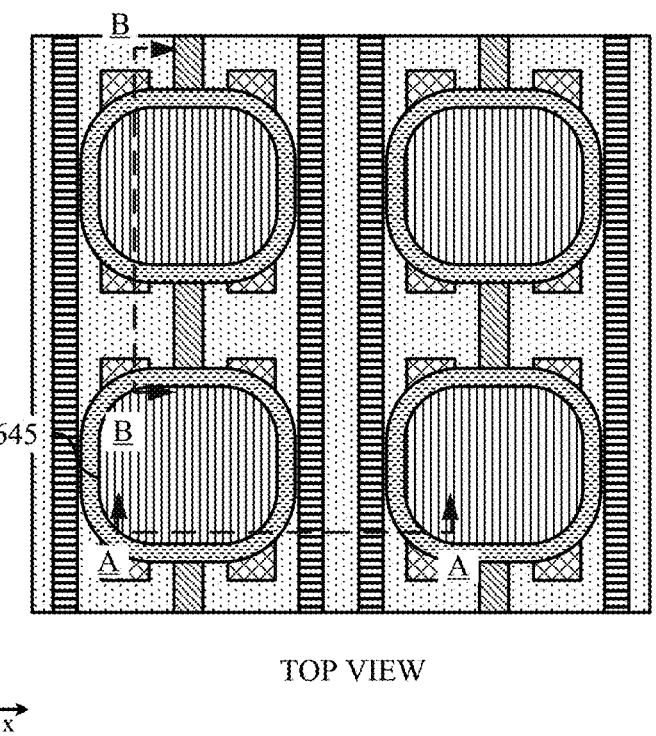
Figure 6D:
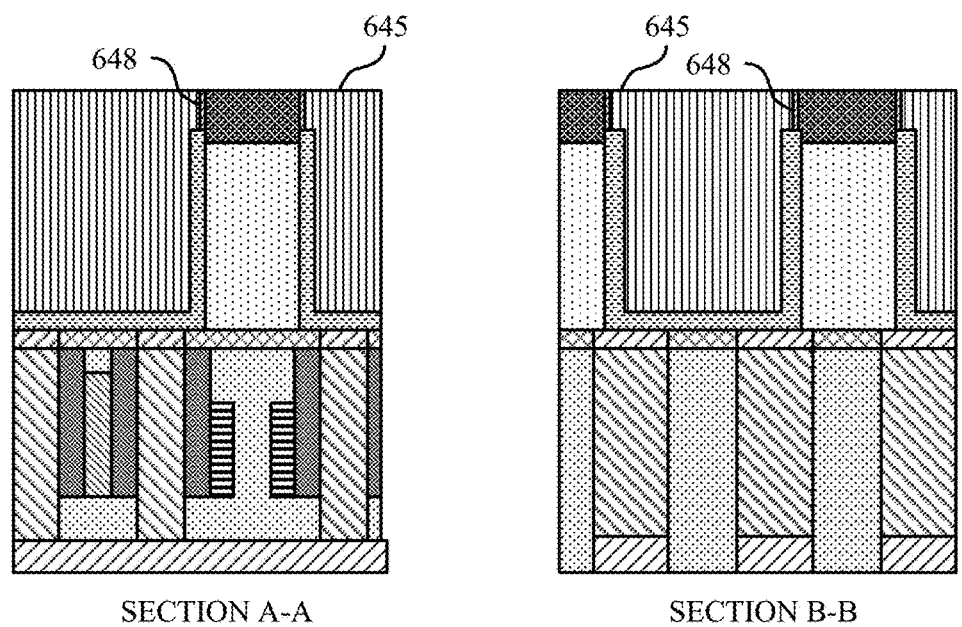

FIG. 6D depicts a memory array 600-d after a fourth set of manufacturing operations that support techniques to manufacture ferroelectric memory devices in accordance with examples as disclosed herein. The fourth set of manufacturing operations may include forming a set of conductive plates 648 on sidewalls of the layer of nitride material 613 in each region 640.

For example, the fourth set of manufacturing operations may include removing a portion of sidewalls of the layer of electrode material 643 in each region 640 to expose a portion of sidewalls of the layer of nitride material 613. Subsequently, a conductive material may be deposited to cover the exposed sidewalls of the layer of nitride material 613 to form the conductive plates 648. Additionally or alternatively, the set of conductive plates 648 may be formed by partially removing the portion of sidewalls of the layer of electrode material 643. That is, the portion of sidewalls of the layer of electrode material 643 may be thinned (e.g., using ALE) without fully removing the portion of sidewalls of the layer of electrode material 643. Accordingly, the remaining portion of sidewalls of the layer of electrode material 643 may form the conductive plates 648.

In some cases, the fourth set of manufacturing operations may include depositing a placeholder material 645 into each region 640. For example, the placeholder material 645 may be deposited to fill each cavity 608 and cover sidewalls of the set of conductive plates 648. In some cases, after depositing the placeholder material 645, the fourth set of manufacturing operations may include performing a planarization or etch-back procedure to remove a portion of the placeholder material 645. In some cases, the placeholder material 645 may include carbon.

Figure 6E:
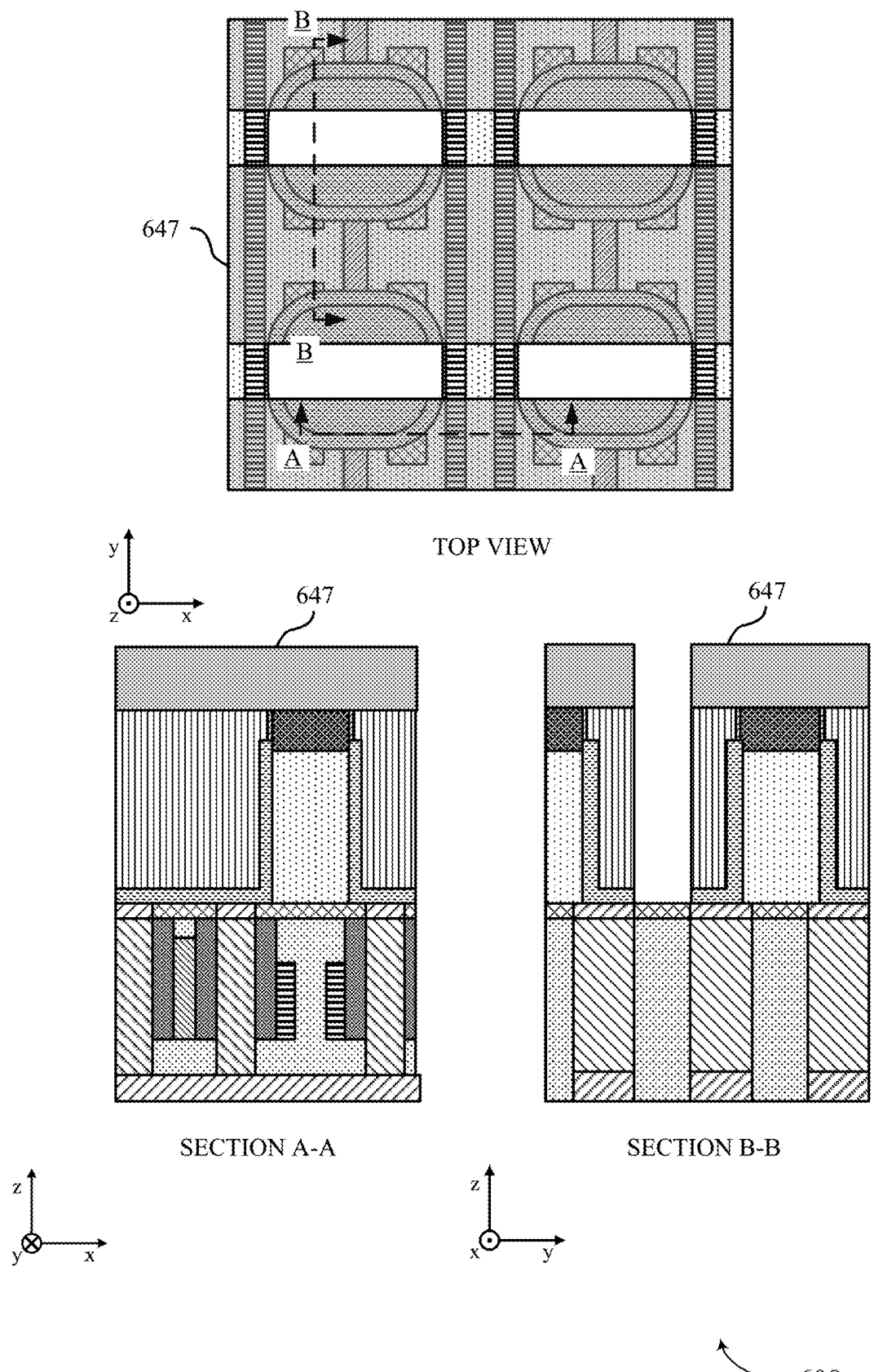

FIG. 6E depicts a memory array 600-e after a fifth set of manufacturing operations that support techniques to manufacture ferroelectric memory devices in accordance with examples as disclosed herein. The fifth set of manufacturing operations may include depositing a mask layer 647 (e.g., a hard mask) onto the layer of nitride material 613. In some cases, the mask layer 647 may be an example of a polysilicon hard mask. For example, the fifth set of manufacturing operations may include depositing a the mask layer 647 to expose portions of the memory array 600-e extending in the x-direction through each region 640. In some cases, the exposed portions of the memory array 600-e may be positioned between adjacent rows of contacts 630.

In some cases, the fifth set of manufacturing operations may include removing a portion of the placeholder material 645 and a portion of the layer of electrode material. For example, the portion of the memory array 600-e may exposed by the mask layer 647 may be removed to expose a portion of the surface of the assembly 610 extending in the x-direction.

Figure 6F:
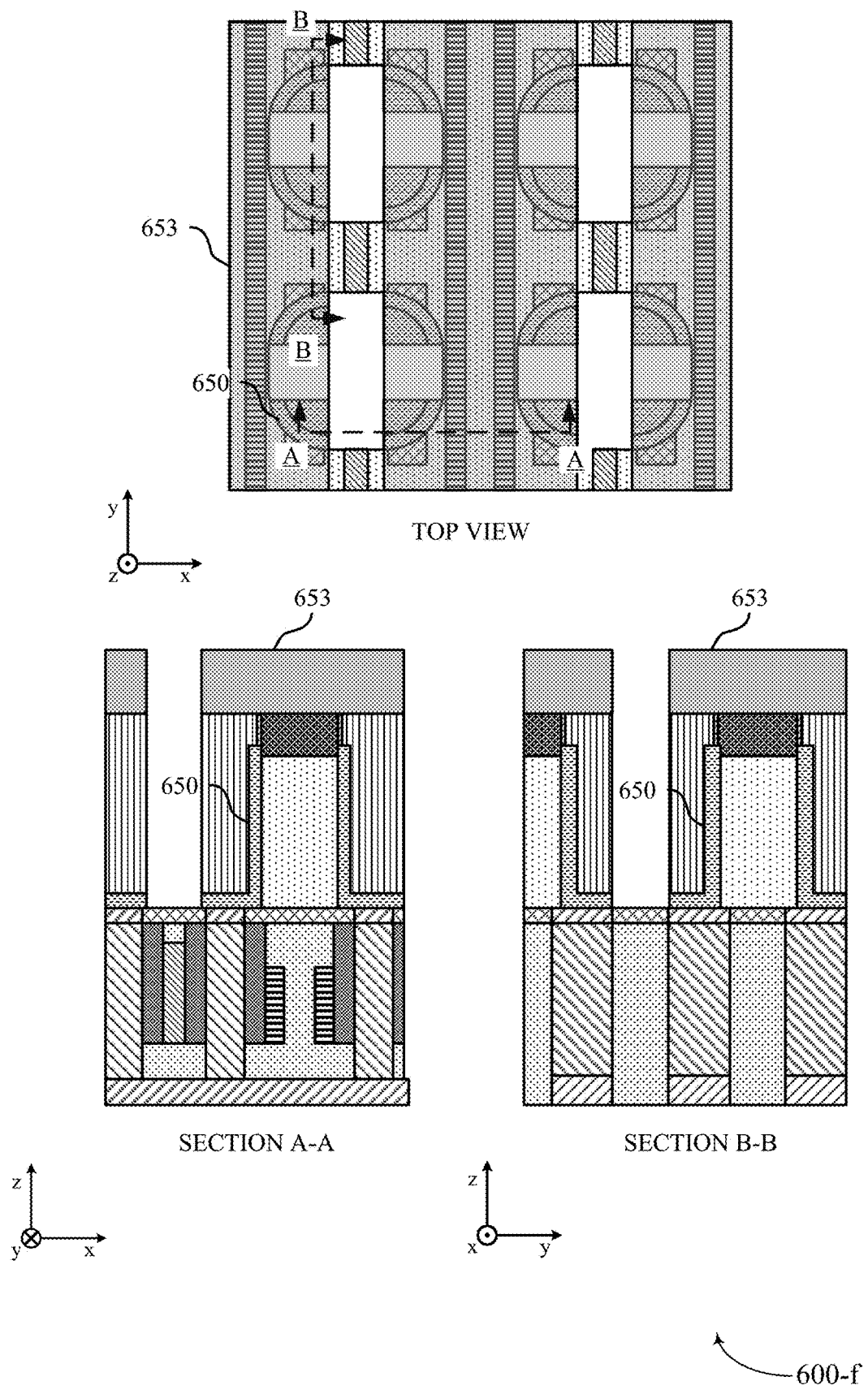

FIG. 6F depicts a memory array 600-f after a sixth set of manufacturing operations that support techniques to manufacture ferroelectric memory devices in accordance with examples as disclosed herein. The sixth set of manufacturing operations may include depositing a second mask layer 653 (e.g., a hard mask) onto the layer of nitride material 613. In some cases, the second mask layer 653 may be an example of a polysilicon hard mask. For example, the sixth set of manufacturing operations may include depositing a the second mask layer 653 to expose portions of the memory array 600-f extending in the y-direction through each region 640. In some cases, the exposed portions of the memory array 600-f may be positioned between adjacent columns of contacts 630.

In some cases, the sixth set of manufacturing operations may include removing a portion of the placeholder material 645 and a portion of the layer of electrode material. For example, the portion of the memory array 600-f may exposed by the second mask layer 653 may be removed to expose a portion of the surface of the assembly 610 extending in the y-direction.

Removing portions of the memory array 600-e and 600-f exposed by the mask layer 647 and the second mask layer 653 may define a set of electrode structures 650. For example, removing the portions of the memory array 600-e and 600-f may separate the corresponding layer of electrode material 643 into the set of electrode structures 650. Each electrode structure 650 may correspond to a contact 630. Accordingly, a bottom surface of each electrode structure 650 may be coupled with a respective contact 630.

Figure 6G:
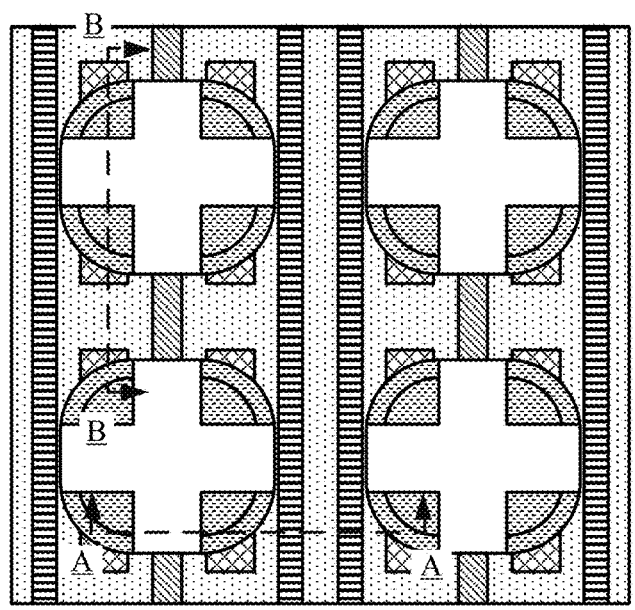
Figure 6G:
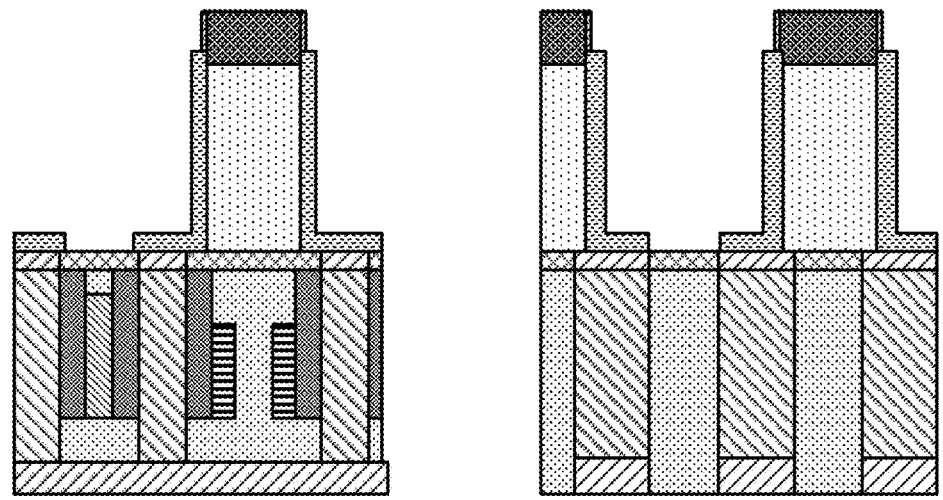

FIG. 6G depicts a memory array 600-g after a seventh set of manufacturing operations that support techniques to manufacture ferroelectric memory devices in accordance with examples as disclosed herein. The seventh set of manufacturing operations may include removing remaining portions of the placeholder material 645 (e.g., placeholder material 645 not removed as part of the fifth set of manufacturing operations or the sixth set of manufacturing operations), for example using a carbon stripping operation.

Figure 6H:
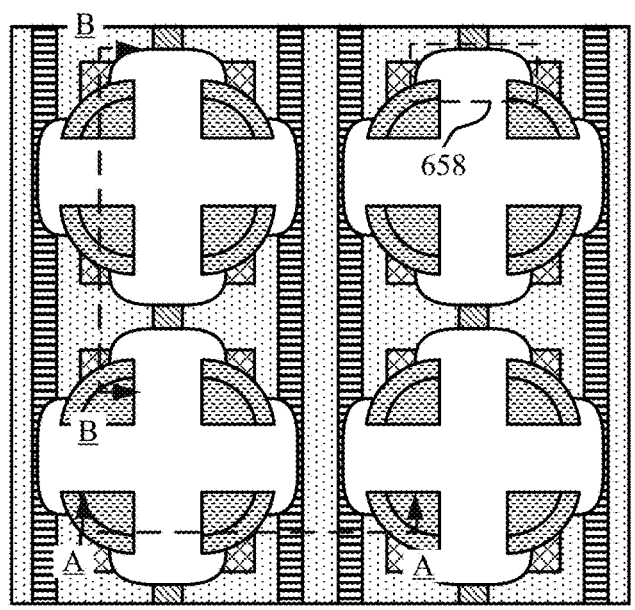
Figure 6H:
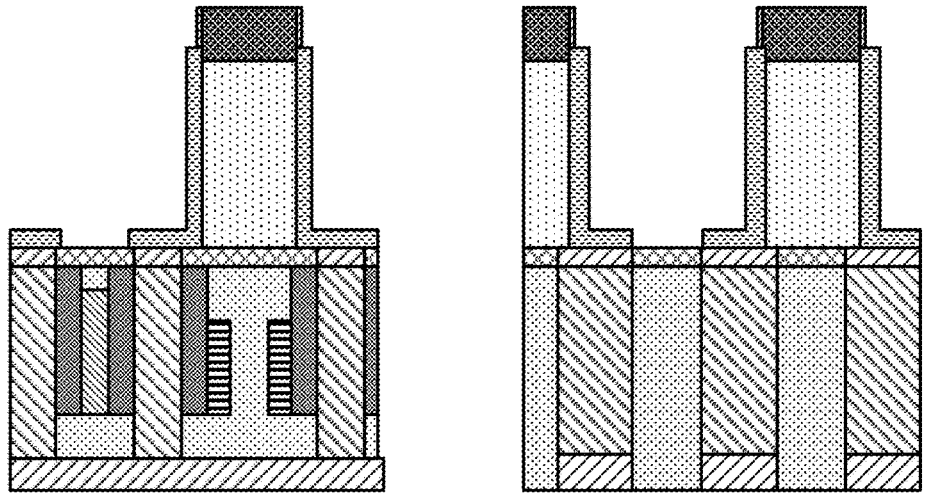

FIG. 6H depicts a memory array 600-h after an eighth set of manufacturing operations that support techniques to manufacture ferroelectric memory devices in accordance with examples as disclosed herein. The eighth set of manufacturing operations may include forming a set of voids 658 extending past each region 640 of the set of regions 640. In some cases, the set of voids 658 may facilitate formation of a set of barrier segments, which may mitigate coupling (e.g., parasitic capacitance, field effects) between adjacent electrode segments 650, as described in greater detail with reference to FIGS. 6K and 6L.

For example, the eighth set of manufacturing operations may include an operation such as a wet etch (e.g., an oxide isotropic wet etch) to selectively remove portions of the layer of dielectric material 605 without removing other components of the memory array 600-h (e.g., the layer of nitride material 613, the electrode structures 650, the assembly 610). Accordingly, the layer of nitride material 613 may form a lattice above the set of voids 658, which may provide stability to the memory array 600-h.

Figure 6I:
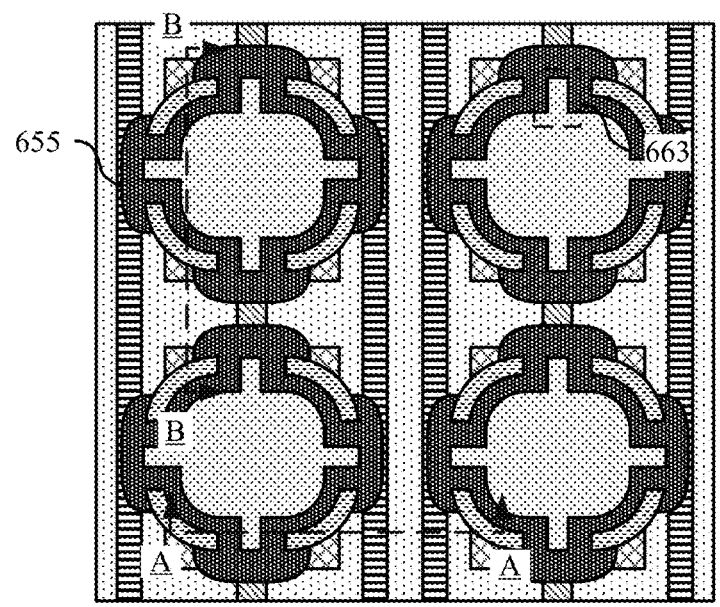
Figure 6I:
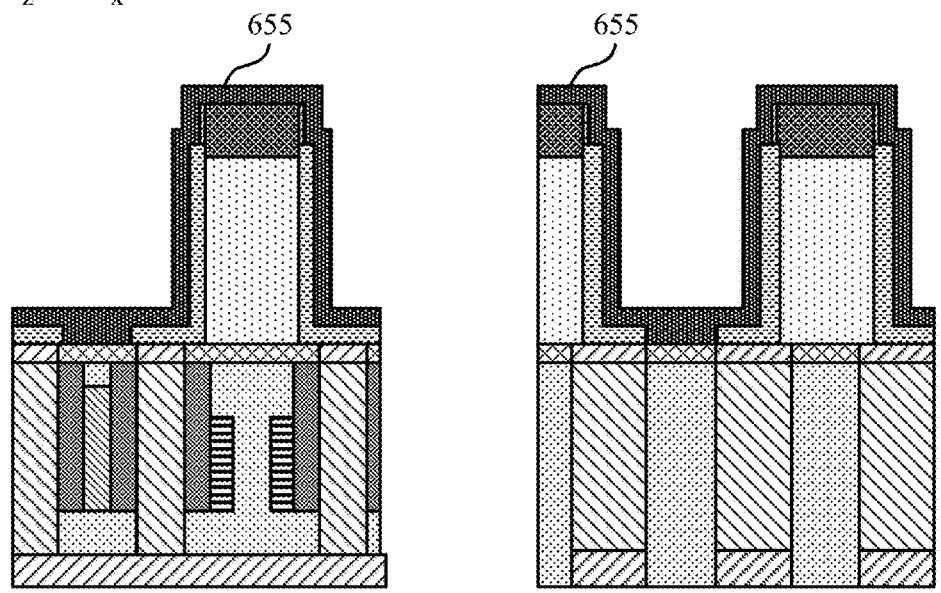

FIG. 6I depicts a memory array 600-i after a ninth set of manufacturing operations that support techniques to manufacture ferroelectric memory devices in accordance with examples as disclosed herein. The ninth set of manufacturing operations may include depositing a layer of ferroelectric material 655 onto the memory array 600-i.

For example, the ninth set of manufacturing operations may include depositing the layer of ferroelectric material 655 into each region 640 to cover the electrode structures 650, and in some cases exposed portions of the assembly 610. Additionally, the layer of ferroelectric material 655 may be deposited to partially fill the set of voids 658 (e.g., the deposition may be conformal). In some cases, a thickness of the layer of ferroelectric material 655 may be less than a depth of a void 658. Accordingly, depositing the layer of ferroelectric material 655 may leave a set of second voids 663 positioned between adjacent electrode structures 650. The size of the voids left by the deposition process may be based on the voids formed as part of the steps shown and described with reference to FIG. 6H. In some cases, the size of the voids 658 may be adjusted to adjust the size of the voids shown in FIG. 6I after depositing the ferroelectric material. In some cases, to deposit the layer of ferroelectric material 655, the eighth set of manufacturing operations may support a film deposition operation, such as atomic layer deposition (ALD).

Figure 6J:
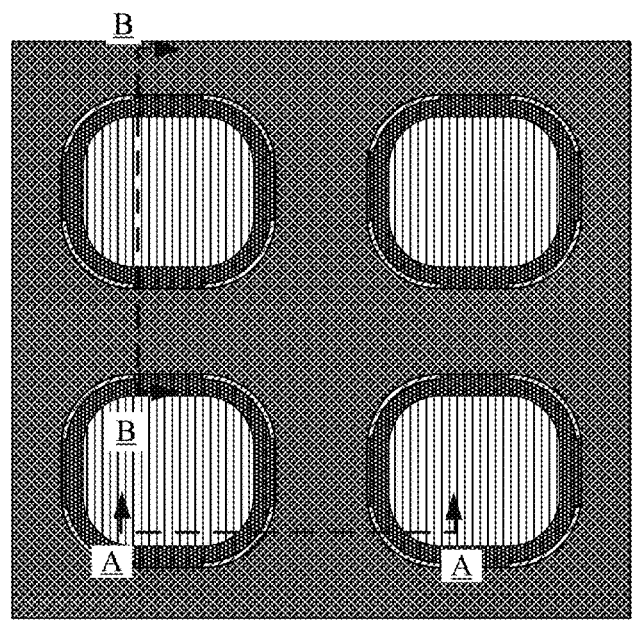
Figure 6J:
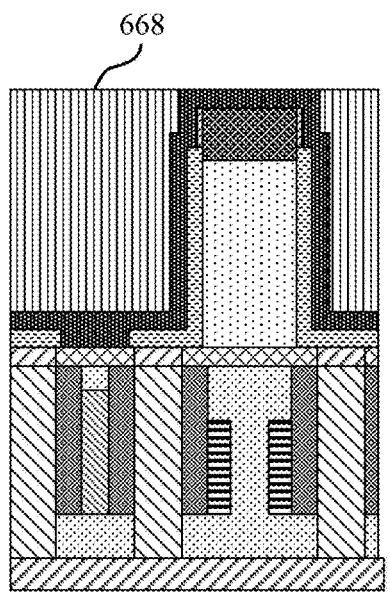
Figure 6J:
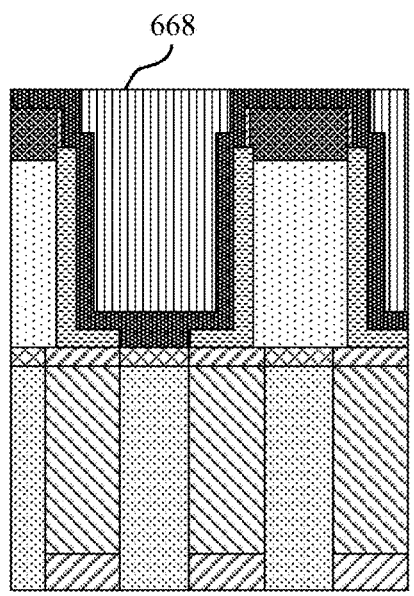

FIG. 6J depicts a memory array 600-j after a tenth set of manufacturing operations that support techniques to manufacture ferroelectric memory devices in accordance with examples as disclosed herein. The top view of FIG. 6J may illustrate the memory array at the level of the layer of nitride material 613. The tenth set of manufacturing operations may include depositing a second placeholder material 668 in each region 640 to substantially fill the cavities 608. In some cases, the tenth set of manufacturing operations may include performing a planarization operation after depositing the second placeholder material 668 to expose the layer of nitride material 613.

Figure 6K:
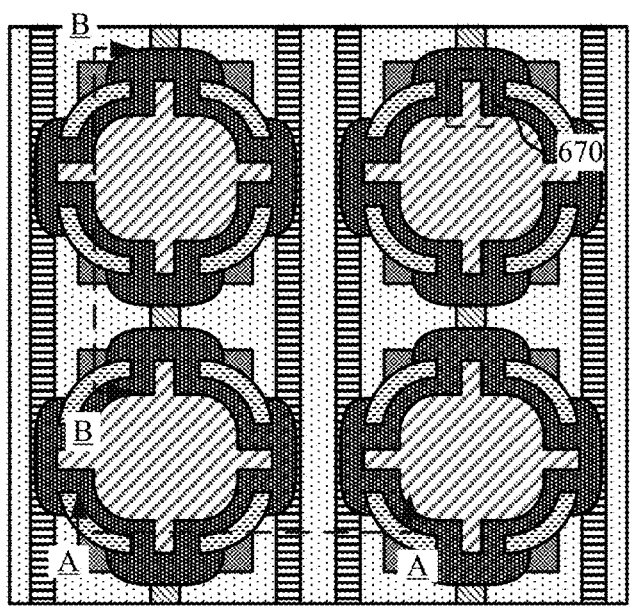
Figure 6K:
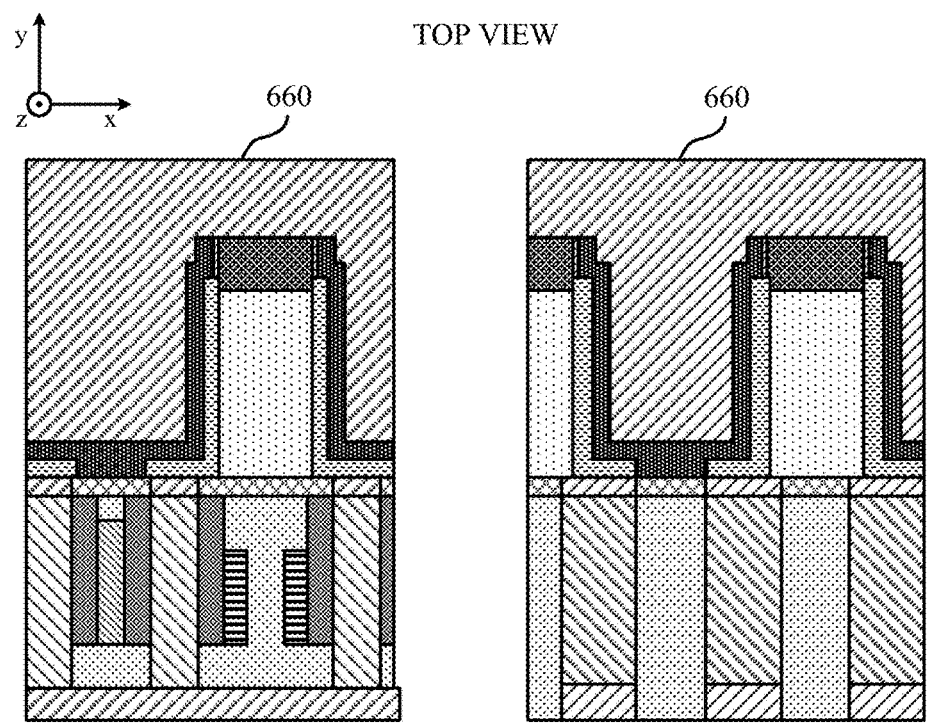

FIG. 6K depicts a memory array 600-k after a eleventh set of manufacturing operations that support techniques to manufacture ferroelectric memory devices in accordance with examples as disclosed herein. The eleventh set of manufacturing operations may include removing the second placeholder material 668 and depositing a layer of conductive material 660. For example, after depositing the layer of ferroelectric material 655, the eleventh set of manufacturing operations may include depositing the layer of conductive material 660 into each region 640 to cover the layer of ferroelectric material 655 and substantially fill the cavity 608. In some examples, the portion of the conductive material filling a cavity 608 may be referred to as a conductive post. In some cases, to deposit the conductive material, the eleventh set of manufacturing operations may support a film deposition operation.

In some case, as part of accessing a first memory cell associated with a first electrode structure 650, a second electrode structure 650 adjacent to the first electrode structure 650 and associated with a second memory cell may develop charge from coupling effects from the first electrode structure 650 (e.g., due to parasitic capacitance, field effects from applied voltages), which may disturb or destroy a stored logic state of the second memory cell.

To reduce effects of coupling between memory cells, depositing the layer of conductive material 660 may at least partially the second voids 663 to form a set of segments 670 of the conductive material 660. A segment 670 may act as a shield or barrier between a first electrode structure 650 and a second electrode structure 650 as part of accessing a memory cell corresponding to the first electrode structure 650. For example, as part of accessing the memory cell, a voltage may be applied to the first electrode structure 650. The segment 670 may reduce a field (e.g., an electric field) resulting from the applied voltage, which may reduce coupling effects on the second electrode structure 650.

Figure 6L:
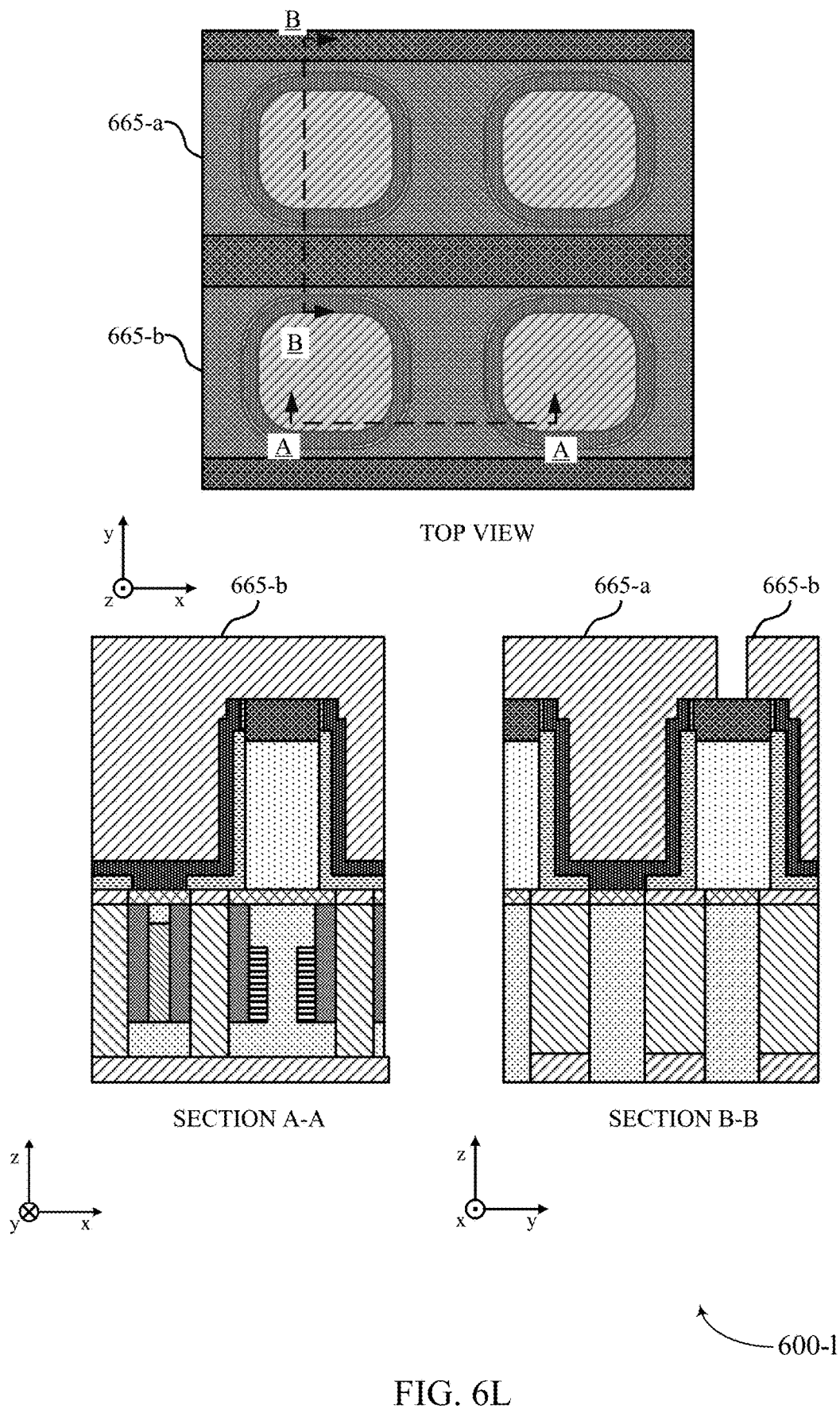

FIG. 6L depicts a memory array 600-1 after a twelfth set of manufacturing operations that support techniques to manufacture ferroelectric memory devices in accordance with examples as disclosed herein. The top view of FIG. 6L may illustrate the memory array at the level of the layer of nitride material 613. The twelfth set of manufacturing operations may include removing a portion of the layer of conductive material 660, such as portion extending in x-direction (e.g., orthogonal to the word lines 620) between adjacent rows of regions 640, to form a set of plate lines 665. The set of plate lines 665 may include a first plate line 665-a corresponding to a first row of regions 640 and a second plate line 665-b corresponding to a second row of regions 640. Accordingly, forming the set of plate lines 665 may form a set of memory cells of the memory array 600-l, each memory cell associated with a ferroelectric capacitor that includes an electrode structure 650 (e.g., a first plate of the capacitor) and a portion of a plate line 665 (e.g., a second plate of the capacitor).

Figure 7:
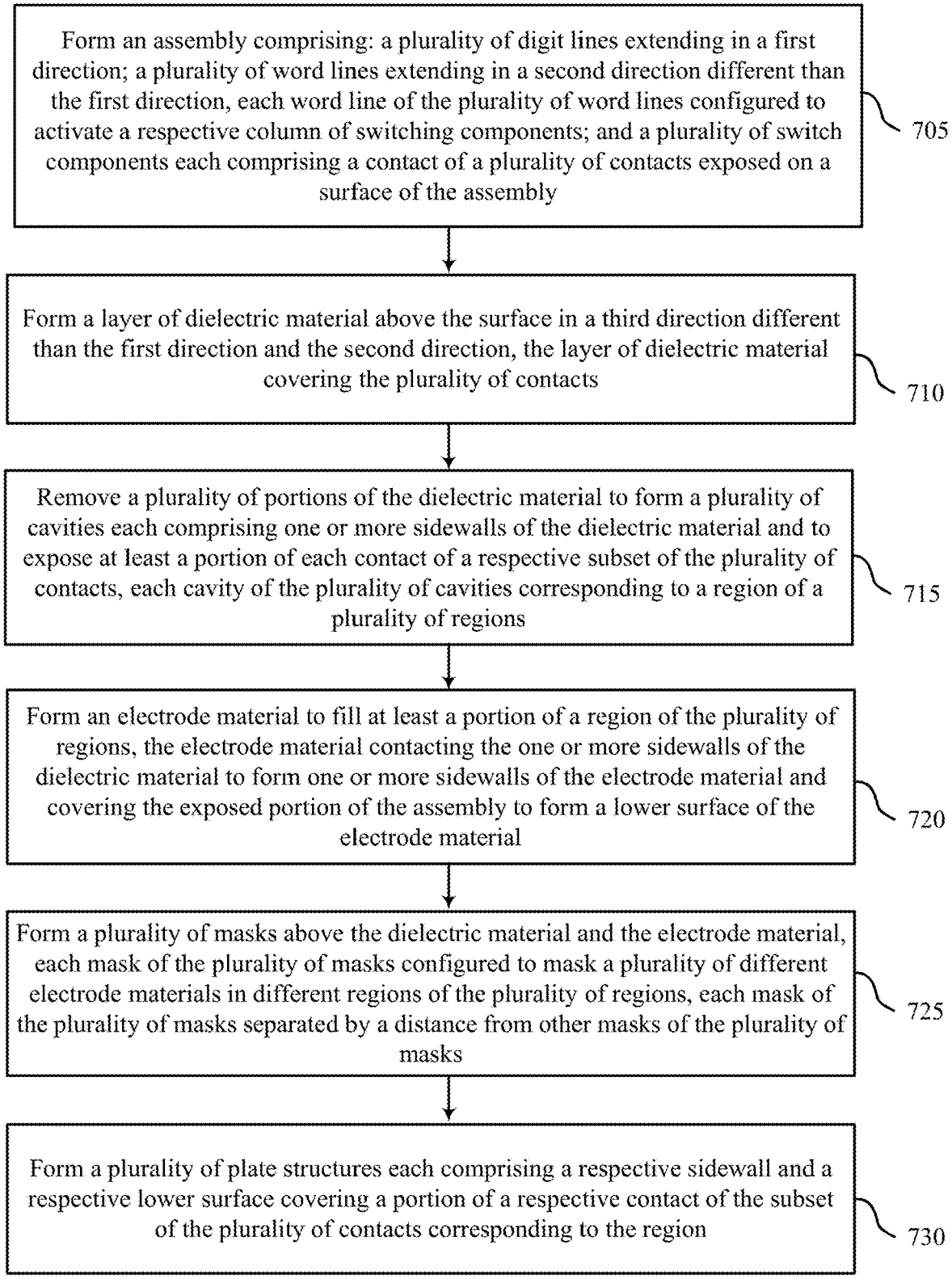
FIGS. 7 through 9 show flowcharts illustrating a method or methods that support techniques to manufacture ferroelectric memory devices in accordance with examples as disclosed herein.

FIG. 7 shows a flowchart illustrating a method or methods 700 that supports techniques to manufacture ferroelectric memory devices in accordance with examples as disclosed herein. The operations of method 700 may be implemented by a manufacturing system or one or more controllers associated with the manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method may include forming an assembly comprising: a plurality of digit lines extending in a first direction; a plurality of word lines extending in a second direction different than the first direction, each word line of the plurality of word lines configured to activate a respective column of switching components; and a plurality of switch components each comprising a contact of a plurality of contacts exposed on a surface of the assembly. The operations of 705 may be performed in accordance with examples as disclosed herein.

At 710, the method may include forming a layer of dielectric material above the surface in a third direction different than the first direction and the second direction, the layer of dielectric material covering the plurality of contacts. The operations of 710 may be performed in accordance with examples as disclosed herein.

At 715, the method may include removing a plurality of portions of the dielectric material to form a plurality of cavities each comprising one or more sidewalls of the dielectric material and to expose at least a portion of each contact of a respective subset of the plurality of contacts, each cavity of the plurality of cavities corresponding to a region of a plurality of regions. The operations of 715 may be performed in accordance with examples as disclosed herein.

At 720, the method may include forming an electrode material to fill at least a portion of a region of the plurality of regions, the electrode material contacting the one or more sidewalls of the dielectric material to form one or more sidewalls of the electrode material and covering the exposed portion of the assembly to form a lower surface of the electrode material. The operations of 720 may be performed in accordance with examples as disclosed herein.

At 725, the method may include forming a plurality of masks above the dielectric material and the electrode material, each mask of the plurality of masks configured to mask a plurality of different electrode materials in different regions of the plurality of regions, each mask of the plurality of masks separated by a distance from other masks of the plurality of masks. The operations of 725 may be performed in accordance with examples as disclosed herein.

At 730, the method may include forming a plurality of electrode structures each comprising a respective sidewall and a respective lower surface covering a portion of a respective contact of the subset of the plurality of contacts corresponding to the region. The operations of 730 may be performed in accordance with examples as disclosed herein.

In some examples, an apparatus (e.g., a manufacturing system) as described herein may perform a method or methods, such as the method 700. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming an assembly including; a plurality of digit lines extending in a first direction; a plurality of word lines extending in a second direction different than the first direction, each word line of the plurality of word lines configured to activate a respective column of switching components; a plurality of switching components each including a contact of a plurality of contacts exposed on a surface of the assembly; forming a layer of dielectric material above the surface in a third direction different than the first direction and the second direction, the layer of dielectric material covering the plurality of contacts; removing a plurality of portions of the dielectric material to form a plurality of cavities each including one or more sidewalls of the dielectric material and to expose at least a portion of each contact of a respective subset of the plurality of contacts, each cavity of the plurality of cavities corresponding to a region of a plurality of regions; forming an electrode material to fill at least a portion of a region of the plurality of regions, the electrode material contacting the one or more sidewalls of the dielectric material to form one or more sidewalls of the electrode material and covering the exposed portion of the assembly to form a lower surface of the electrode material; forming a plurality of masks above the dielectric material and the electrode material, each mask of the plurality of masks configured to mask a plurality of different electrode materials in different regions of the plurality of regions, each mask of the plurality of masks separated by a distance from other masks of the plurality of masks; and forming a plurality of electrode structures each including a respective sidewall and a respective lower surface covering a portion of a respective contact of the subset of the plurality of contacts corresponding to the region.

Aspect 2: The method or apparatus of aspect 1, further including operations, features, circuitry, logic, means, or instructions, or any combination thereof for forming a layer of ferroelectric material based at least in part on forming the plurality of electrode structures, the layer of ferroelectric material covering each respective lower surface of the plurality of electrode structures, covering each respective sidewall of the plurality of electrode structures, and covering the portion of the surface of the assembly.

Aspect 3: The method or apparatus of aspect 2, further including operations, features, circuitry, logic, means, or instructions, or any combination thereof for forming a conductive material to at least partially cover the layer of ferroelectric material, where forming the conductive material substantially fills each region of the plurality of regions and removing at least a portion of the ferroelectric material and at least a portion of the conductive material to form a trench and separate the conductive material into a plurality of plate lines, the trench exposing a portion of an upper surface of the dielectric material between a first row of regions and a second row of regions.

Aspect 4: The method or apparatus of aspects 1 through 3 where forming the plurality of electrode structures includes removing the portion of the lower surface of the electrode material based at least in part on forming the plurality of masks to expose a portion of the surface of the assembly.

Aspect 5: The method or apparatus of aspects 1 through 4, further including operations, features, circuitry, logic, means, or instructions, or any combination thereof for forming a first material to fill a remaining portion of the region, the first material covering one or more sidewalls of the electrode material and covering the lower surface of the electrode material and removing at least a portion of the layer of electrode material, the first material, or both to expose a portion of the surface of the assembly, where the plurality of masks are formed after removing the portion of the layer of electrode material.

Aspect 6: The method, apparatus, or non-transitory computer-readable medium of aspect 5, further including operations, features, circuitry, logic, means, or instructions, or any combination thereof for removing a portion of the first material based at least in part on forming the plurality of masks to expose the portion of the lower surface of the electrode material, where removing the portion of the lower surface of the electrode material is based at least in part on removing the portion of the first material.

Aspect 7: The method or apparatus of aspects 5 through 6, further including operations, features, circuitry, logic, means, or instructions, or any combination thereof for removing a remaining portion of the first material after forming the plurality of electrode structures to expose respective lower surfaces of each electrode structure of the plurality of electrode structures, where forming the layer of ferroelectric material is based at least in part on removing the remaining portion of the first material.

Aspect 8: The method or apparatus of aspects 5 through 7 where the first material includes carbon.

Aspect 9: The method or apparatus of aspects 1 through 8 where the assembly, further includes operations, features, circuitry, logic, means, or instructions, or any combination thereof for a plurality of barriers extending in the second direction, a barrier of the plurality of barriers arranged between a first column of switching components and a second column switching components.

Aspect 10: The method, apparatus, or non-transitory computer-readable medium of aspect 9 where a first word line and a second word line of the plurality of word lines are arranged between the second column of switching components and a third column of switching components.

Aspect 11: The method or apparatus of aspects 1 through 10 where the plurality of regions are arranged in one or more rows extending in the first direction and one or more columns extending in the second direction and a first separation between a first sidewall of a first region and a first sidewall of an adjacent second region in the first direction is less than a second separation between a second sidewall of the first region and a second sidewall of an adjacent third region in the second direction.

Aspect 12: The method, apparatus, or non-transitory computer-readable medium of aspect 11 where the plurality of masks are formed in one or more rows extending in the first direction, each row of masks at least partially between a respective row of regions, and one or more columns extending in the second direction, each column of masks at least partially between a respective column of regions.

Aspect 13: The method or apparatus of aspects 11 through 12 where a length of the first region in the first direction is less than a length of the first region in the second direction.

Aspect 14: The method or apparatus of aspects 1 through 13 where the respective subset of the plurality of contacts includes four contacts.

Figure 8:
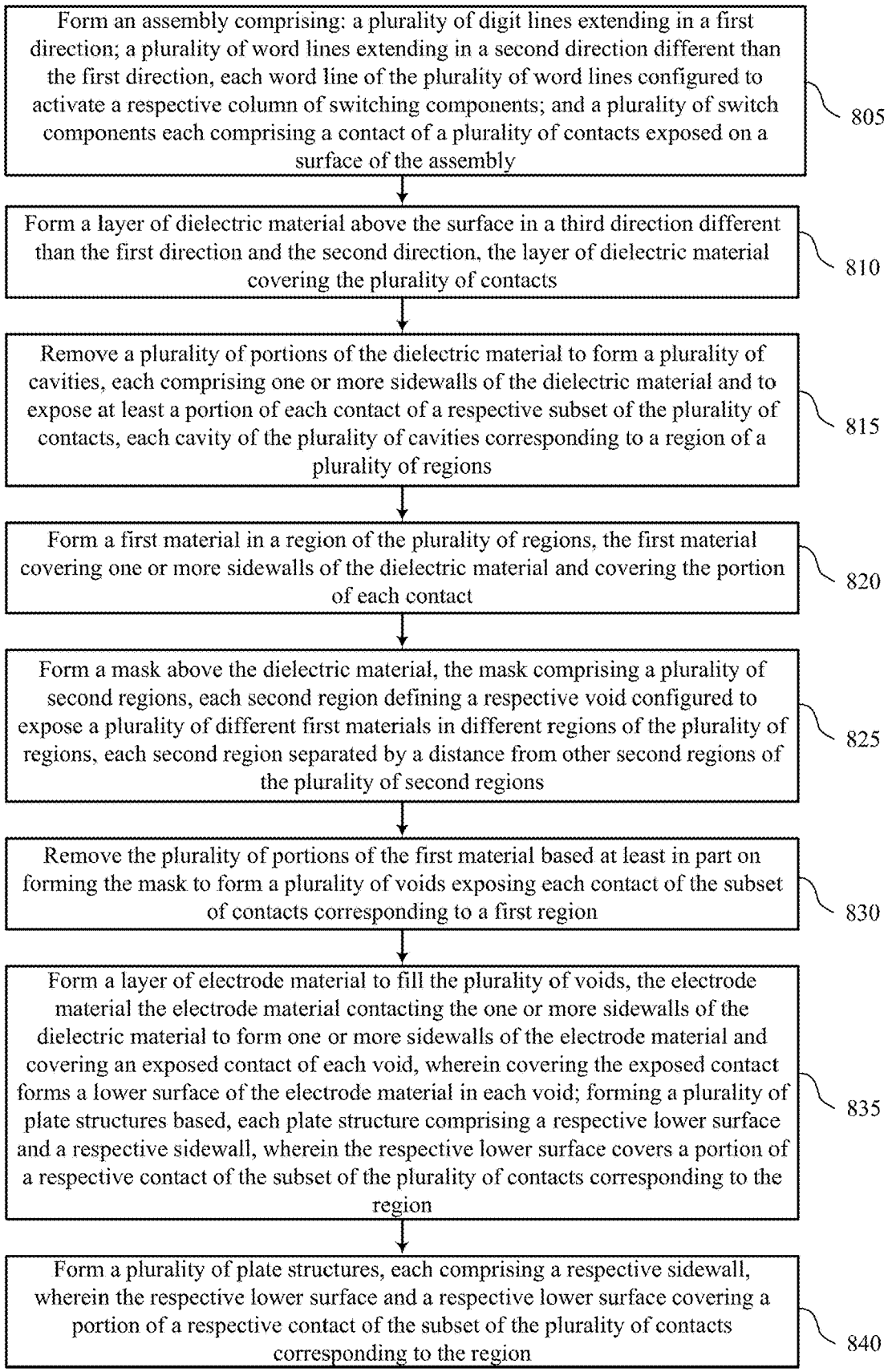

FIG. 8 shows a flowchart illustrating a method or methods 800 that supports techniques to manufacture ferroelectric memory devices in accordance with examples as disclosed herein. The operations of method 800 may be implemented by a manufacturing system or one or more controllers associated with the manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method may include forming an assembly comprising: a plurality of digit lines extending in a first direction; a plurality of word lines extending in a second direction different than the first direction, each word line of the plurality of word lines configured to activate a respective column of switching components; and a plurality of switch components each comprising a contact of a plurality of contacts exposed on a surface of the assembly. The operations of 805 may be performed in accordance with examples as disclosed herein.

At 810, the method may include forming a layer of dielectric material above the surface in a third direction different than the first direction and the second direction, the layer of dielectric material covering the plurality of contacts. The operations of 810 may be performed in accordance with examples as disclosed herein.

At 815, the method may include removing a plurality of portions of the dielectric material to form a plurality of cavities, each comprising one or more sidewalls of the dielectric material and to expose at least a portion of each contact of a respective subset of the plurality of contacts, each cavity of the plurality of cavities corresponding to a region of a plurality of regions. The operations of 815 may be performed in accordance with examples as disclosed herein.

At 820, the method may include forming a first material in a region of the plurality of regions, the first material covering one or more sidewalls of the dielectric material and covering the portion of each contact. The operations of 820 may be performed in accordance with examples as disclosed herein.

At 825, the method may include forming a mask above the dielectric material, the mask comprising a plurality of second regions, each second region defining a respective void configured to expose a plurality of different first materials in different regions of the plurality of regions, each second region separated by a distance from other second regions of the plurality of second regions. The operations of 825 may be performed in accordance with examples as disclosed herein.

At 830, the method may include removing the plurality of portions of the first material based at least in part on forming the mask to form a plurality of voids exposing each contact of the subset of contacts corresponding to a first region. The operations of 830 may be performed in accordance with examples as disclosed herein.

At 835, the method may include forming a layer of electrode material to fill the plurality of voids, the electrode material the electrode material contacting the one or more sidewalls of the dielectric material to form one or more sidewalls of the electrode material and covering an exposed contact of each void, wherein covering the exposed contact forms a lower surface of the electrode material in each void; forming a plurality of electrode structures based, each electrode structure comprising a respective lower surface and a respective sidewall, wherein the respective lower surface covers a portion of a respective contact of the subset of the plurality of contacts corresponding to the region. The operations of 835 may be performed in accordance with examples as disclosed herein.

At 840, the method may include forming a plurality of electrode structures, each comprising a respective sidewall, wherein the respective lower surface and a respective lower surface covering a portion of a respective contact of the subset of the plurality of contacts corresponding to the region. The operations of 840 may be performed in accordance with examples as disclosed herein.

In some examples, an apparatus (e.g., a manufacturing system) as described herein may perform a method or methods, such as the method 800. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 15: A method, apparatus, or non-transitory computer-readable medium including operations, features, circuitry, logic, means, or instructions, or any combination thereof for forming an assembly including; a plurality of digit lines extending in a first direction; a plurality of word lines extending in a second direction different than the first direction, each word line of the plurality of word lines configured to activate a respective column of switching components; a plurality of switching components, each including a contact of a plurality of contacts exposed on a surface of the assembly; forming a layer of dielectric material above the surface in a third direction different than the first direction and the second direction, the layer of dielectric material covering the plurality of contacts; removing a plurality of portions of the dielectric material to form a plurality of cavities, each including one or more sidewalls of the dielectric material and to expose at least a portion of each contact of a respective subset of the plurality of contacts, each cavity of the plurality of cavities corresponding to a region of a plurality of regions; forming a first material in a region of the plurality of regions, the first material covering one or more sidewalls of the dielectric material and covering the portion of each contact; forming a mask above the dielectric material, the mask including a plurality of second regions, each second region defining a respective void configured to expose a plurality of different first materials in different regions of the plurality of regions, each second region separated by a distance from other second regions of the plurality of second regions; removing the plurality of portions of the first material based at least in part on forming the mask to form a plurality of voids exposing each contact of the subset of contacts corresponding to a first region; forming a layer of electrode material to fill the plurality of voids, the electrode material the electrode material contacting the one or more sidewalls of the dielectric material to form one or more sidewalls of the electrode material and covering an exposed contact of each void, where covering the exposed contact forms a lower surface of the electrode material in each void; forming a plurality of electrode structures based, each electrode structure including a respective lower surface and a respective sidewall, where the respective lower surface covers a portion of a respective contact of the subset of the plurality of contacts corresponding to the region; and forming a plurality of electrode structures, each including a respective sidewall, where the respective lower surface and a respective lower surface covering a portion of a respective contact of the subset of the plurality of contacts corresponding to the region.

Aspect 16: The method, apparatus, or non-transitory computer-readable medium of aspect 15, further including operations, features, circuitry, logic, means, or instructions, or any combination thereof for forming a layer of ferroelectric material based at least in part on forming the plurality of electrode structures, the layer of ferroelectric material covering each respective lower surface of the plurality of electrode structures, covering each respective sidewall of the plurality of electrode structures, and covering the portion of the surface of the assembly.

Aspect 17: The method, apparatus, or non-transitory computer-readable medium of aspect 16, further including operations, features, circuitry, logic, means, or instructions, or any combination thereof for forming a conductive material to at least partially cover the layer of ferroelectric material, where forming the conductive material substantially fills each region of the plurality of regions and removing at least a portion of the ferroelectric material and at least a portion of the conductive material to form a trench and separate the conductive material into a plurality of plate lines, the trench exposing a portion of an upper surface of the dielectric material between a first row of regions and a second row of regions.

Figure 9:
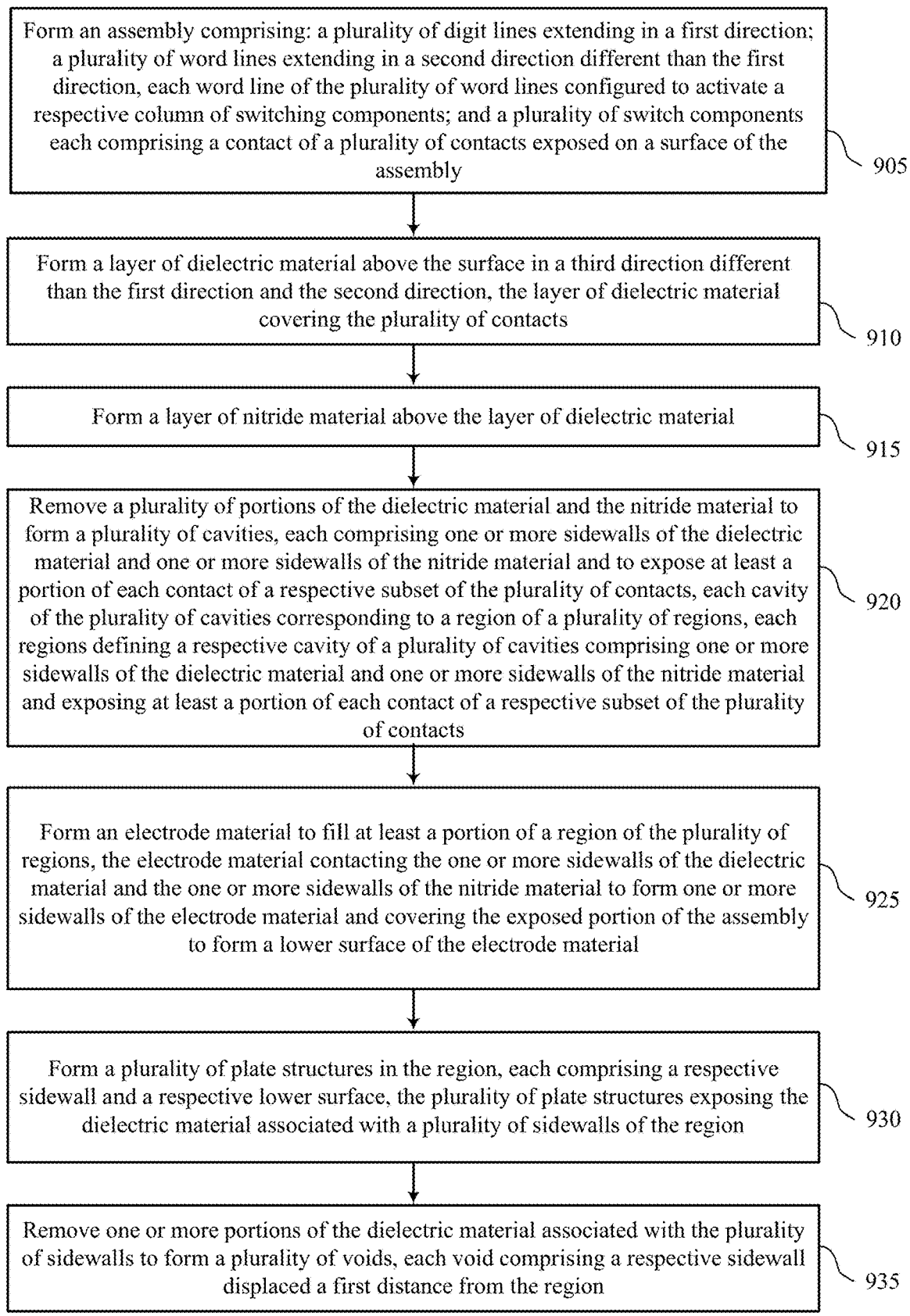

FIG. 9 shows a flowchart illustrating a method or methods 900 that supports techniques to manufacture ferroelectric memory devices in accordance with examples as disclosed herein. The operations of method 900 may be implemented by a manufacturing system or one or more controllers associated with the manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 905, the method may include forming an assembly comprising: a plurality of digit lines extending in a first direction; a plurality of word lines extending in a second direction different than the first direction, each word line of the plurality of word lines configured to activate a respective column of switching components; and a plurality of switch components each comprising a contact of a plurality of contacts exposed on a surface of the assembly. The operations of 905 may be performed in accordance with examples as disclosed herein.

At 910, the method may include forming a layer of dielectric material above the surface in a third direction different than the first direction and the second direction, the layer of dielectric material covering the plurality of contacts. The operations of 910 may be performed in accordance with examples as disclosed herein.

At 915, the method may include forming a layer of nitride material above the layer of dielectric material. The operations of 915 may be performed in accordance with examples as disclosed herein.

At 920, the method may removing a plurality of portions of the dielectric material and the nitride material to form a plurality of cavities, each comprising one or more sidewalls of the dielectric material and one or more sidewalls of the nitride material and to expose at least a portion of each contact of a respective subset of the plurality of contacts, each cavity of the plurality of cavities corresponding to a region of a plurality of regions, each regions defining a respective cavity of a plurality of cavities comprising one or more sidewalls of the dielectric material and one or more sidewalls of the nitride material and exposing at least a portion of each contact of a respective subset of the plurality of contacts. The operations of 920 may be performed in accordance with examples as disclosed herein.

At 925, the method may include forming an electrode material to fill at least a portion of a region of the plurality of regions, the electrode material contacting the one or more sidewalls of the dielectric material and the one or more sidewalls of the nitride material to form one or more sidewalls of the electrode material and covering the exposed portion of the assembly to form a lower surface of the electrode material. The operations of 925 may be performed in accordance with examples as disclosed herein.

At 930, the method may include forming a plurality of electrode structures in the region, each comprising a respective sidewall and a respective lower surface, the plurality of electrode structures exposing the dielectric material associated with a plurality of sidewalls of the region. The operations of 930 may be performed in accordance with examples as disclosed herein.

At 935, the method may include removing one or more portions of the dielectric material associated with the plurality of sidewalls to form a plurality of voids, each void comprising a respective sidewall displaced a first distance from the region. The operations of 935 may be performed in accordance with examples as disclosed herein.

In some examples, an apparatus (e.g., a manufacturing system) as described herein may perform a method or methods, such as the method 900. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 18: A method, apparatus, or non-transitory computer-readable medium including operations, features, circuitry, logic, means, or instructions, or any combination thereof for forming an assembly including; a plurality of digit lines extending in a first direction; a plurality of word lines extending in a second direction different than the first direction, each word line of the plurality of word lines configured to activate a respective column of switching components; a plurality of switching components, each including a contact of a plurality of contacts, each contacts exposed on a surface of the assembly; forming a layer of dielectric material above the surface in a third direction different than the first direction and the second direction, the layer of dielectric material covering the plurality of contacts; forming a layer of nitride material above the layer of dielectric material; removing a plurality of portions of the dielectric material and the nitride material to form a plurality of cavities, each including one or more sidewalls of the dielectric material and one or more sidewalls of the nitride material and to expose at least a portion of each contact of a respective subset of the plurality of contacts, each cavity of the plurality of cavities corresponding to a region of a plurality of regions, each regions defining a respective cavity of a plurality of cavities including one or more sidewalls of the dielectric material and one or more sidewalls of the nitride material and exposing at least a portion of each contact of a respective subset of the plurality of contacts; forming an electrode material to fill at least a portion of a region of the plurality of regions, the electrode material contacting the one or more sidewalls of the dielectric material and the one or more sidewalls of the nitride material to form one or more sidewalls of the electrode material and covering the exposed portion of the assembly to form a lower surface of the electrode material; forming a plurality of electrode structures in the region, each including a respective sidewall and a respective lower surface, the plurality of electrode structures exposing the dielectric material associated with a plurality of sidewalls of the region; and removing one or more portions of the dielectric material associated with the plurality of sidewalls to form a plurality of voids, each void including a respective sidewall displaced a first distance from the region.

Aspect 19: The method, apparatus, or non-transitory computer-readable medium of aspect 18, further including operations, features, circuitry, logic, means, or instructions, or any combination thereof for forming a layer of ferroelectric material based at least in part on forming the plurality of electrode structures, the layer of ferroelectric material covering each respective lower surface of the plurality of electrode structures, covering each respective sidewall of the plurality of electrode structures, and covering the portion of the surface of the assembly.

Aspect 20: The method, apparatus, or non-transitory computer-readable medium of aspect 19 where a thickness of the layer of ferroelectric material is less than or equal to the first distance.

Aspect 21: The method or apparatus of aspects 19 through 20, further including operations, features, circuitry, logic, means, or instructions, or any combination thereof for forming a conductive material to at least partially cover the layer of ferroelectric material, where forming the conductive material substantially fills each region of the plurality of regions and removing at least a portion of the ferroelectric material and at least a portion of the conductive material to form a trench and separate the conductive material into a plurality of plate lines, the trench exposing a portion of an upper surface of the dielectric material between a first row of regions and a second row of regions.

Aspect 22: The method, apparatus, or non-transitory computer-readable medium of aspect 21, further including operations, features, circuitry, logic, means, or instructions, or any combination thereof for removing at least a portion of the sidewalls of the electrode material to form a plurality of conductive plates, each conductive plate covering a respective sidewall of the plurality of sidewalls of the nitride material, where a thickness of a conductive plate of the plurality of conductive plates is less than a thickness of the layer of electrode material.

Aspect 23: The method, apparatus, or non-transitory computer-readable medium of aspect 22 where forming the plurality of electrode structures includes operations, features, circuitry, logic, means, or instructions, or any combination thereof for forming a first mask above the nitride material, the first mask exposing a portion of a region of the plurality of regions extending in the first direction and removing at least a portion the first material based at least in part on forming the first mask to form a first trench extending in the first direction, the first trench exposing a portion of the lower surface of the electrode material.

Aspect 24: The method, apparatus, or non-transitory computer-readable medium of aspect 23 where forming the plurality of electrode structures, further includes operations, features, circuitry, logic, means, or instructions, or any combination thereof for removing at least a portion of the electrode material to expose at least a portion of the surface of the assembly and removing the first mask based at least in part on forming the first trench.

Aspect 25: The method or apparatus of aspects 22 through 24 where forming the plurality of electrode structures, further includes operations, features, circuitry, logic, means, or instructions, or any combination thereof for forming a second mask above the nitride material, the second mask exposing a second portion of the region extending in the second direction and removing at least a portion of the first material based at least in part on forming the second mask to form a second trench extending in the first direction, the second trench exposing a portion of the lower surface of the electrode material.

Aspect 26: The method, apparatus, or non-transitory computer-readable medium of aspect 25 where forming the plurality of electrode structures, further includes operations, features, circuitry, logic, means, or instructions, or any combination thereof for removing at least a portion of the lower surface of the electrode material to expose at least a portion of the surface of the assembly and removing the second mask based at least in part on forming the second trench.

Aspect 27: The method or apparatus of aspects 22 through 26 where each conductive plate of the plurality of conductive plates includes a second electrode material different than the electrode material.

Aspect 28: The method, apparatus, or non-transitory computer-readable medium of aspect 27 where forming the plurality of conductive plates includes forming a layer of the second electrode material to at least partially cover the respective sidewall of the plurality of sidewalls of the nitride material.

Aspect 29: The method or apparatus of aspects 22 through 28 where each conductive plate of the plurality of conductive plates includes a same material as the electrode material.

Aspect 30: The method or apparatus of aspects 18 through 29 where forming the electrode material covers at least a portion of an upper surface of the nitride material, the method further including removing at least a portion of the electrode material to expose the upper surface of the nitride material.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 31: An apparatus, including: an assembly including: a plurality of digit lines extending in a first direction; a plurality of word lines extending in a second direction different than the first direction, each word line of the plurality of word lines configured to activate a respective column of switching components; and a plurality of switching components, each including a contact of a plurality of contacts exposed on a surface of the assembly; a layer of dielectric material above the surface in a third direction different than the first direction and the second direction, the layer of dielectric material covering the plurality of contacts; a plurality of regions extending through the dielectric material, each associated with at least a portion of each contact of a respective subset of the plurality of contacts, and each including a plurality of electrode structures, each electrode structure including a respective lower surface and a respective sidewall, where the respective lower surface covers a portion of a respective contact of the subset of the plurality of contacts corresponding to the region.

Aspect 32: The apparatus of aspect 31, where each region of the plurality of regions further includes a layer of ferroelectric material covering each respective lower surface of the plurality of electrode structures, covering each respective sidewall of the plurality of electrode structures, and covering the portion of the surface of the assembly.

Aspect 33: The apparatus of aspect 32, further including: a plurality of plate lines of a conductive material extending in the first direction, each plate line of the plurality of plate lines, where the conductive material of a plate line of the plurality of plate lines extends in to each region of a row of regions of the plurality of regions.

An apparatus is described. The following provides an overview of aspects of the apparatus as described herein:

Aspect 34: An apparatus, including: an assembly including: a plurality of digit lines extending in a first direction; a plurality of word lines extending in a second direction different than the first direction, each word line of the plurality of word lines configured to activate a respective column of switching components; and a plurality of switching components, each including a contact of a plurality of contacts exposed on a surface of the assembly; a layer of dielectric material above the surface in a third direction different than the first direction and the second direction, the layer of dielectric material covering the plurality of contacts; a layer of nitride material above the layer of dielectric material; and a plurality of regions extending through the dielectric material and the nitride material, each associated with at least a portion of each contact of a respective subset of the plurality of contacts, and each region of the plurality of regions including: a plurality of electrode structures, each including a respective lower surface and a respective sidewall, where the respective lower surface covers a portion of a respective contact of the subset of the plurality of contacts corresponding to the region; and a plurality of posts of a conductive material, each including a plurality of portions extending at least partially between opposing sidewalls of adjacent electrode structures of the plurality of electrode structures.

Aspect 35: The apparatus of aspect 34, where each region of the plurality of regions further includes a layer of ferroelectric material covering each respective lower surface of the plurality of electrode structures, covering each respective sidewall of the plurality of electrode structures, and covering the portion of the surface of the assembly.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    forming an assembly comprising:
        a plurality of digit lines extending in a first direction;
        a plurality of word lines extending in a second direction different than the first direction, each word line of the plurality of word lines configured to activate a respective column of switching components; and
        a plurality of switching components each comprising a contact of a plurality of contacts exposed on a surface of the assembly;
    forming a layer of dielectric material above the surface in a third direction different than the first direction and the second direction, the layer of dielectric material covering the plurality of contacts;
    removing a plurality of portions of the dielectric material to form a plurality of cavities each comprising one or more sidewalls of the dielectric material and to expose at least a portion of each contact of a respective subset of the plurality of contacts, each cavity of the plurality of cavities corresponding to a region of a plurality of regions;
    forming an electrode material to fill at least a portion of the region of the plurality of regions, the electrode material contacting the one or more sidewalls of the dielectric material to form one or more sidewalls of the electrode material and covering the exposed portion of the assembly to form a lower surface of the electrode material;
    forming a plurality of masks above the dielectric material and the electrode material, each mask of the plurality of masks configured to mask a plurality of different electrode materials in different regions of the plurality of regions, each mask of the plurality of masks separated by a distance from other masks of the plurality of masks; and
    forming a plurality of electrode structures each comprising a respective sidewall and a respective lower surface covering a portion of a respective contact of the subset of the plurality of contacts corresponding to the region.

2. The method of claim 1, further comprising:
    forming a layer of ferroelectric material based at least in part on forming the plurality of electrode structures, the layer of ferroelectric material covering each respective lower surface of the plurality of electrode structures, covering each respective sidewall of the plurality of electrode structures, and covering the portion of the surface of the assembly.

3. The method of claim 2, further comprising:
    forming a conductive material to at least partially cover the layer of ferroelectric material, wherein forming the conductive material substantially fills each region of the plurality of regions; and
    removing at least a portion of the ferroelectric material and at least a portion of the conductive material to form a trench and separate the conductive material into a plurality of plate lines, the trench exposing a portion of an upper surface of the dielectric material between a first row of regions and a second row of regions.

4. The method of claim 1, wherein forming the plurality of electrode structures comprises removing the portion of the lower surface of the electrode material based at least in part on forming the plurality of masks to expose a portion of the surface of the assembly.

5. The method of claim 1, further comprising:
    forming a first material to fill a remaining portion of the region, the first material covering the one or more sidewalls of the electrode material and covering the lower surface of the electrode material; and
    removing at least a portion of a layer of electrode material, the first material, or both to expose a portion of the surface of the assembly, wherein the plurality of masks are formed after removing the portion of the layer of electrode material.

6. The method of claim 5, further comprising:
    removing a portion of the first material based at least in part on forming the plurality of masks to expose the portion of the lower surface of the electrode material, wherein removing the portion of the lower surface of the electrode material is based at least in part on removing the portion of the first material.

7. The method of claim 5, further comprising:
    removing a remaining portion of the first material after forming the plurality of electrode structures to expose respective lower surfaces of each electrode structure of the plurality of electrode structures, wherein forming the layer of ferroelectric material is based at least in part on removing the remaining portion of the first material.

8. The method of claim 5, wherein the first material comprises carbon.

9. The method of claim 1, wherein the assembly further comprises:
    a plurality of barriers extending in the second direction, a barrier of the plurality of barriers arranged between a first column of switching components and a second column of switching components.

10. The method of claim 9, wherein a first word line and a second word line of the plurality of word lines are arranged between the second column of switching components and a third column of switching components.

11. The method of claim 1, wherein the plurality of regions are arranged in one or more rows extending in the first direction and one or more columns extending in the second direction, and a first separation between a first sidewall of a first region and a first sidewall of an adjacent second region in the first direction is less than a second separation between a second sidewall of the first region and a second sidewall of an adjacent third region in the second direction.

12. The method of claim 11, wherein the plurality of masks are formed in one or more rows extending in the first direction, each row of masks at least partially between a respective row of regions, and one or more columns extending in the second direction, each column of masks at least partially between a respective column of regions.

13. The method of claim 11, wherein a length of the first region in the first direction is less than a length of the first region in the second direction.

14. The method of claim 1, wherein the respective subset of the plurality of contacts comprises four contacts.

15. A method, comprising:
forming an assembly comprising:
a plurality of digit lines extending in a first direction;
a plurality of word lines extending in a second direction different than the first direction, each word line of the plurality of word lines configured to activate a respective column of switching components; and
a plurality of switching components, each comprising a contact of a plurality of contacts exposed on a surface of the assembly;
forming a layer of dielectric material above the surface in a third direction different than the first direction and the second direction, the layer of dielectric material covering the plurality of contacts;
removing a plurality of portions of the dielectric material to form a plurality of cavities, each comprising one or more sidewalls of the dielectric material and to expose at least a portion of each contact of a respective subset of the plurality of contacts, each cavity of the plurality of cavities corresponding to a region of a plurality of regions;
forming a first material in a region of the plurality of regions, the first material covering one or more sidewalls of the dielectric material and covering the portion of each contact;
forming a mask above the dielectric material, the mask comprising a plurality of second regions, each second region defining a respective void configured to expose a plurality of different first materials in different regions of the plurality of regions, each second region separated by a distance from other second regions of the plurality of second regions;
removing the plurality of portions of the first material based at least in part on forming the mask to form a plurality of voids exposing each contact of the subset of contacts corresponding to a first region;
forming a layer of electrode material to fill the plurality of voids, the electrode material contacting the one or more sidewalls of the dielectric material to form one or more sidewalls of the electrode material and covering an exposed contact of each void, wherein covering the exposed contact forms a lower surface of the electrode material in each void; forming a plurality of electrode structures based, each electrode structure comprising a respective lower surface and a respective sidewall, wherein the respective lower surface covers a portion of a respective contact of the subset of the plurality of contacts corresponding to the region; and
forming a plurality of electrode structures, each comprising a respective sidewall, wherein the respective lower surface and a respective lower surface covering a portion of a respective contact of the subset of the plurality of contacts corresponding to the region.

16. The method of claim 15, further comprising:
forming a layer of ferroelectric material based at least in part on forming the plurality of electrode structures, the layer of ferroelectric material covering each respective lower surface of the plurality of electrode structures, covering each respective sidewall of the plurality of electrode structures, and covering the portion of the surface of the assembly.

17. The method of claim 16, further comprising:
forming a conductive material to at least partially cover the layer of ferroelectric material, wherein forming the conductive material substantially fills each region of the plurality of regions; and
removing at least a portion of the ferroelectric material and at least a portion of the conductive material to form a trench and separate the conductive material into a plurality of plate lines, the trench exposing a portion of an upper surface of the dielectric material between a first row of regions and a second row of regions.

18. An apparatus, comprising:
an assembly comprising:
a plurality of digit lines extending in a first direction;
a plurality of word lines extending in a second direction different than the first direction, each word line of the plurality of word lines configured to activate a respective column of switching components; and
a plurality of switching components, each comprising a contact of a plurality of contacts exposed on a surface of the assembly;
a layer of dielectric material above the surface in a third direction different than the first direction and the second direction, the layer of dielectric material covering the plurality of contacts; and
a plurality of regions extending through the dielectric material, each associated with at least a portion of each contact of a respective subset of the plurality of contacts, and each comprising a plurality of electrode structures, each electrode structure comprising a respective lower surface and a respective sidewall, wherein the respective lower surface covers a portion of a respective contact of the subset of the plurality of contacts corresponding to the region.

19. The apparatus of claim 18, wherein each region of the plurality of regions further comprises a layer of ferroelectric material covering each respective lower surface of the plurality of electrode structures, covering each respective sidewall of the plurality of electrode structures, and covering the portion of the surface of the assembly.

20. The apparatus of claim 19, further comprising:
a plurality of plate lines of a conductive material extending in the first direction, each plate line of the plurality of plate lines, wherein the conductive material of a plate line of the plurality of plate lines extends in to each region of a row of regions of the plurality of regions.

* * * * *